United States Patent
Molaire

(10) Patent No.: US 10,461,269 B2
(45) Date of Patent: Oct. 29, 2019

(54) CROSSLINKABLE, /POLYMERIZABLE AND COMBINATIONS THEREOF CHARGE-TRANSPORTING MOLECULAR GLASS MIXTURES, LUMINESCENT MOLECULAR GLASS MIXTURES, OR COMBINATIONS THEREOF FOR ORGANIC LIGHT EMITTING DIODES AND OTHER ORGANIC ELECTRONICS AND PHOTONICS APPLICATIONS AND METHOD OF MAKING SAME

(71) Applicant: MOLECULAR GLASSES, INC., Rochester, NY (US)

(72) Inventor: Michel Frantz Molaire, Rochester, NY (US)

(73) Assignee: Molecular Glasses, Inc., Rochester, NY (US)

(*) Notice: Subject to any disclaimer, the term of this patent is extended or adjusted under 35 U.S.C. 154(b) by 282 days.

(21) Appl. No.: 14/578,482

(22) Filed: Dec. 21, 2014

(65) Prior Publication Data

US 2015/0179714 A1    Jun. 25, 2015

Related U.S. Application Data

(60) Provisional application No. 61/919,252, filed on Dec. 20, 2013.

(51) Int. Cl.
| | | |
|---|---|---|
| H01L 51/50 | (2006.01) | |
| H01L 51/56 | (2006.01) | |
| H01L 51/00 | (2006.01) | |

(52) U.S. Cl.
CPC ...... H01L 51/5012 (2013.01); H01L 51/0036 (2013.01); H01L 51/0043 (2013.01); H01L 51/5036 (2013.01); H01L 51/56 (2013.01); H01L 2251/556 (2013.01); Y02E 10/549 (2013.01); Y02P 70/521 (2015.11)

(58) Field of Classification Search
CPC combination set(s) only.
See application file for complete search history.

(56) References Cited

U.S. PATENT DOCUMENTS

| | | | |
|---|---|---|---|
| 4,395,475 A | | 7/1983 | Noonan et al. |
| 4,416,890 A | | 11/1983 | Woltersdorf |
| 4,499,165 A | | 2/1985 | Molaire |
| 4,588,666 A | | 5/1986 | Stolka et al. |
| 4,609,606 A | | 9/1986 | Noonan et al. |
| 4,619,890 A | * | 10/1986 | Molaire .................. G11B 7/252 346/135.1 |
| 4,767,883 A | * | 8/1988 | Molaire .................. C07C 69/54 560/220 |
| 4,902,605 A | * | 2/1990 | Klein ...................... G03F 7/027 430/285.1 |
| 4,992,349 A | | 2/1991 | Chen et al. |
| 5,011,939 A | | 4/1991 | Limburg et al. |
| 5,176,977 A | | 1/1993 | Molaire et al. |
| 5,262,512 A | | 11/1993 | Yanus et al. |
| 5,747,204 A | | 5/1998 | Anzai et al. |
| 6,066,357 A | * | 5/2000 | Tang .................... H01L 27/3211 427/164 |
| 7,579,127 B2 | | 8/2009 | Molaire |
| 7,629,097 B2 | | 12/2009 | Molaire |
| 7,776,500 B2 | | 8/2010 | Molaire |
| 2002/0125820 A1 | | 9/2002 | Sheu et al. |
| 2004/0185297 A1 | * | 9/2004 | Klubek ............... H01L 51/0058 428/690 |
| 2005/0067949 A1 | * | 3/2005 | Natarajan ........... H01L 51/0007 313/504 |
| 2005/0072971 A1 | * | 4/2005 | Marrocco, III ........ B82Y 30/00 257/40 |
| 2005/0075247 A1 | | 4/2005 | Kakino et al. |
| 2007/0096640 A1 | * | 5/2007 | Yu ....................... H01L 27/3211 313/504 |
| 2007/0292799 A1 | | 12/2007 | Molaire |
| 2009/0136859 A1 | | 5/2009 | Molaire et al. |
| 2009/0153021 A1 | | 6/2009 | Jen et al. |
| 2010/0176412 A1 | | 7/2010 | Yakoyama et al. |
| 2011/0073853 A1 | | 3/2011 | Smith |
| 2011/0101401 A1 | | 5/2011 | Aratani et al. |
| 2011/0129951 A1 | | 6/2011 | Kondo et al. |
| 2011/0155954 A1 | | 6/2011 | Yersin et al. |
| 2011/0279020 A1 | | 11/2011 | Inoue et al. |
| 2012/0267618 A1 | * | 10/2012 | Monkman ........... H01L 51/0003 257/40 |

(Continued)

FOREIGN PATENT DOCUMENTS

DE          3515177 A1    11/1985

OTHER PUBLICATIONS

Chopra et al. (effects of triplet energy confinement by charge transport layer on blue phosphorescent organic light emitting diodes) (2008).*

(Continued)

*Primary Examiner* — Austin Murata
(74) *Attorney, Agent, or Firm* — Dinsmore & Shohl LLP

(57) ABSTRACT

The present invention provides crosslinkable, polymerizable and combinations thereof charge transporting molecular glass mixtures, luminescent molecular glass mixtures, or combinations thereof comprising at least two nonpolymeric compounds each independently corresponding to the structure $(R^1Y^1)_p[(Z^1Y^2)_mR^2Y^2]_nZ^2Y^4R^3$ wherein m is zero or one; n is zero up to an integer at which said compound starts to become a polymer; p is an integer of from one to eight; each $R^1$ and $R^3$ is independently a monovalent aliphatic or cycloaliphatic hydrocarbon group having 1 to 20 carbon atoms, an aromatic group or a multicyclic aromatic nucleus; $R^2$, $Z^1$, and $Z^2$ each independently represent multivalent aliphatic or cycloaliphatic hydrocarbon groups having 1 to 20 carbon atoms or an aromatic group; and $Y^1$, $Y^2$, $Y^3$, and $Y^4$ each independently represent one or more linking groups. The present invention also provides methods for making the same.

23 Claims, 6 Drawing Sheets

(56) References Cited

U.S. PATENT DOCUMENTS

| | | | |
|---|---|---|---|
| 2013/0207088 A1* | 8/2013 | Seo | H01L 51/5016 257/40 |
| 2013/0265522 A1* | 10/2013 | Jung | G02F 1/1336 349/61 |
| 2013/0270531 A1 | 10/2013 | Seo et al. | |
| 2014/0072907 A1* | 3/2014 | Sasaki | G03G 5/0507 430/56 |
| 2014/0138669 A1 | 5/2014 | Nakagawa et al. | |
| 2014/0145149 A1 | 5/2014 | Lin et al. | |
| 2014/0145151 A1 | 5/2014 | Xia et al. | |
| 2015/0179714 A1 | 6/2015 | Molaire | |

OTHER PUBLICATIONS

Braun et al., "Visible Light Emission from Semiconducting Polymer Diodes", Appl. Phys. Lett., 1991, 58(18), p. 1982, Ameican Institute of Physics.

Damaceanu et al., "Polymers Containing 1,3,4-Oxadiazole Rings for Advanced Materials", Memoirs of the Scientific Sections of the Romanian Academy, 2011.

Gagnon et al., "Triarylamines Designed to Form Molecular Glasses. Derivative of Tris(p-terphenyl-4-yl)amine with Multiple Contiguous Phenyl Substituents", Organic Letters, 2010, 12(3), 404-407, American Chemical Society.

Kraft et al., "Electroluminescent Conjugated Polymers—Seeing Polymers in a New Light", Angew. Chem. Int. Ed., 1998, 37, 402-428, Wiley-VCH Verlag GmbH.

Kulkarni et al., "Electron Transport Materials for Organic Light-Emitting Diodes", Chem. Mater., 2004, 16, 4556-4573, American Chemical Society.

Molaire et al., "Organic Monomeric Glasses: A Novel Class of Materials", Journal of Polymer Science: Part A: Polymer Chemistry, 1989, 27, 2569-2592, John Wiley & Sons, Inc.

Molaire, Michel F., "Influence of Melt Viscosity on the Writing Sensitivity of Organic Dye-Binder Optical-Disk Recording Media", Applied Optics, 1988, 27(4), p. 743.

Lin et al., "On the Physical Meaning of the Kwei Equation for the Glass Transition Temperature of Polymer Blends", Macromolecules, 1989, 22, 4112-4119, American Chemical Society.

Molaire, Michel F., "A Free-Volume Model for Photopolymerizable/ Cross-Linkable Dry-Film Systems", Journal of Polymer Science, 1982, 20, 847-861, John Wiley & Sons, Inc.

Lee et al., "Effects of Triplet Energy Confinement by Charge Transporting Layers on Blue Phosphorescent Organic Light Emitting Diodes", Proc. of SPIE vol. 7051, 2008, 70511T-2.

Graves et al., "Anomalous Temperature Dependence of Solvent-Enhanced Dye Diffusion in Polymer Films", Mat. Res. Soc. Symp. Proc., 2002, Vo., 725, Materials Research Society.

International Search Report and Written Opinion pertaining to PCT/US2014/071833 dated Apr. 1, 2015.

Partial Supplementary European Examination Report pertaining to EP Appln. No. 14872637.5 dated Aug. 17, 2017.

Nuyken et al., "Modern Trends in Organic Light-Emitting Devices (OLEDs)", Montasherfte fur Chemie, 2006, 137, 811-824.

Luzio et al., "Synthesis, Electronic Structure, and Charge Transport Characteristics of Napthalenediimide-Based Co-Polymers with Different Oligothiophene Donor Units", Adv. Funct. Mater., 2014, 24, 1151-1162, Wiley-VCH Verlag GmbH.

Office Action pertaining to Chinese Patent Application No. 201480069852.4 dated Nov. 7, 2018.

Article 94(3) Communication pertaining to European Patent Application No. 14872637.5 dated Oct. 16, 2018.

* cited by examiner

Glass Transition Temperature = -72° C

FIG. 14A  FIC. 14B  FIG. 14C  FIG. 14D

CROSSLINKABLE, /POLYMERIZABLE AND COMBINATIONS THEREOF CHARGE-TRANSPORTING MOLECULAR GLASS MIXTURES, LUMINESCENT MOLECULAR GLASS MIXTURES, OR COMBINATIONS THEREOF FOR ORGANIC LIGHT EMITTING DIODES AND OTHER ORGANIC ELECTRONICS AND PHOTONICS APPLICATIONS AND METHOD OF MAKING SAME

CROSS-REFERENCE TO RELATED PATENT APPLICATIONS

Priority for this patent application is based upon provisional patent applications 61/919,252 (filed on Dec. 20, 2013). The disclosure of this United States patent application is hereby incorporated by reference into this specification.

BACKGROUND OF THE INVENTION

Recently there has been increased interest into molecular glasses that can be coated into amorphous films for applications such as photoresist or molecular optoelectronic devices, including light-emitting diodes, field-effect transistors, and solar cells, as well as in advanced materials for xerography, two-photo absorption, luminescent devices, and photorefraction. One technique that is used in the art is a reverse of the principles of crystal engineering to devise molecules that resist crystallization. Examples of this technique are described in the publications by Eric Gagnon et al: "*Triarylamines Designed to Form Molecular Glasses. Derivatives of Tris (p-terphenyl-4-yl) amine with multiple Contiguous Phenyl Substituents*." Organic Letters 201, Vol. 12, No. 3, p 404-407.

The traditional method of optoelectronic devices fabrication such as small molecules organic light emitting diode (OLED) is vacuum deposition of all the layers using a shadow mask to locally pattern the devices. For relatively small devices such as cell phones, tablets and small displays these techniques work very well. However shadow mask technology cannot provide the required uniformity over large areas required for large displays. Thus deposition processes other than thermal evaporation are required. The fabrication of organic semiconductors using inkjet printing is reported in U.S. Pat. No. 6,087,196. Ink of polyvinylcarbazole polymer doped with luminescent dyes such as coumarin 6, coumarin 47 and nile red were printed by inkjet deposition to form patterns of red, green and blue pixels to generate full color displays. One problem associated with this approach is that the dots printed do not have a uniform thickness. Sturm et al in U.S. Pat. No. 7,090,890 describes a process of making semiconductor devices by modifying the properties of a deposited organic film by either adding new components into the film from a top or bottom surface; or by causing components to leave the film from a top or bottom surface. In U.S. Pat. No. 6,066,357 Tang et al reported methods of making full-color organic lightemitting display by inkjet printing of fluorescent dopants selected to produce red, green, or blue light emission from designated subpixels of the display. The dopants are printed sequentially from inkjet printing and subsequently diffused from the dopant layer into the light emitting layer by exposing the light-emitting layer and the dopant layers to vapor of a fluid or fluid mixture. The use of fluid to assist dye diffusion has its drawback. The fluid can affect other layers and degrade the device. Heat-assisted diffusion is an option; but because the glass transition temperature of the layers are designed to be high to ensure thermal stability, the coefficient of diffusion is very low below the glass transition temperature as described in "Anomalous Temperature Dependence of Solvent-Enhanced Dye Diffusion in Polymer Films", T. Graves-Abe, F. Pschenitzka, J. C. Sturm, Mat. Res. Soc. Symp. Proc. Vol. 725 @ 2002 Materials Research Society.

Most of small molecules OLED materials, including the organic transport materials are not soluble in coating solvents or tend to crystallize in the presence of solvent. Molaire in U.S. patent application Ser. No. 14/467,143, "Charge-transporting Molecular Glass Mixtures, Luminescent Molecular Glass Mixtures, or Combinations Thereof for Organic Light Emitting Diodes and other Organic Electronics and Photonics Applications", describe charge-transporting and luminescent molecular glass mixtures that are soluble in coating solvents and non-crystallizable. These molecular glass mixtures can be coated by inkjet and other solution process. However it is not practical to coat multi layers without damaging the previously coated layers, unless a solvent barrier layer is utilized. Or it is required to carefully engineer the solubility of each layer. For example the solvent of the secondly-coated layer cannot dissolve the firstly-coated layer; the solvent of the thirdly-coated layer cannot dissolve the secondly-coated layer and so on.

There is a need to develop economical coating processes for large color displays. There is a need to provide organic semiconductor glasses that can be coated from solvent in layers that are not attacked by solvent once dried. There is a need to provide processes that allow solvent coating of multiple thin layers for optoelectronic devices fabrication.

The present invention provides solutions for the above problems.

It is an object of this invention to provide crosslinkable charge-transporting molecular glass mixtures, polymerizable charge-transporting molecular glass mixtures, luminescent molecular glass mixtures, or combinations thereof with the many of the advantages illustrated herein.

It is also an object of this invention to provide crosslinkable charge-transporting molecular glass mixtures, polymerizable charge-transporting molecular glass mixtures, luminescent molecular glass mixtures, or combinations thereof that are readily soluble in common coating solvents, without crystallization.

It is further object of this invention to provide crosslinkable charge-transporting molecular glass mixtures, polymerizable charge-transporting molecular glass mixtures, luminescent molecular glass mixtures, or combinations thereof to enable economical solvent processes for the fabrication of optoelectronic organic films.

Yet another object of this invention is to provide a method for manufacturing optoelectronic organic films having locally modified areas.

Still another object and advantage of the invention is to form an organic film with modified properties by applying dopants in desired places.

A further object and advantage of the invention is the provision of a method for forming an organic film with local modified areas by adding dopants to the film.

Even another object of the invention is to provide a method for locally modifying properties of an organic film without the need for photolithography and etching of the organic film nor the need for contacting the surface of said film with solvents.

A still further object and advantage of the invention is the provision of a method for manufacturing a locally modified organic film without the need for contacting the surface of said film with solvents.

Even an additional object of the invention is to provide a process of forming a locally modified organic film wherein dopant is added to the film in an annealing process at low temperature.

SUMMARY OF THE INVENTION

Various embodiments of the present invention provide for crosslinkable charge-transporting molecular glass mixtures, polymerizable charge-transporting molecular glass mixtures, luminescent molecular glass mixtures, and combinations thereof with thermal properties that can be controlled independent of the structure of the core charge-transporting group, the luminescent group, or a combination thereof. The various embodiments used to describe the principles of the present invention are by way of illustration only and should not be construed in any way to limit the scope of the invention. Those skilled in the art will understand that the principles of the present invention may be implemented in any suitably arranged device.

Charge-transporting molecular glass mixtures, luminescent molecular glass mixtures, or combination thereof are reported in co-pending application U.S. Ser. No. 14/467,143 by Molaire. The disclosure of this United States patent application is hereby incorporated by reference into this specification The crosslinkable charge-transporting molecular glass mixtures, polymerizable charge-transporting molecular glass mixtures, the luminescent molecular glass mixtures, and combinations thereof of this invention can be used particularly in light-emitting diodes, organic photovoltaic cells, filed-effect transistors, organic light emitting transistors, organic light emitting chemical cells, electrophotography, and many other applications.

Each of the crosslinkable charge-transporting molecular glass mixture, polymerizable charge-transporting molecular glass mixtures, the luminescent molecular glass mixture, and combinations thereof of this invention are defined as a mixture of compatible organic monomeric molecules with an infinitely low crystallization rate under the most favorable conditions. These mixtures can be formed in a one-part reaction of a multifunctional nucleus with a mixture of substituents. The "non-crystallizability" of the mixture is controlled by the structural dissymmetry of the nucleus, the substituents, or a combination thereof, and the number of components making up the mixture. In cases where the nucleus is highly symmetric and rigid, the components with similar (non-distinct) substituents might crystallize out under the right conditions. Thus it is advantageous when possible to avoid those components, by designing an asymmetric glass mixture, wherein all the components of the mixture have distinct substituents. Without being bound to theory, we predict that the asymmetric mixtures are more likely to be fully non-crystallizable than symmetric mixtures.

Increasing the number of components of the glass mixture, by adding more substituents, is another way to enhance the non-crystallizability of glass mixtures having highly symmetric and rigid nuclei.

Finally a glass mixture with partial component crystallization can be stabilized by mixing it with a non-crystallizable glass mixture in the right proportion as determined by differential scanning calorimetry. The mixing non-crystallizable glass mixture can be charge-transporting, luminescent, or even an inert non-crystallizable glass mixture.

Examples of highly symmetric and rigid nuclei include:

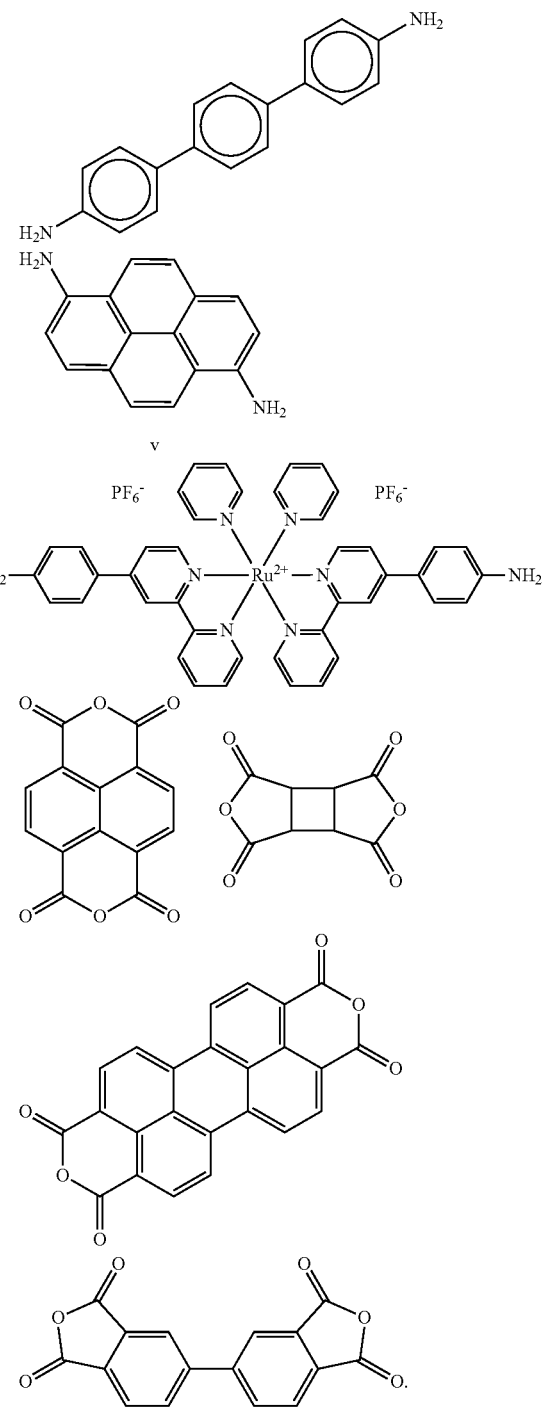

The crosslinkable charge-transporting molecular glass mixtures, polymerizable charge-transporting molecular glass mixtures, luminescent molecular glass mixtures, and combinations thereof like amorphous polymers, have good film-forming properties. However, unlike polymers, they display extremely low melt-viscosities, large positive entropy-of-mixing values, relatively high vapor pressure, and can be ground easily into extremely small particles. These properties make them ideal for certain applications where compatibility, defect-free film forming, melt-flow, vapor deposition coating, and small particle size are important.

The crosslinkable charge-transporting molecular glass mixtures, the polymerizable charge-transporting molecular glass mixtures, the luminescent molecular glass mixtures, and combinations thereof of this invention are prepared according to the technique described in M. F. Molaire and Roger Johnson in "Organic Monomeric Glasses: A Novel Class of Materials," Journal Polymer Science, Part A, Polymer Chemistry, Vol. 27, 2569-2592 (1989). These materials are used and described in U.S. Pat. Nos. 4,416,890 and 4,499,165, "Binder-Mixtures for optical Recording Layers and Elements," by Molaire, U.S. Pat. Nos. 7,776,500, 7,629,097, 7,579,127, and 5,176,977, all by Molaire. The entire disclosure of each of these United States patents is hereby incorporated by reference into this specification. Their melt viscosity properties are demonstrated in "Influence of melt viscosity on the Writing Sensitivity of Organic dye-Binder Optical-Disk Recording Media," M. F. Molaire, Applied Optics, Vol. 27 page 743, Feb. 15, 1988.

Charge-transporting molecular glass mixtures, luminescent molecular glass mixtures, and combinations thereof of the invention when properly designed are truly non-crystallizable. Their thermal and other physical properties are tunable independent of the charge transport or luminescent moiety.

The present invention provides crosslinkable molecular amorphous glass mixtures, polymerizable molecular amorphous glass mixtures, and combinations thereof comprising at least two nonpolymeric compounds each independently corresponding to the structure $(R^1Y^1)_p[(Z^1Y^2)_mR^2Y^3]_n Z^2Y^4R^3$ wherein m is zero or one, n is zero up to an integer at which said compound starts to become a polymer and p is an integer of from one to eight; each of the compounds of the mixture contains at least one polymerizable group, crosslinkable group, or a combination thereof; and at least one of the compounds of the mixtures contains at least two polymerizable groups, crosslinkable groups, or combinations thereof.

In one embodiment of the invention, each $R^1$ and $R^3$ is independently a monovalent aliphatic or cycloaliphatic hydrocarbon group having 1 to 20 carbon atoms, an aromatic group or a multicyclic aromatic nucleus, where each of $R^1$ and $R^3$ is independently a monovalent moiety containing at least one polymerizable group, crosslinkable group or combination thereof chosen from vinyl, allyl, acrylic or methacrylic or other polymerizable groups;

$R^2$, $Z^1$ and $Z^2$ each independently represent multivalent aliphatic or cycloaliphatic hydrocarbon groups having 1 to 20 carbon atoms or an aromatic group; and $Y^1$, $Y^2$, $Y^3$ and $Y^4$ each independently represents one or more linking groups such as esters (—COO—), amides (—CONH—), urethanes (—NHCOO—), imides

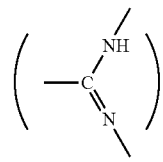

nitrilomethyleneoxys,

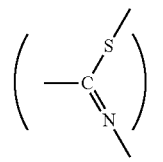

nitrilomethyleneiminos

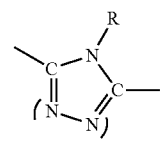

nitrilomethylenethios

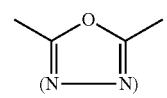

1,3,4-triazol-2,5-ylenes

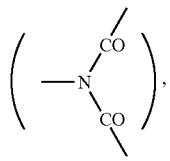

wherein R' represents alkyl of 1-6 carbon atoms, hydroxyl, amino or aryl such as phenyl and 1,3,4-oxadiazol-2,5-ylenes

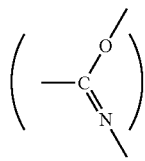

provided, that the glass transition temperature (Tg) of the mixture is above 20 degrees Celsius (° C.);

In a second embodiment of the invention each $R^1$ and $R^3$ is independently a monovalent aliphatic or cycloaliphatic hydrocarbon group having 1 to 20 carbon atoms, an aromatic group or a multicyclic aromatic nucleus; $R^2$, $Z^1$ and $Z^2$ each independently represent multivalent aliphatic or cycloaliphatic hydrocarbon groups having 1 to 20 carbon atoms or an aromatic group, where at least one of $R^2$, $Z^1$ and $Z^2$ contains at least two polymerizable/crosslinkable groups chosen from vinyl, allyl, acrylic or methacrylic or other polymerizable groups; and $Y^1$, $Y^2$, $Y^3$ and $Y^4$ as defined above.

In a third embodiment of the invention each $R^1$ and $R^3$ is independently a monovalent aliphatic or cycloaliphatic hydrocarbon group having 1 to 20 carbon atoms, an aromatic group or a multicyclic aromatic nucleus, where at least one of $R^1$ and $R^3$ is independently a monovalent moiety containing at least one polymerizable/crosslinkable group chosen from vinyl, allyl, acrylic or methacrylic or other polymerizable groups;

R2, $Z^1$ and $Z^2$ each independently represent multivalent aliphatic or cycloaliphatic hydrocarbon groups having 1 to 20 carbon atoms or an aromatic group, where at least one of R2, $Z^1$ and $Z^2$ contains at least one polymerizable/crosslinkable groups chosen from vinyl, allyl, acrylic or methacrylic or other polymerizable groups; and $Y^1$, Y2, $Y^3$ and $Y^4$ as defined above.

In a fourth embodiment of the invention, each $R^1$ and $R^3$ is independently

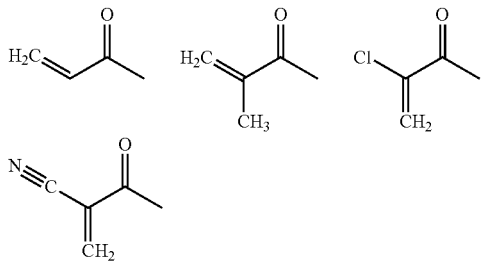

$R2$, $Z^1$ and $Z^2$ each independently represent multivalent charge-transporting or light emitter moieties; and $Y^1$, Y2, $Y^3$ and $Y^4$ as defined above.

The crosslinkable molecular amorphous glass mixtures, the polymerizable molecular amorphous glass mixtures and combinations thereof of the invention are truly non-crystallizable.

In a fifth embodiment of the invention each $R^1$ and $R^3$ is independently a monovalent aliphatic or cycloaliphatic hydrocarbon group having 1 to 20 carbon atoms, an aromatic group or a multicyclic aromatic nucleus, where each of $R^1$ and $R^3$ is independently a monovalent moiety containing at least one polymerizable/crosslinkable group chosen from vinyl, allyl, acrylic or methacrylic or other polymerizable groups;

$R2$, $Z^1$ and $Z^2$ each independently represent multivalent aliphatic or cycloaliphatic hydrocarbon groups having 1 to 20 carbon atoms or an aromatic group; and $Y^1$, Y2, $Y^3$ and $Y^4$ each independently represents a triple bond, a double bond, or a single bond link; provided that $T_g$ of the mixture is above 20° C.

In a sixth embodiment of the invention each $R^1$ and $R^3$ is independently a monovalent aliphatic or cycloaliphatic hydrocarbon group having 1 to 20 carbon atoms, an aromatic group or a multicyclic aromatic nucleus, where at least one of $R^1$ and $R^3$ is independently a monovalent moiety containing at least one polymerizable/crosslinkable group chosen from vinyl, allyl, acrylic or methacrylic or other polymerizable groups; $R2$, $Z^1$ and $Z^2$ each independently represent multivalent aliphatic or cycloaliphatic hydrocarbon groups having 1 to 20 carbon atoms or an aromatic group, where at least one of $R2$, $Z^1$ and $Z^2$ contains at least one polymerizable/crosslinkable groups chosen from vinyl, allyl, acrylic or methacrylic or other polymerizable groups; and $Y^1$, Y2, $Y^3$ and $Y^4$ each independently represents a triple bond, a double bond, or a single bond link; provided that $T_g$ of the mixture is above 20° C.

A seventh embodiment of the invention involves modification of the properties of a crosslinkable organic film, polymerizable organic film or combination thereof after it has been deposited by adding new components into it from its surface. In the examples of this method, the emitting color of light-emitting diodes are modified based on doped crosslinkable compositions, polymerizable compositions or combinations thereof by locally introducing dopants causing different color emission into the film by local application of a solution containing the desired dopant to the film surface (by ink jet printing, screen printing, local droplet application, etc.). This overcomes difficulties encountered with the direct patterning of three separately formed organic layers (each which uniformly coats an entire surface when formed) into regions for separate red, green, and blue devices due to the sensitivities of the organic materials to chemicals typically used with conventional patterning technologies. Alternatively, dopants may be introduced in an organic film by diffusion from one layer into the film in local regions or by locally applying them directly into the organic film. Typically all of the active components are incorporated into a high glass transition temperature material when the material film is first formed, for example by spin coating the material film over a surface. In the present invention, the properties of the materials are modified after a solid film of a low-$T_g$ crosslinkable organic film, polymerizable organic film or combination thereof has been formed by later introducing new species into the film from the film's top surface by thermal diffusion at a very low temperature especially in a patterned arrangement. The method is especially attractive for the local modification of the photoluminescence, electroluminescence color, or combination thereof of a thin film of the material, for example to create red, green, and blue light-emitting regions after a surface has been coated with a thin film of the material which is the same everywhere. After all three light-emitting regions are formed, the crosslinkable, polymerizable, or combination thereof layer is subjected to a blanket exposure of actinic radiation to crosslink, polymerize, or crosslink and polymerize the layer and enhance its thermal and mechanical properties.

BRIEF DESCRIPTION OF THE DRAWINGS

The invention will be described in more details by reference to the drawings, of which.

DETAILED DESCRIPTION OF THE INVENTION

Figure 1:
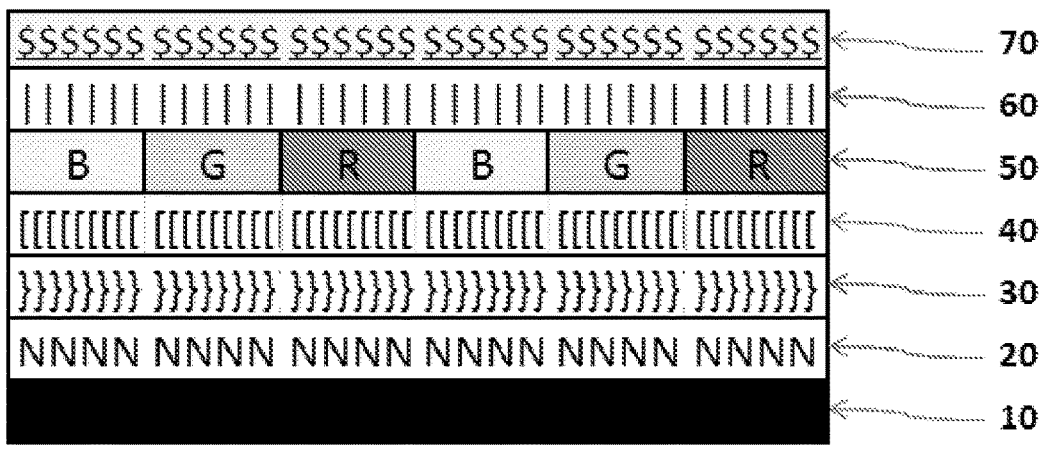
FIG. 1 illustrates the sectional structure in an embodiment for organic light emitting device showing two sets of blue, green, and red subpixels.

Various embodiments of the present invention provide for crosslinkable charge-transporting, polymerizable charge-transporting, and combinations thereof molecular glass mixtures, luminescent molecular glass mixtures, and combinations thereof with thermal properties that can be controlled independent of the structure of the core charge-transporting group, the luminescent group, or a combination thereof. The various embodiments used to describe the principles of the present invention are by way of illustration only and should not be construed in any way to limit the scope of the invention. Those skilled in the art will understand that the principles of the present invention may be implemented in any suitably arranged device.

Definitions of Terms Used in this Application

Throughout this document, the following terms will have the following meanings.

The term "amorphous" means that the mixture is non-crystalline. That is, the mixture has no molecular lattice structure.

A "non-equilibrium molecular glass" is a glass forming material that is crystallizable under certain conditions, for example above their glass transition temperature, or in contact with certain solvents.

The term "amorphous" means that the mixture is non-crystalline. That is, the mixture has no molecular lattice structure.

A "non-crystallizable molecular glass" will never crystallize under any circumstances and is always amorphous.

An "asymmetric glass mixture" is a glass mixture where all the components are asymmetric, i.e. have all distinct substituents.

A low-$T_g$ crosslinkable, polymerizable, or combination thereof organic film is a composition comprising at least one crosslinkable compound, at least one polymerizable compound or a combination thereof and has a glass transition temperature below 60° C., preferably below 40° C.

A low-$T_g$ crosslinkable, polymerizable, or combination thereof compound has a glass transition temperature below 25° C., preferably below −20° C. and has the capacity to mix in one-phase with a variety of other materials. A dopant is a material introduced in a composition at a concentration less than 20 wt %, preferably lea than 10 wt % that imparts some particular property to the composition.

A "multicyclic aromatic nucleus" is a nucleus comprising at least two cyclic groups one of which is aromatic, including aromatic heterocyclic ring groups. The cyclic group may be substituted with substituents such as aliphatic hydrocarbons, including cycloaliphatic hydrocarbons, other aromatic ring groups such as aryl, and heterocyclic ring groups such as substituted or fused thiazole, oxazole, imide, pyrazole, triazole, oxadiazole, pyridine, pyrimidine, pyrazine, triazine, tetrazine and quinoline groups. The substituents are fused or non-fused and mono or polycyclic. Examples of multicyclic aromatic nuclei include 9,9-bis(4-hydroxy-3,5-dichlorophenyl)fluorene, 4,4'-hexahydro-4,7-methanoindan-5-ylidenebis(2,6-dichlorophenol); 9,9-bis(4-hydroxy-3,5-dibromophenyl(fluorene, 4,4'-hexahydro-4,7-methanoindan-5-ylidenebis(2,6-dibromophenol); 3',3",5',5"-tetrabromophenolphthalein, 9,9-bis(4-aminophenyl) fluorene, phenylindandiols; 1,1'-spirobiindandiols, 1,1'-spirobiindandiamines, 2,2'-spirobichromans; 7,7-dimethyl-7H-dibenzo[c,h]xanthenediol; xanthylium salt diols; 9,9-dimethylxanthene-3,6-bis(oxyacetic acids); 4,4'(3-phenyl-1-indanylidene)diphenol and other bisphenols; 3',3"-dibromo-5',5"-dinitro-2',2"-oxaphenolphthalein; 9-phenyl-3-oxo-2,6,7-trihydroxyxanthene; and the like.

"Aliphatic hydrocarbon group" refers to monovalent or divalent, alkanes, alkenes, alkadienes and alkynes having from 1 to 20 carbon atoms. The groups are straight or branched chain and include carbohydrate, carboxylic acid, alcohol, ether aldehyde and ketone functions.

"Cycloaliphatic" refers to cyclic aliphatic hydrocarbon groups. The groups may be substituted with halogen, alkoxy, amide, nitro, esters and aromatic groups.

Exemplary aliphatic groups include methyl, ethyl, propyl, isopropyl, butyl, hexyl, 2-ethylhexyl, methoxyethyl, ethoxycarbonylpropyl, 3-oxobutyl, 3-thiapentyl, furfuryl, 2-thiazolylmethyl, cyclohexylmethyl, benzyl, phenethyl, phenoxyethyl, vinyl (—CH$_2$=CH$_2$—), 2-methylvinyl, allyl, allylidene, butadienyl, butenylidene, propargyl, and the like.

"Aromatic" and "aromatic heterocyclic" group refers to organic groups which undergo the same type of substitution reaction as benzene. In benzene, substitution reactions are preferred over addition reactions. Such groups preferably have from 6 to about 40 nuclear atoms and are mono- and polycyclic.

Exemplary aromatic groups include quinolinyl, pyrimidinyl, pyridyl, phenyl, tolyl, xylyl, naphthyl, anthryl, triptycenyl, p-chlorophenyl, p-nitrophenyl, p-bromophenyl, 2,4-dichlorophenyl, 2-chlorophenyl, 3,5-dinitrophenyl, p-(tetrabromophthalimido)phenyl, p-(tetrachlorophthalimido)phenyl, p-tetraphenylphthalimido)phenyl, p-naphthalimidophenyl, p-(4-nitrophthalimido)phenyl, p-phthalimidophenyl, 1-hydroxy-2-naphthyl, 3,5-dibromo-4-(4-bromobenzoyloxy)phenyl, 3,5-dibromo-4-(3,5-dinitrobenzoyloxy)phenyl, 3,5-dibromo-4-(1-naphthoyloxy) phenyl, thiazolyl, oxazolyl, imidazolyl, pyrazolyl, triazolyl, oxadiazolyl, pyrazinyl, etc and their corresponding multivalent and fused ring configurations.

"Green solvents" are non-toxic and benign to environment. A good guide of green solvents can be found in "Green chemistry tools to influence a medicinal chemistry and research chemistry based organization by K. Alfonsi, et al, Green Chem., 2008, 10, 31-36, DOI: 10.1039/b711717e. A list of "preferred", "usable", and undesirable solvents are shown in Table 1. The preferred solvents are considered "greener". The undesirable solvents are to be avoided.

TABLE 1

| Preferred | Useable | Unundesirable |
|---|---|---|
| Water | cyclohexane | pentane |
| acetone | methylcyclohexane | hexane |

TABLE 1-continued

| Preferred | Useable | Unundesirable |
|---|---|---|
| ethanol | toluene | di-isopropyl ether |
| 2-propanol | heptane | diethyl ether |
| 1-propanol | acetonitrile | dichloromethane |
| ethyl acetate | 2-methyltetrahydrofuran | dichloroethane |
| isopropyl acetate | tetrahydrofuran | dimethyl formamide |
| methanol | xylenes | N-methylpyrrolidone |
| 1-butanol | dimethylsulfoxide | pyridine |
| t-butanol | acetic acids | dimetyl acetamide |
|  | ethylene glycol | dioxane |
|  |  | dimethoxyethane |
|  |  | benzene |
|  |  | carbon tetrachloride |

An "electronic device" is any device that uses electrons in its function, input or output. A photonic device is any device that uses photons in its function, input or output.

And the expression "direct conjugation" is defined as the presence of a segment having the formula: —(CH$_2$=CH$_2$)$_n$—C=C— where n=0 or 1 in one or more aromatic rings directly between an —OH group and the nearest nitrogen atom. Examples of direct conjugation between the —OH groups and the nearest nitrogen atom through one or more aromatic rings include a compound containing a phenylene group having an —OH group in the ortho or para position (or 2 or 4 position) on the phenylene group relative to a nitrogen atom attached to the phenylene group or a compound containing a polyphenylene group having an —OH group in the ortho or para position on the terminal phenylene group relative to a nitrogen atom attached to an associated phenylene group.

The present invention provides crosslinkable molecular glass mixture, polymerizable molecular glass mixture, combinations thereof, charge-transporting molecular glass mixtures, luminescent molecular glass mixtures, and combinations thereof comprising at least at least two nonpolymeric, thermoplastic compounds, each thermoplastic compound independently conforming to the structure:

$(R^1Y^1)_p[(Z^1Y^2)_mR^2Y^3]_nZ^2Y_4R^3$ wherein m is zero or one;
n is the number of recurring units in the compound, and is zero up to, but not including, an
integer at which said compound starts to become a polymer;
p is an integer of from one to eight;

In one embodiment of the invention, each $R^1$ and $R^3$ is independently a monovalent aliphatic or cycloaliphatic hydrocarbon group having 1 to 20 carbon atoms, an aromatic group or a multicyclic aromatic nucleus, where each of $R^1$ and $R^3$ is independently a monovalent moiety containing at least one polymerizable group, crosslinkable group, or combination thereof chosen from vinyl, allyl, acrylic or methacrylic, or other polymerizable groups;

R2, $Z^1$ and $Z^2$ each independently represent multivalent aliphatic or cycloaliphatic hydrocarbon groups having 1 to 20 carbon atoms or an aromatic group;

The monovalent moiety containing at least one polymerizable group, crosslinkable group, or combination thereof of this invention include polycyclic aromatic hydrocarbons (PAHs) such as pyrenes, naphthalenes, anthracenes, perylenes, fluorenes, carbazoles, dibenzothiophenes triarylamines, triazoles, triazines, oxadiazoles, and others known in the art; monovalent crosslinkable moieties, polymerizable moieties, and combinations thereof include any crosslinkable moiety, polymerizable moiety, or combination thereof, fluorescent or phosphorescent, electron-transporting, hole-transporting, that is monovalently functionalized with one of a hydroxy, carboxy, amino, anhydride, or isocyanate group while containing any crosslinkable/polymerizable chosen from the group of vinyl, allyl, acrylic or methacrylic; and $Y^1$, $Y^2$, $Y^3$ and $Y^4$ each independently represents one or more linking groups such as esters (—COO—), amides (—CONH—), urethanes (—NHCOO—), imides

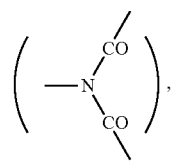

nitrilomethyleneoxys,

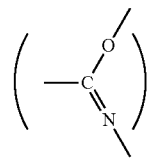

nitrilomethyleneiminos

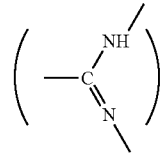

nitrilomethylenethios

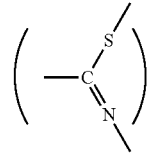

1,3,4-triazol-2,5-ylenes

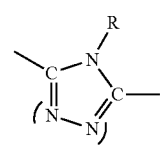

wherein R' represents alkyl of 1-6 carbon atoms, hydroxyl, amino or aryl such as phenyl and 1,3,4-oxadiazol-2,5-ylenes

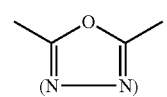

provided that the glass transition temperature (Tg) of the molecular glass mixture is above 20° C.

In another aspect of this embodiment an intermediate non-crosslinkable glass mixture can be prepared in a first step utilizing bivalent moieties containing for example one amino group and at least one hydroxyl group. The amine group is reacted in the first step to provide an intermediate glass mixture containing hydroxyl groups. In the second step acryloyl, methacryloyl chlorides, or combinations thereof are reacted with the free hydroxyl groups to provide the final polymerizable molecular glass, crosslinkable molecular glass, or combination thereof of this invention.

In yet another aspect of this embodiment, the intermediate glass mixture containing hydroxyl groups is mixed with blocked polyisocyanates to form a thermally crosslinkable mixture.

Bivalent charge-transporting moieties containing an amino and at least one hydroxyl group can be prepared for example as follows:

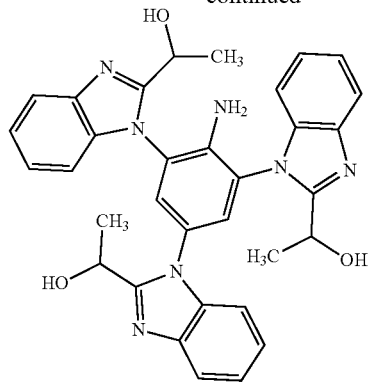

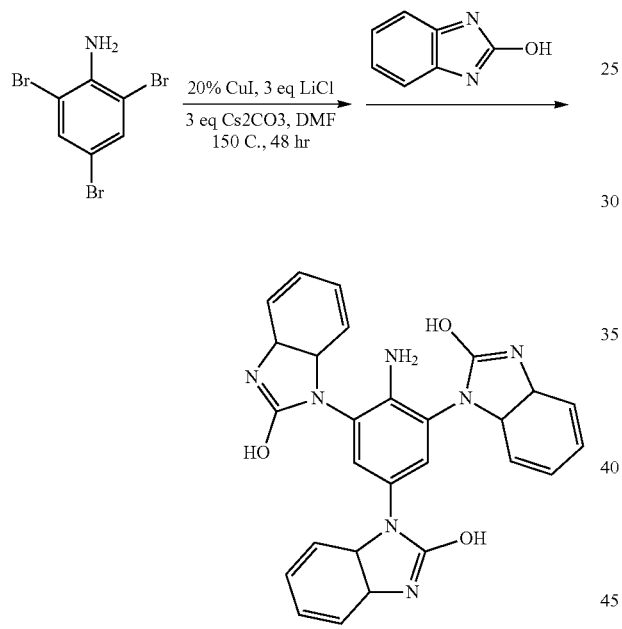

Below are examples (not exhaustive) of bivalent charge-transporting, electroluminescent, and other materials containing one amino group and at least one hydroxyl group:

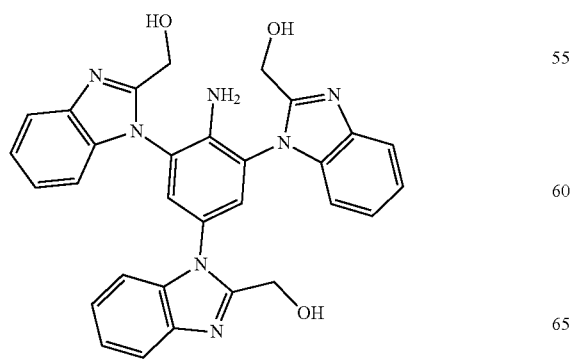

-continued

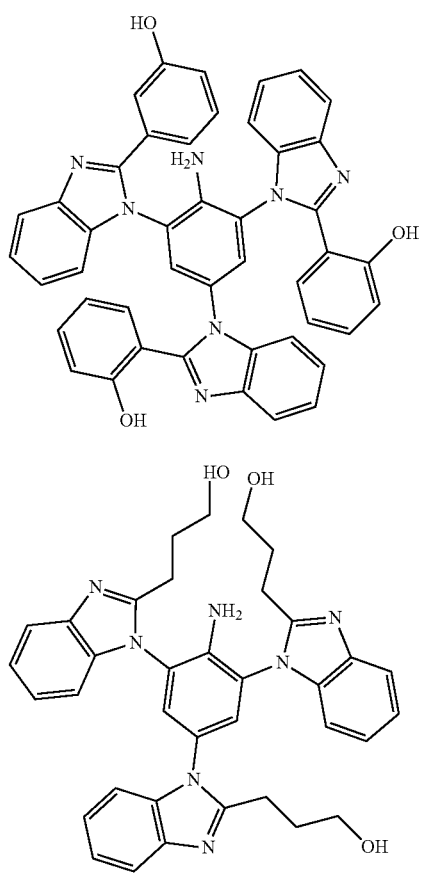

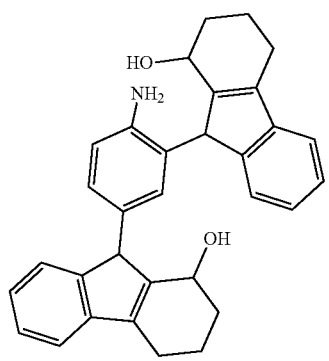

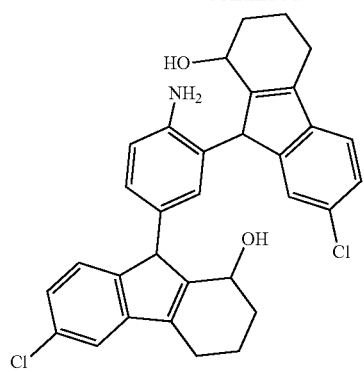
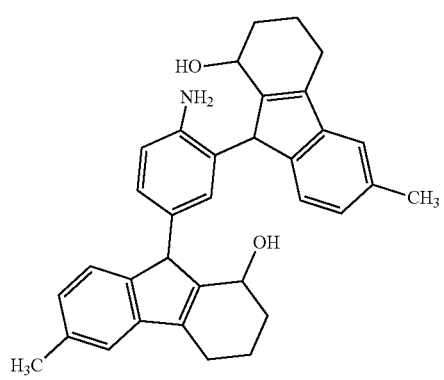
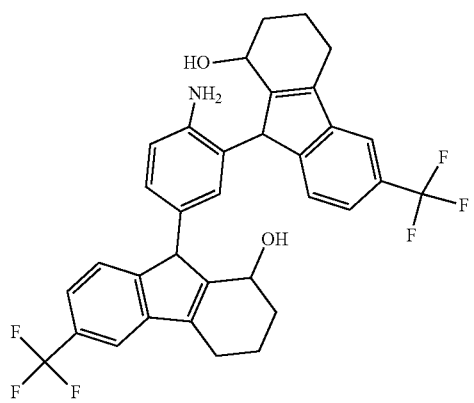
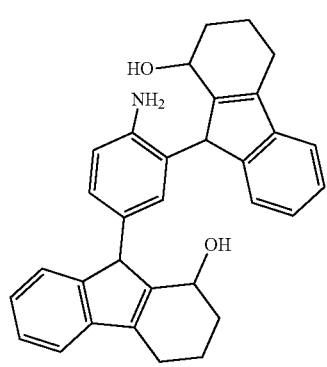
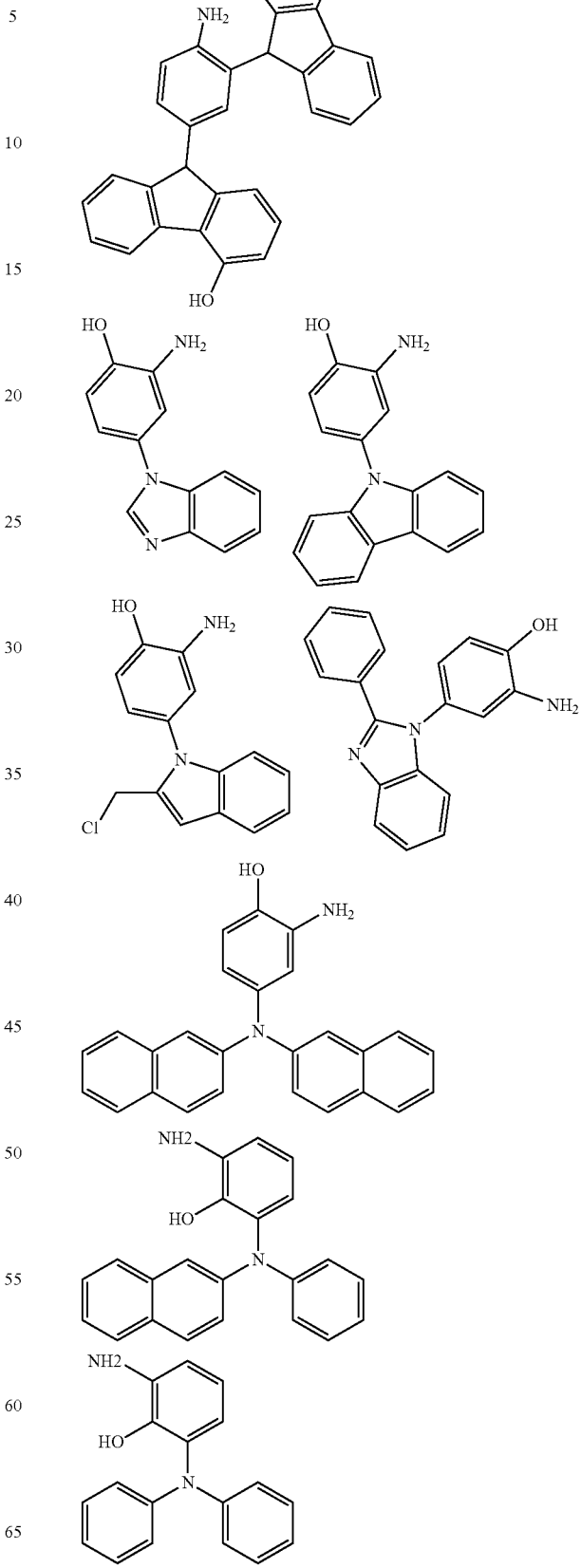

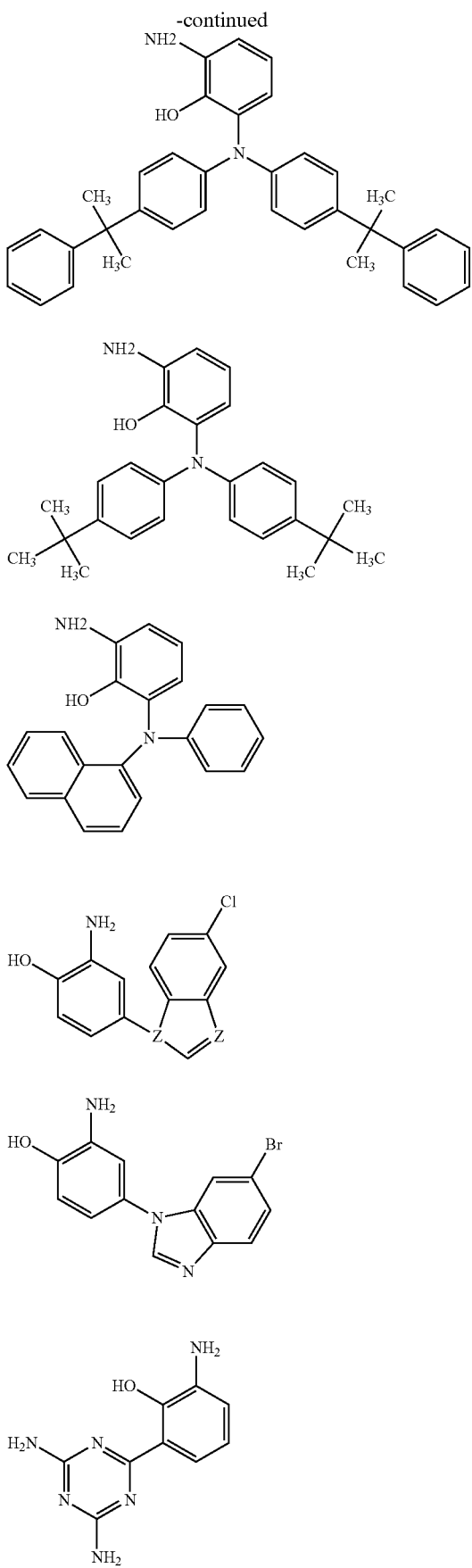

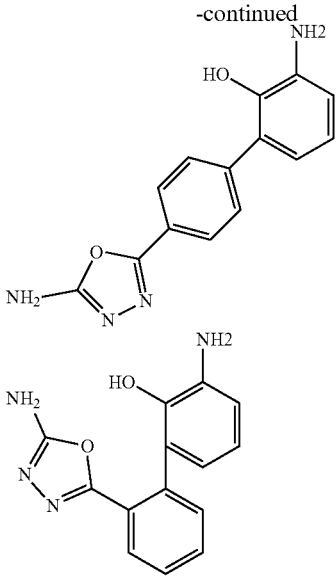

These materials can be reacted with bis-anhydrides to provide imide molecular glass mixture intermediates containing free hydroxyl groups. The imide molecular glass mixture intermediates can then be reacted with acryloyl and or methacryloyl chlorides to produce the polymerizable molecular glass mixtures, crosslinkable molecular glass mixtures and combinations thereof of the invention.

Example of bis-anydrides include:

4,4'-(Hexafluoroisopropylidene)bis(phthalic anhydride)

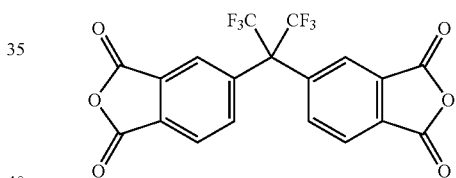

5,5'-Oxybis(2-benzofuran-1,3-dione)

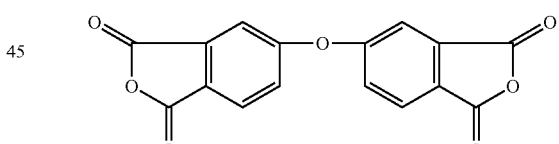

4,4'-Carbonylbis(phthalic anhydride)

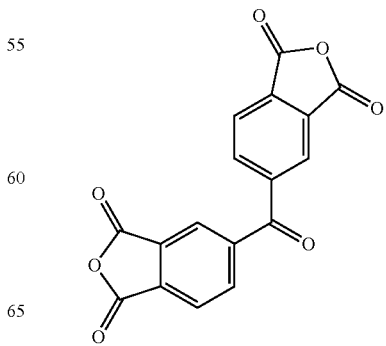

4,4'-Biphthalic anhydride

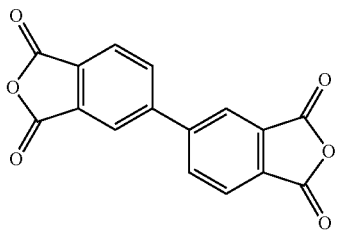 [SMILES: O=C1OC(=O)c2cc(-c3ccc4c(c3)C(=O)OC4=O)ccc21]

3,4,9,10-Perylenetetracarboxylic dianhydride

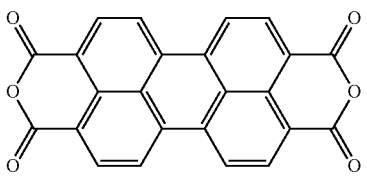

Pyromellitic dianhydride

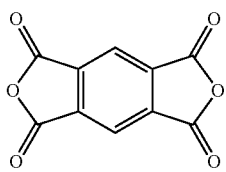 [SMILES: O=c1oc(=O)c2cc3c(=O)oc(=O)c3cc12]

Tetrahydrocyclobuta[1,2-c:3,4-c']difuran-1,3,4,6-tetrone

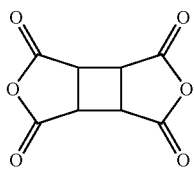 [SMILES: O=C1OC(=O)C2C1C1C(=O)OC(=O)C21]

5,5'-[Propane-2,2-diylbis(4,1-phenyleneoxy)]bis(2-benzofuran-1,3-dione)

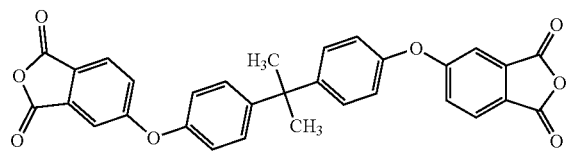 [SMILES: CC(C)(c1ccc(Oc2ccc3c(c2)C(=O)OC3=O)cc1)c1ccc(Oc2ccc3c(c2)C(=O)OC3=O)cc1]

4,5'-bi-2-benzofuran-1,1',3,3'-tetrone

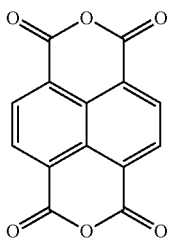 [SMILES: O=C1OC(=O)c2ccc3c4c(ccc1c24)C(=O)OC3=O]

Alternatively one equivalent of the bivalent moiety containing one amino group and at least one hydroxyl group can react with one equivalent of a bis-anhydride to form a mono-anhydride containing at least one free hydroxyl group, by adapting the synthesis of unsymmetrical compound methods disclosed in U.S. Pat. No. 4,992,349 which is hereby incorporated by reference in its entirety.

Examples of such mono-anhydride containing at least one free hydroxyl group include:

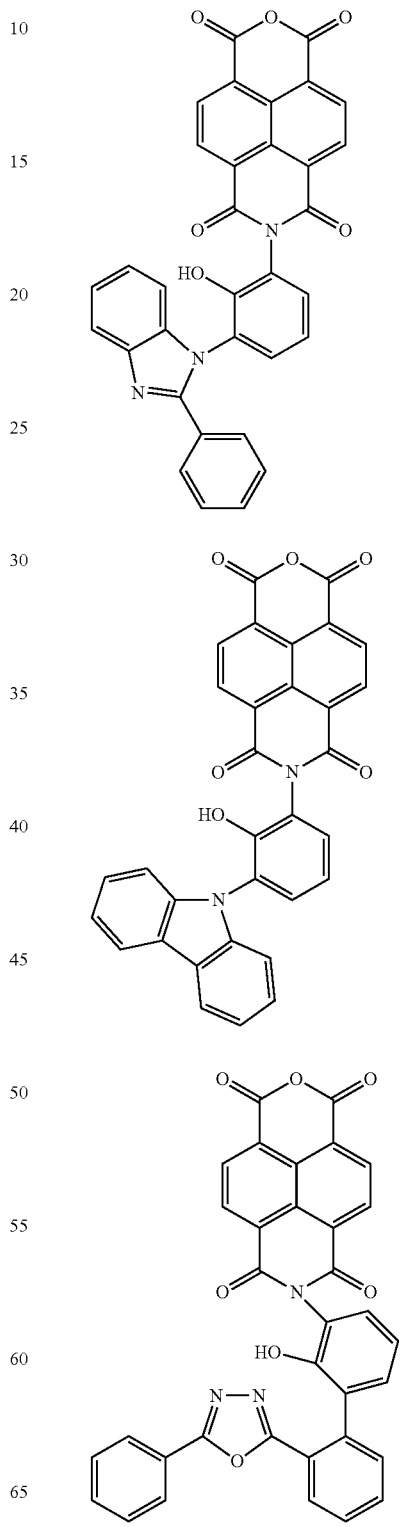

-continued
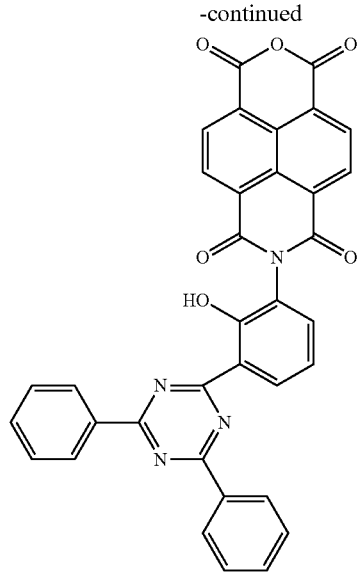
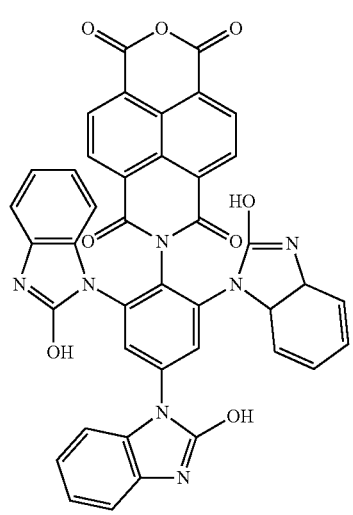
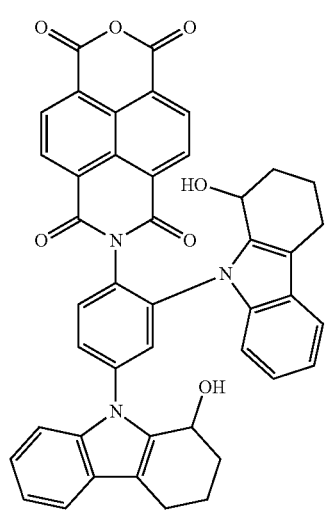
-continued
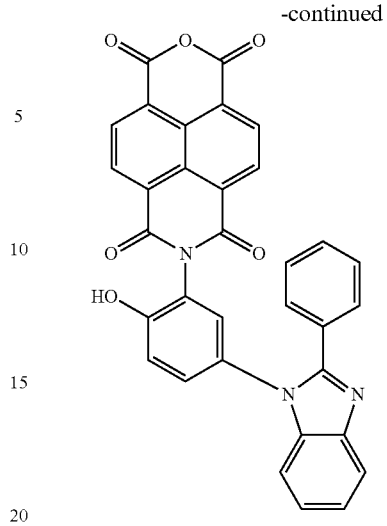
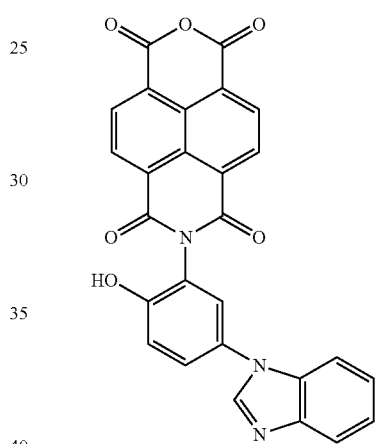
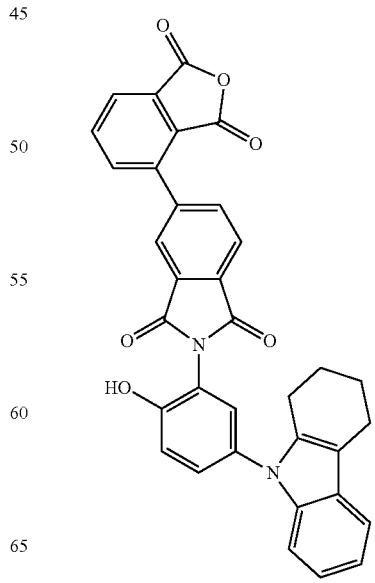

-continued

These mono-anhydride containing free hydroxyls can then be reacted with a multivalent amine to provide intermediate molecular glass mixtures incorporating free hydroxyl groups. The intermediate molecular glasses mixtures are then reacted with acryolyl or methacryloyl chloride to produce the final crosslinkable molecular glass, polymerizable molecular glass and combinations thereof of this invention.

Examples of multivalent amines include:

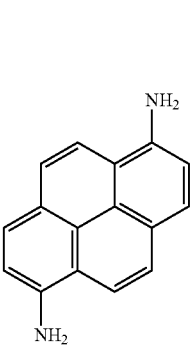

1,6-Diaminopyrene

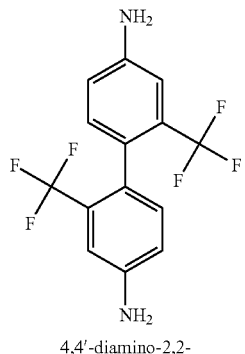

4,4′-diamino-2,2-bis(trifluoromethyl)biphenyl

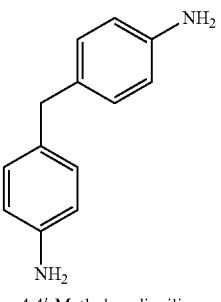

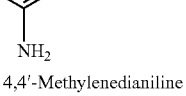

4,4′-Methylenedianiline

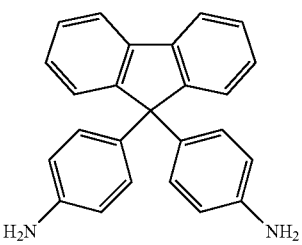

9,9-bis(aminophenyl)fluorene

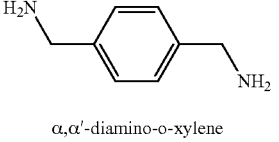

α,α′-diamino-o-xylene

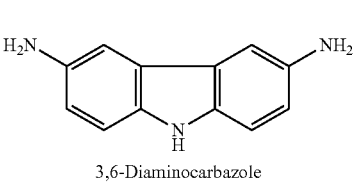

3,6-Diaminocarbazole

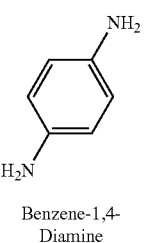

Benzene-1,4-Diamine

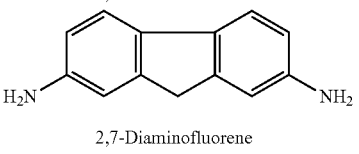

2,7-Diaminofluorene

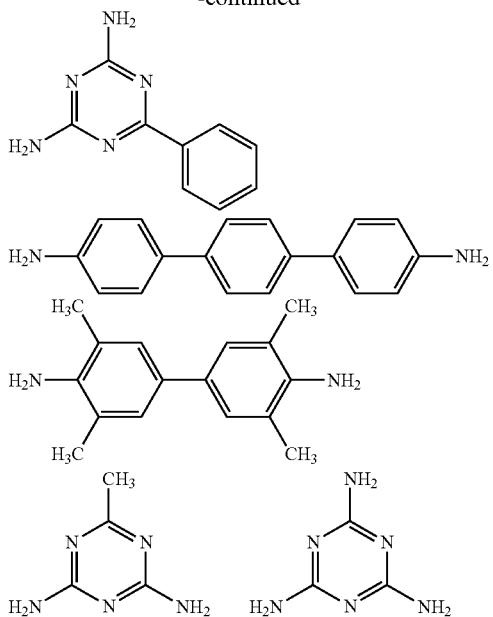

The diamino oxadiazoles reported in "*Polymers Containing 1,3,4-Oxadiazole Rings for Advanced Materials*" by Mariana-Dana Dămăceanu et al., Chemistry, 2010

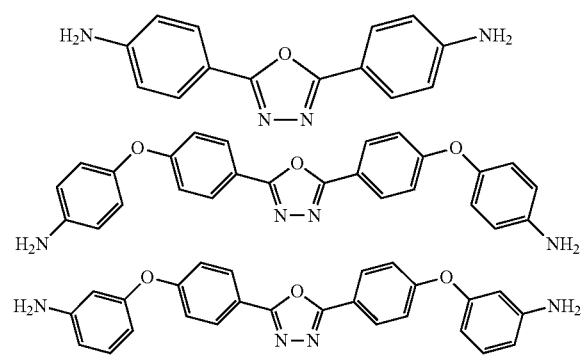

In yet another aspect of this embodiment, the intermediate glass mixture containing hydroxyl groups is mixed with blocked isocyanates to form a thermally crosslinkable mixture. Examples of blocked isocyanates include:

The blocked isocyanates of U.S. Pat. No. 5,202,406, issued to Randall S. Dearth, et al., the oxime blocked poly isocyanates have been disclosed in U.S. Pat. No. 4,474,934, issued to Michio Tanaka, et al. on Oct. 2, 1984; U.S. Pat. No. 4,533,684, issued to Panagiotis I. Kordomenos on Aug. 6, 1985; U.S. Pat. No. 4,596,744, issued to Terry L. Anderson, et al. on Jun. 24, 1986; U.S. Pat. No. 4,785,068, issued to Akira Tominaga, et al. on Nov. 15, 1988; U.S. Pat. No. 4,806,585, issued to Takeo Nakayama, et al. on Feb. 21, 1989; and U.S. Pat. No. 4,824,925, issued to Peter Kamarchik, Jr., et al. on Apr. 25, 1989. Preferred blocked isocyanates include the, 5-Dimethylpyrazole (DMP) and malonic ester (DEM). developed by Baxenden Chemicals, Limited, Baxenden, England. Several advantages of DMP blocked isocyanates are cited, including lower unblock temperature (110-120° C.) and increased cure response. The DEM blocked isocyanates deblock at 90° C. All these United States patents are hereby incorporated in their entirety into this specification.

In a second embodiment of the invention each $R^1$ and $R^3$ is independently a monovalent aliphatic or cycloaliphatic hydrocarbon group having 1 to 20 carbon atoms, an aromatic group or a multicyclic aromatic nucleus; R2, $Z^1$ and $Z^2$ each independently represent multivalent aliphatic or cycloaliphatic hydrocarbon groups having 1 to 20 carbon atoms or an aromatic group, where at least one of R2, $Z^1$ and $Z^2$ contains at least two polymerizable/crosslinkable groups chosen from vinyl, allyl, acrylic or methacrylic or other polymerizable groups; and $Y^1$, Y2, $Y^3$ and $Y^4$ are as defined in the first embodiment above.

Examples of multivalent moieties containing at least two polymerizable groups include:

n,n-diallylmelamine

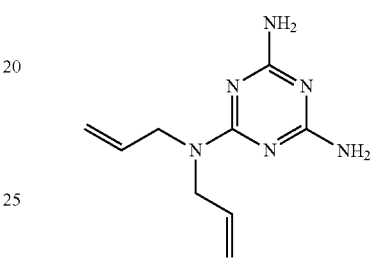

6-vinyl-1,3,5-triazine-2,4-diamine

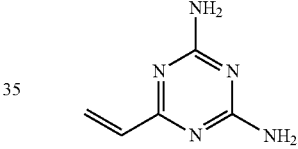

Like in the first embodiment, an intermediate non-crosslinkable glass mixture can be prepared in a first step utilizing bivalent moieties containing for example at least two amine groups and at least two hydroxyl groups. The amine groups are reacted in the first step to provide an intermediate glass mixture containing free hydroxyl groups. In the second step acryloyl, methacryloyl chlorides and combinations thereof are reacted with the free hydroxyl groups to provide the final polymerizable molecular glass, crosslinkable molecular glass or combination thereof.

Examples of bivalent moieties containing for example at least two amine groups and at least two hydroxyl groups include:

4,4'-(9H-Fluorene-9,9-diyl)bis(2-aminophenol)

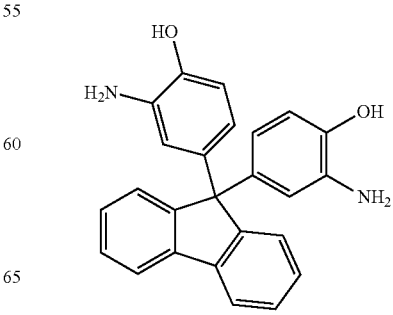

2,2-Bis(3-amino-4-hydroxyphenyl)hexafluoropropane

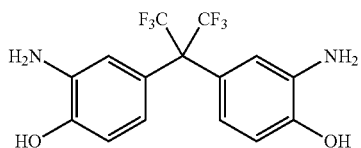 [SMILES: Nc1cc(C(c2ccc(O)c(N)c2)(C(F)(F)F)C(F)(F)F)ccc1O]

4,4'-sulfonylbis(2-aminophenol)

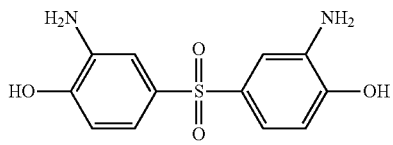

4,4-propane-2,2-diylbis(2-aminophenol)

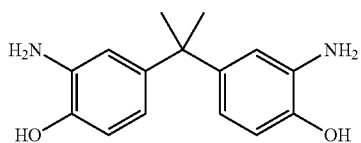 [SMILES: CC(C)(c1ccc(O)c(N)c1)c1ccc(O)c(N)c1]

The amino groups of these bivalent molecules can be reacted to a mixture of mono-anhydrides to provide imide molecular glass mixtures with free hydroxyl groups. Those free hydroxyl groups can then be reacted with acryloyl, methacryoyl chlorides or combinations thereof to form the polymerizable, crosslinkable, and combinations thereof molecular glass mixtures of this invention.

Monovalent starting materials containing free hydroxyl groups can be prepared following the scheme below for example:

The carbazole can be replaced by starting materials such as N-phenyl-1-anthramine, N-phenyl-2-anthramine, N-phenyl-9-anthramine, 4-Methyldiphenylamine, m,m'-Ditolylamine, 3-methoxydiphenylamine, 4,4-Dimetoxydiphenylamine, Bis(4-biphenyl)amine), Bis(4-tert-butylphenyl)-amine, N-Phenyl-3-biphenylamine, N-Phenyl-4-biphenylamine, 1,2'-Dinaphtylamine, 2,2'-Dinaphthylamine, 1,2'-Dinaphthylamine, N-Phenyl-1-naphthylamine, N-Phenyl-2-naphthylamine, N-(p-Tolyl)-1-naphthylamine, N-(p-Tolyl)-2-naphthylamine all available at TC, or by 2-Phenylbenzimidazole

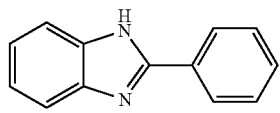

The following are examples (although not exhaustive) of intermediates that can be prepared for making the final crosslinkable, polymerizable or combination thereof molecular glass mixtures of this invention:

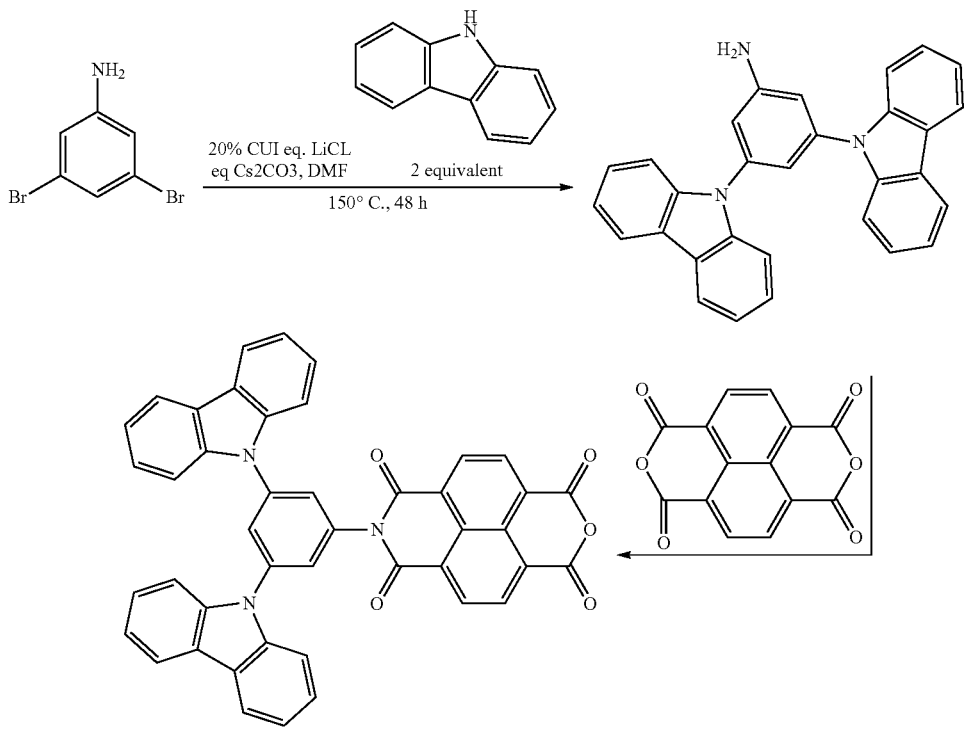

29
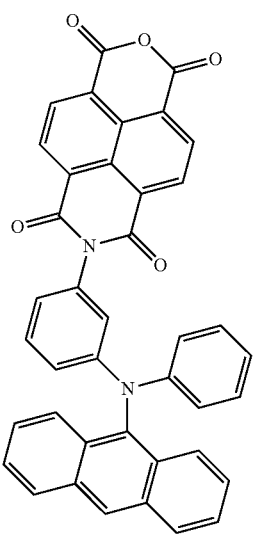
30
-continued
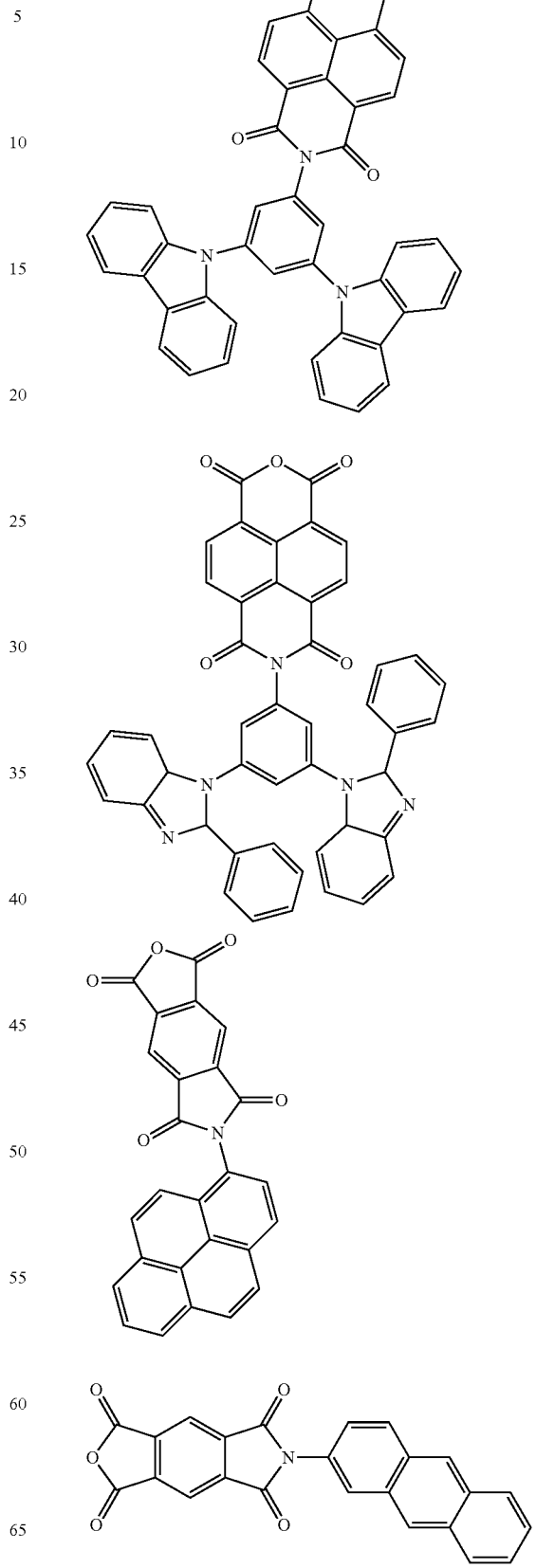

31
-continued
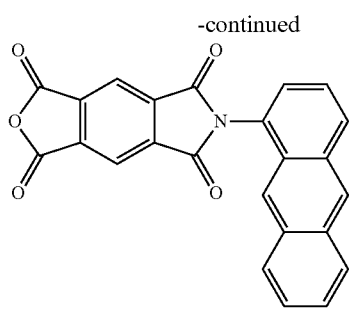
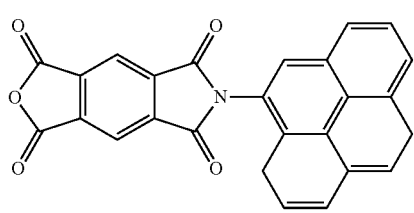
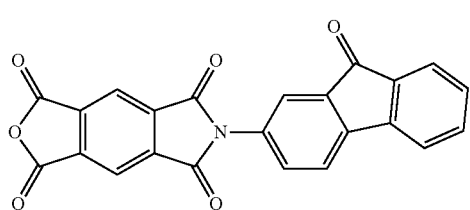
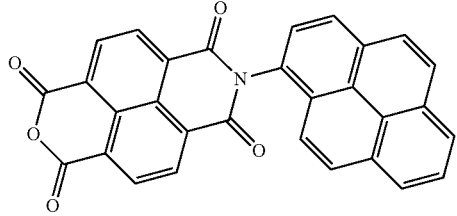
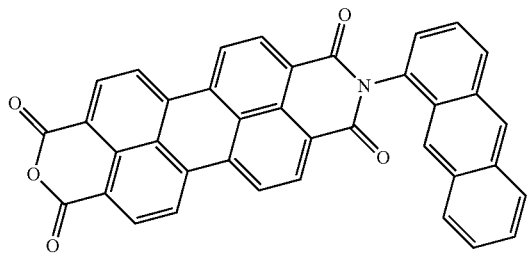
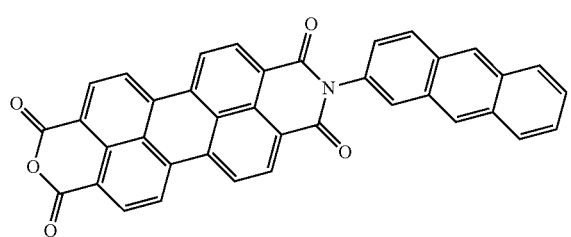
32
-continued
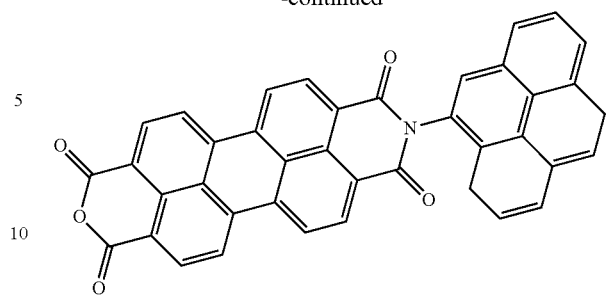
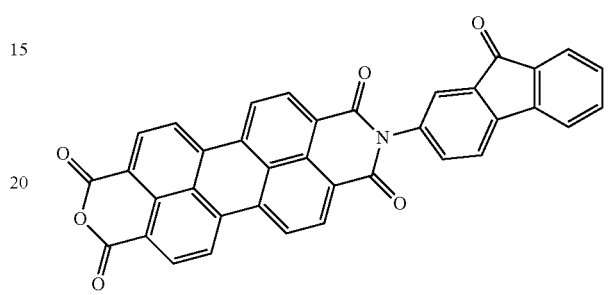
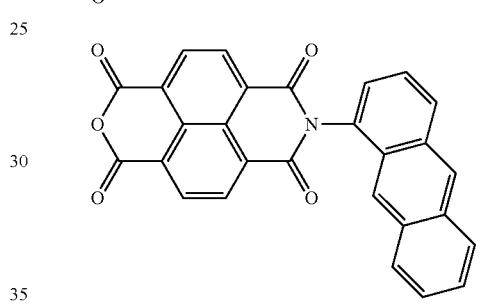
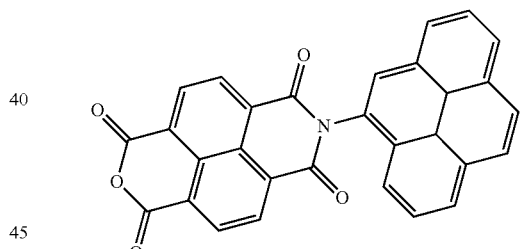
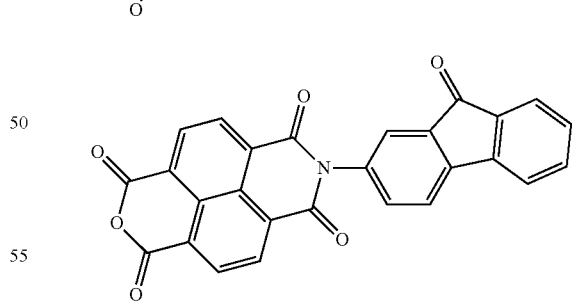
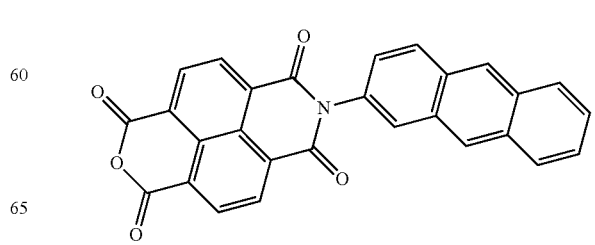

-continued

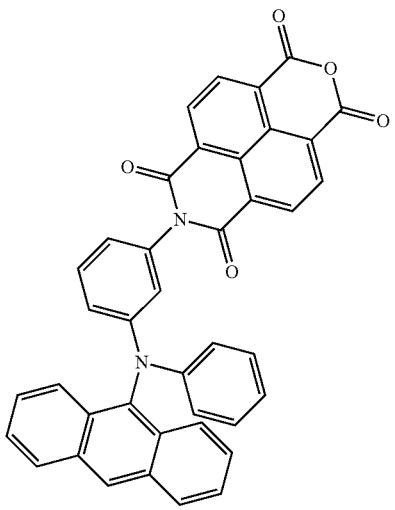

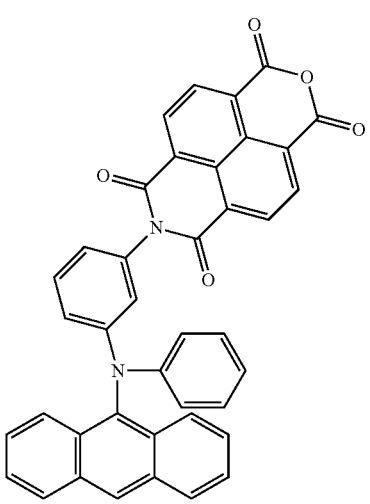

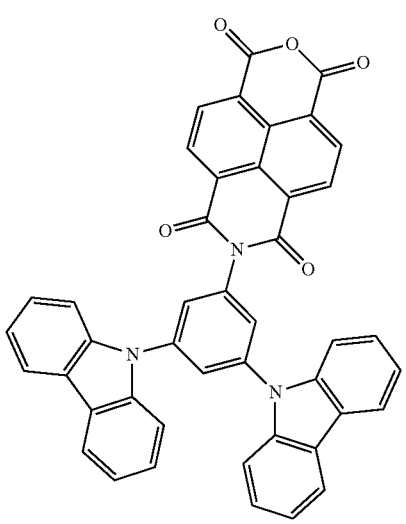

-continued

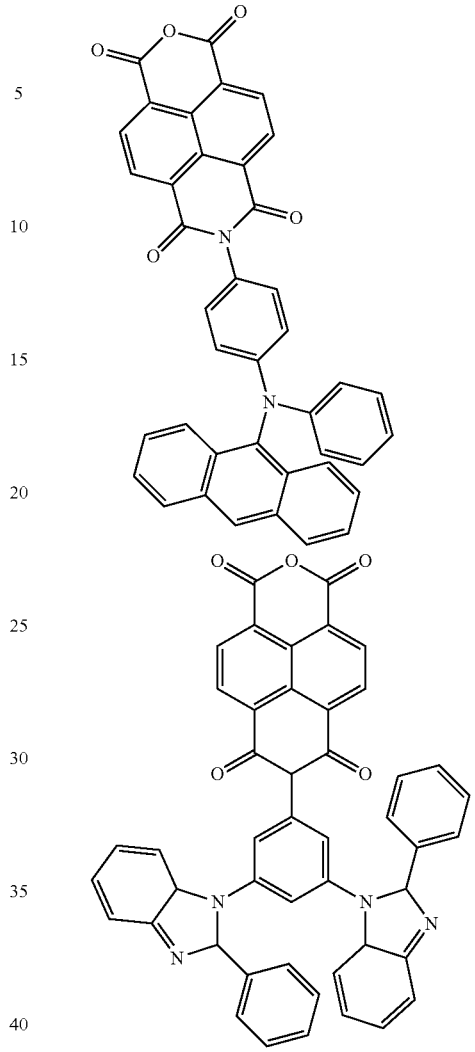

In a third embodiment of the invention each R and $R^3$ is independently a monovalent aliphatic or cycloaliphatic hydrocarbon group having 1 to 20 carbon atoms, an aromatic group or a multicyclic aromatic nucleus, where at least one of $R^1$ and $R^3$ is independently a monovalent moiety containing at least one polymerizable/crosslinkable group chosen from vinyl, allyl, acrylic or methacrylic or other polymerizable groups.

Examples of such monovalent moiety containing at least one polymerizable/crosslinkable group are shown above;

$R^2$, $Z^1$ and $Z^2$ each independently represent multivalent aliphatic or cycloaliphatic hydrocarbon groups having 1 to 20 carbon atoms or an aromatic group, where at least one of $R^2$, $Z^1$ and $Z^2$ contains at least one polymerizable/crosslinkable group chosen from vinyl, allyl, acrylic or methacrylic or other polymerizable groups;

Examples of multivalent moiety with at least one polymerizable/crosslinkable group are shown above; and $Y^1$, Y2, $Y^3$ and $Y^4$ are as defined in the first embodiment above.

In a fourth embodiment of the invention, each $R^1$ and $R^3$ is independently

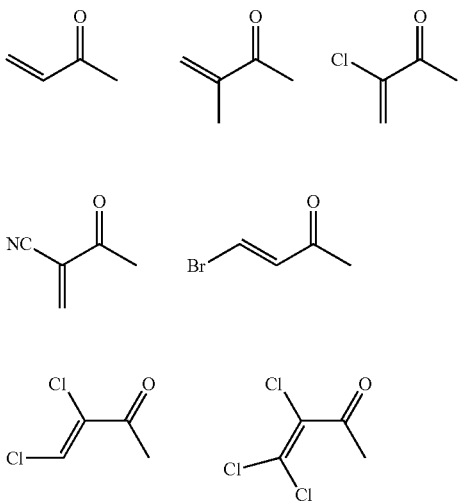

$R^2$, $Z^1$ and $Z^2$ each independently represent multivalent charge transporting or light emitter moieties; and $Y^1$, $Y^2$, $Y^3$ and $Y^4$ are as defined in the first embodiment above.

The multivalent charge-transport moiety of this invention can be hole-transporting or electron-transporting. Examples of hole-transport moieties include triarylamines, N-substituted-carbazole, arylalkanes, hydrazones, pyrazolines and others known in the art. Electron-transport moieties include diphenoquinones, bisimides, oxadiazoles, triazoles, imidazoles, oxazoles, thiazoles, thiadiazoles, triazines, quinolones, quinoxalines, anthrazolines, phenanthrolines, siloles, and others known in the art;

Specific examples of hole-transport triarylamines include:
1,1-bis(4-di-p-tolylaminophenyl)cyclohexane;
1,1-bis(4-di-p-tolylaminophenyl)-4-phenylcyclohexane;
1,5-bis[N-(1-naphthyl)-N-phenylamino]naphthalene;
2,6-bis(di-p-tolylamino)naphthalene;
2,6-bis[di-(1-naphthyl)amino]naphthalene;
2,6-bis[N-(1-naphthyl)-N-(2-naphthyl)amino]naphthalene;
2,6-bis[N,N-di(2-naphthyl)amine]fluorene;
4-(di-p-tolylamino)-4'-[4(di-p-tolylamino)-styryl]stilbene;
4,4'-bis(diphenylamino)quadriphenyl;
4,4'-bis[N-(1-anthryl)-N-phenylamino]-p-terphenyl;
4,4'-bis[N-(1-coronenyl)-N-phenylamino]biphenyl;
4,4-bis[N-(1-naphthyl)-N-phenylamino]biphenyl (NPB);
4,4-bis[N-(1-naphthyl)-N-(2-naphthyl)amino]biphenyl (TNB);
4,4'-bis[N-(1-naphthyl)-N-phenylamino]p-terphenyl;
4,4'-bis[N-(2-naphthacenyl)-N-phenylamino]biphenyl;
4,4'-bis[N-(2-naphthyl)-N-phenylamino]biphenyl;
4,4'-bis[N-(2-perylenyl)-N-phenylamino]biphenyl;
4,4'-bis[N-(2-phenanthryl)-N-phenylamino]biphenyl;
4,4'-bis[N-(2-pyrenyl)-N-phenyl amino]biphenyl;
4,4'-bis[N-(3-acenaphthenyl)-N-phenylamino]biphenyl;
4,4'-bis[N-(3-methylphenyl)-N-phenylamino]biphenyl (TPD);
4,4-bis[N-(8-fluoranthenyl)-N-phenylamino]biphenyl;
4,4-bis[N-(9-anthryl)-N-phenylamino]biphenyl;
4,4-bis {N-phenyl-N-[4-(1-naphthyl)-phenyl]amino}biphenyl;
4,4'-bis[N-phenyl-N-(2-pyrenyl)amino]biphenyl;
4,4,4'-tris[(3-methylphenyl)phenylamino]triphenylamine (m-TDATA); Bis(4-dimethylamino-2-methylphenyl)-phenylmethane;
N-phenylcarbazole;
N,N'-bis[4-([1,1'-biphenyl]-4-ylphenylamino)phenyl]-N,N'-di-1-naphthalenyl-[1,1'-biphenyl]-4,4'-diamine;
N,N'-bis[4-(di-1-naphthalenylamino)phenyl]-N,N'-di-1-naphthalenyl-[1,1'-biphenyl]-4,4'-diamine;
N,N'-bis[4-[(3-methylphenyl)phenylamino]phenyl]-N,N'-diphenyl-[1'-biphenyl]-4,4'-diamine;
N,N-bis[4-(diphenylamino)phenyl]-N',N'-diphenyl-[1,1'-biphenyl]-4,4'-diamine;
N,N'-di-1-naphthalenyl-N,N'-bis[4-(1-naphthalenylphenylamino)phenyl]-[1,1'-biphenyl]-4,4'-diamine;
N,N'-di-1-naphthalenyl-N,N'-bis[4-(2-naphthalenylphenylamino)phenyl]-[1,1'-biphenyl]-4,4'-diamine;
N,N,N-tri(p-tolyl)amine;
N,N,N',N'-tetra-p-tolyl-4-4'-diaminobiphenyl;
N,N,N',N'-tetraphenyl-4,4'-diaminobiphenyl;
N,N,N',N'-tetra-1-naphthyl-4,4'-diaminobiphenyl; N,N,N',N'-tetra-2-naphthyl-4,4'-diaminobiphenyl; and N,N,N',N'-tetra(2-naphthyl)-4,4'-diamino-p-terphenyl.

Examples of multivalent electron-transport moieties include the bisimides represented by the formula

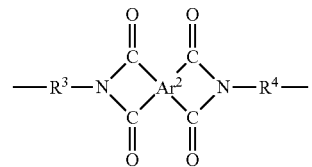

wherein $Ar^2$ represents a tetravalent aromatic group having 6 to about 20 carbon atoms that may be the same as or different from; $R^3$ and $R^4$ each independently represents an alkylene group having 2 to about 12 carbon atoms as described in U.S. Pat. No. 5,266,429 which is hereby incorporated by reference in its entirety;

Specific examples of bisimides include:
1,2,4,5 benzenetetracarbonyl-diimides;

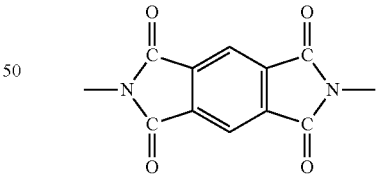

1,4,5,8-naphtalenetetracarbonyl-diimides; and

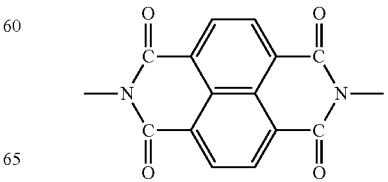

3,4,9,10-perylenetetracarbonyl diimides.

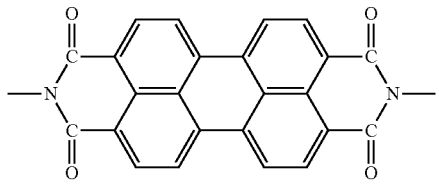

Specific examples of oxadiazoles include 2,5-bis(4-naphthyl)-1,3,4-oxadiazole (BND) reported in Kraft, A et al, *Angnew. Chem., Int. Ed.* 1998, 37, 402; 2-(4-biphenyl)-5-(4-tetr-butylphenyl)-a,3,4-oxadiazole (PBD) reported in Braun, D; Heeger, A. *J. Appl. Phys. Lett.* 1991, 58, 1982

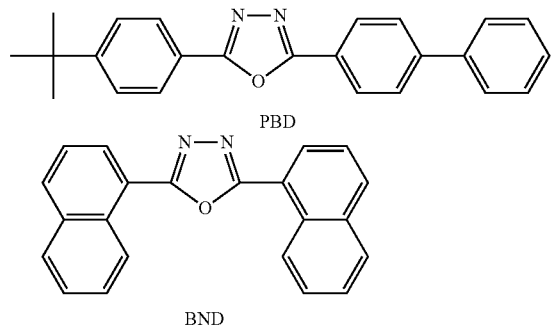

Specific examples of triazoles include:

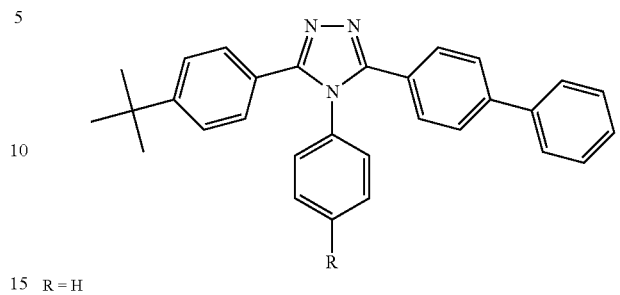

R = H
= C2H5

(Kido, J. et al, Jpn J. Appl. Phys. 1993, 32 and

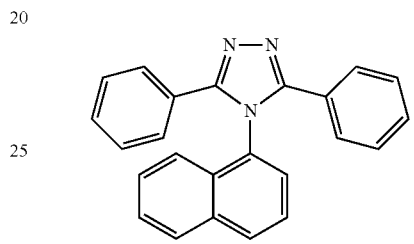

(Adachi, C. et al Appl. Phys. Lett. 2000, 77, 904) Examples of triazines include:

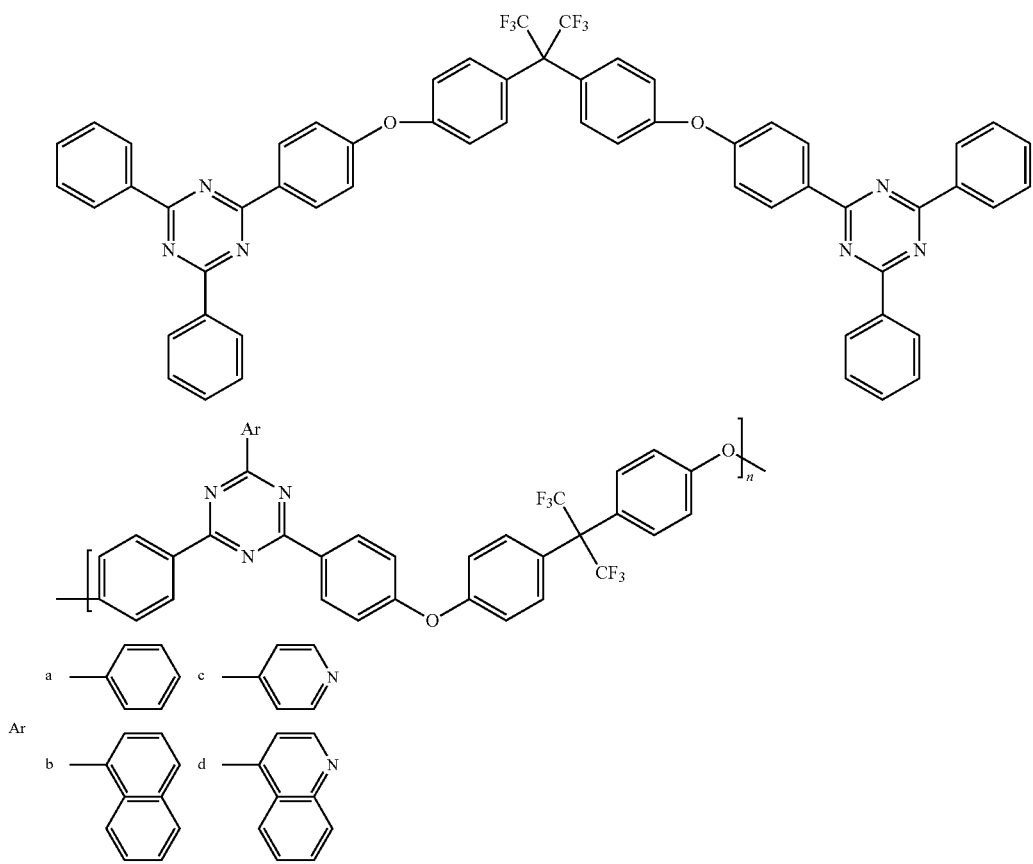

Representative starting materials having a hole-transport moiety and at least two functional (reactive) groups are selected from the following materials.

A. The arylamine-containing organic diol and the arylamine-containing organic diacid of Noonan, U.S. Pat. No. 4,395,475 hereby incorporated by reference in its entirety:

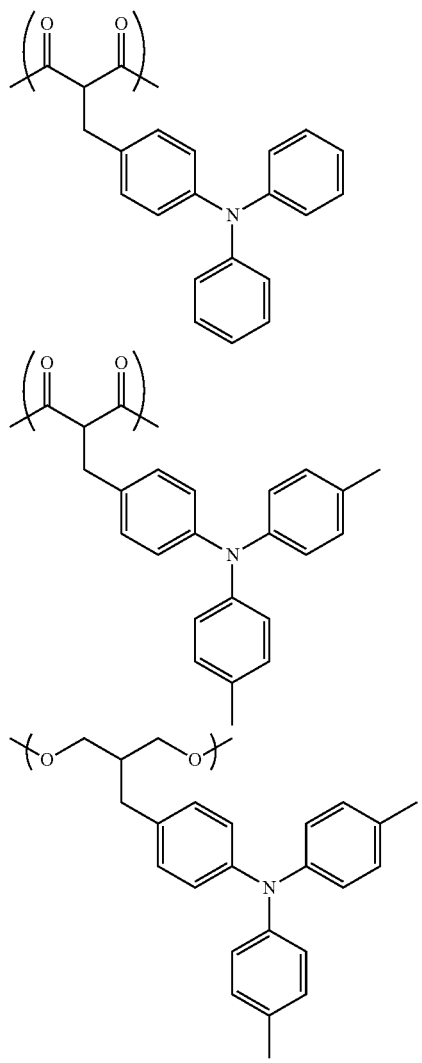

B. The hydroxyl functionalized arylamines of Limberg et al U.S. Pat. No. 5,011,939, hereby incorporated by reference in its entirely, represented by the formula:

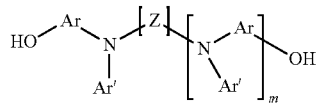

wherein:
m is 0 or 1;
Z is selected from the group consisting of:

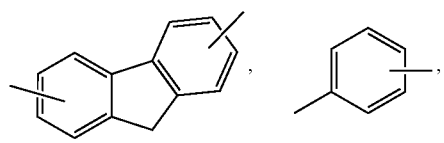

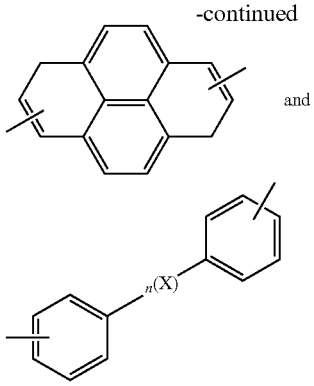

n is 0 or 1;
Ar is selected from the group consisting of:

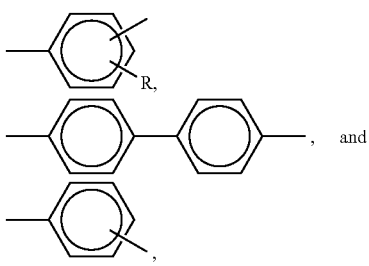

R is selected from the group consisting of —$CH_3$, —$C_2H_5$, —$C_3H_7$, and —$C_4H_9$;
Ar' is selected from the group consisting of:

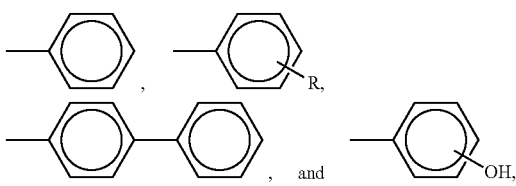

X is selected from the group consisting of:

—$CH_2$—, —$C(CH_3)_2$—, —O—, —S—,

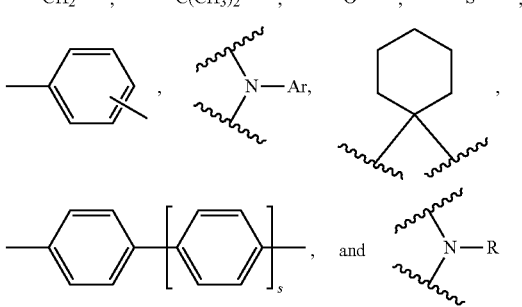

s is 0, 1 or 2, preferably the dihydroxy arylamine compound being free of any direct conjugation between the —OH groups and the nearest nitrogen atom through one or more aromatic rings.

The following two structures are illustrative examples of specific compounds in which the hydroxyl group is in direct conjugation with the nitrogen through a phenylene ring system:

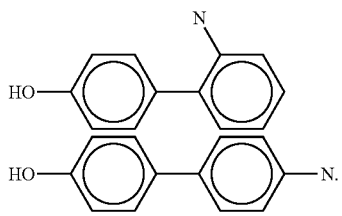

Generally, these hydroxy arylamine compounds are prepared, for example, by hydrolyzing an dialkoxy arylamine. A typical process for preparing alkoxy arylamines is disclosed in Example I of U.S. Pat. No. 4,588,666 to Stolka et al, the entire disclosure of this patent being incorporated herein by reference. Preferably, the dihydroxy arylamine compound of this invention should be free of any direct conjugation between the —OH groups and the nearest nitrogen atom through one or more aromatic rings because layers containing compounds having such direct conjugation fail to support transport of electrical charges.

Typical hydroxy arylamine compounds of this invention include, for example: N,N'-diphenyl-N,N'-bis(3-hydroxyphenyl)-[1,1'-biphenyl]-4,4'-diamine; N,N,N',N',-tetra(3-hydroxyphenyl)-[1,1'-biphenyl]-4,4'-diamine; N,N-di(3-hydroxyphenyl)-m-toluidine; 1,1-bis-[4-(di-N,N-m-hydroxpyphenyl)-aminophenyl]-cyclohexane; 1,1-bis[4-(N-m-hydroxyphenyl)-4-(N-phenyl)-aminophenyl]-cyclohexane; Bis-(N-(3-hydroxyphenyl)-N-phenyl-4-aminophenyl)-methane; Bis[(N-(3-hydroxyphenyl)-N-phenyl)-4-aminophenyl]-isopropylidene; N,N'-diphenyl-N,N'-bis(3-hydroxyphenyl)-[1,1';4',1"-terphenyl]-4,4"-diamine; 9-ethyl-3.6-bis[N-phenyl-N-3(3-hydroxyphenyl)-amino]-carbazole; 2,7-bis[N,N-di(3-hydroxyphenyl)-amino]-fluorene; 1,6-bis[N,N-di(3-hydroxyphenyl)-amino]-pyrene; and 1,4-bis[N-phenyl-N-(3-hydroxyphenyl)]-phenylenediamine.

Typical hydroxy arylamine compounds containing direct conjugation between the —OH groups and the nearest nitrogen atom through one or more aromatic rings include, for example: N,N'-diphenyl-N—N'-bis(4-hydroxyphenyl) [1,1'-biphenyl]-4,4'-diamine; N,N,N',N',-tetra(4-hydroxyphenyl)-[1,1'-biphenyl]-4,4'-diamine; N,N-di(4-hydroxyphenyl)-m-toluidine; 1,1-bis-[4-(di-N,N-p-hydroxpyphenyl)-aminophenyl]-cyclohexane; 1,1-bis[4(N-o-hydroxyphenyl)-4-(N-phenyl)-aminophenyl]-cyclohexane; Bis-(N—(N4-hydroxyphenyl)-N-phenyl-4-aminophenyl)-methane; Bis[(N-(4-hydroxyphenyl)-N-phenyl)-4-aminophenyl]-isopropylidene; Bis-N,N—[(N4'-hydroxy-4 (1,1'-biphenyl)]-aniline; and Bis-N,N-[(2'-hydroxy-4(1,1'-biphenyl)]-aniline.

C. The hydroxy arylamine compounds of Yanus et al, U.S. Pat. No. 5,262,512, which is hereby incorporated by reference in its entirety. A few examples are shown below:

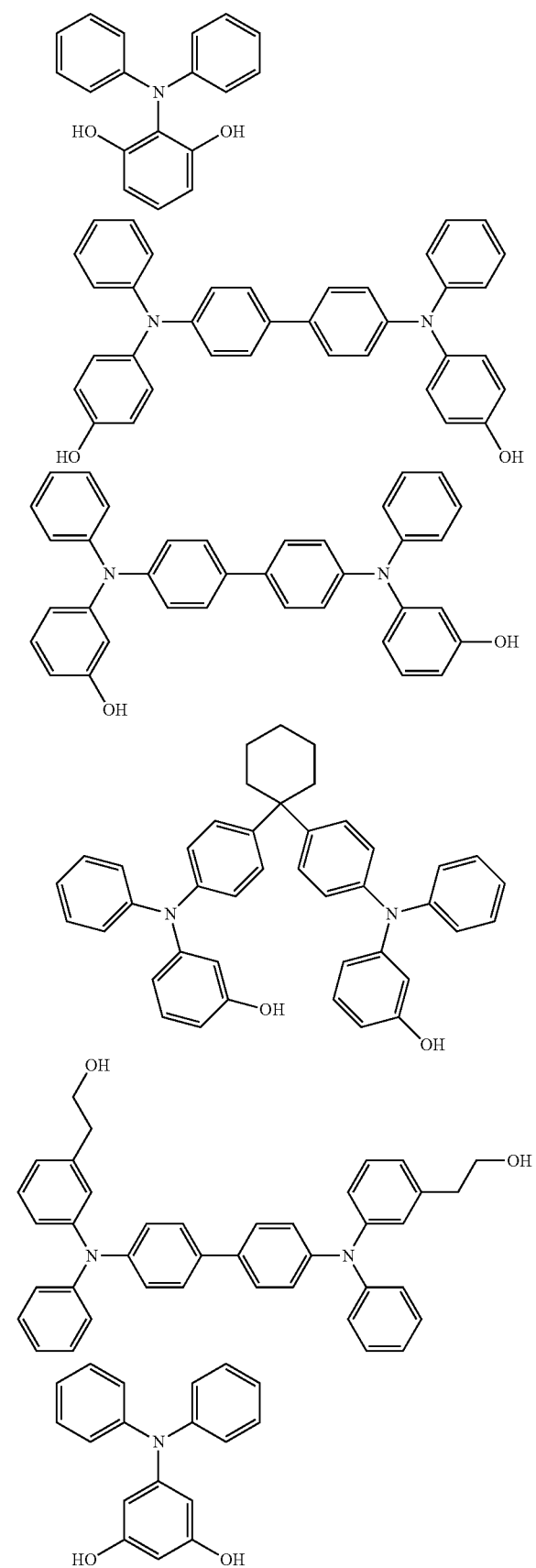

D. The diphenol compound having a tertiary amino group of Anzai et al, U.S. Pat. No. 5,747,204 hereby incorporated by reference in its entirety represented by the formula:

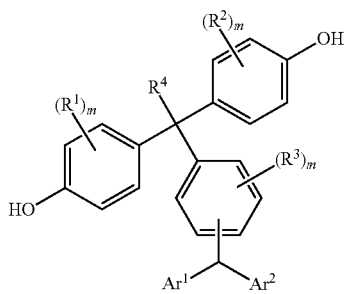

wherein $R^1$, $R^2$ and $R^3$ each is an alkyl group which may have a substituent, or a halogen atom; $R^4$ is a hydrogen atom, or an alkyl group which may have a substituent; $Ar^1$ and $Ar^2$ each is an aromatic hydrocarbon group which may have a substituent; 1, m and n each is an integer of 0 to 4.

Specific examples of the halogen atom represented by $R^1$, $R^2$, $R^3$, $R^5$, or $R^6$ are fluorine, chlorine, iodine and bromine.

Specific examples of the alkyl group represented by $R^1$, $R^2$, $R^3$, $R^4$, $R^5$, or $R^6$ include straight-chain or branched alkyl groups having 1 to 12 carbon atoms, preferably 1 to 8 carbon atoms, and more preferably 1 to 4 carbon atoms. The above alkyl group may have a substituent such as a fluorine atom, hydroxyl group, cyano group, an alkoxyl group having 1 to 4 carbon atoms, or a phenyl group which may have a substituent selected from the group consisting of a halogen atom, an alkyl group having 1 to 4 carbon atoms and an alkoxyl group having 1 to 4 carbon atoms.

Specific examples of the above alkyl group include methyl group, ethyl group, n-propyl group, i-propyl group, tert-butyl group, sec-butyl group, n-butyl group, i-butyl group, trifluoromethyl group, 2-hydroxyethyl group, 2-cyanoethyl group, 2-ethoxyethyl group, 2-methoxyethyl group, benzyl group, 4-chlorobenzyl group, 4-methylbenzyl group, 4-methoxybenzyl group and 4-phenylbenzyl group.

As the aromatic hydrocarbon group represented by $Ar^1$, $Ar^2$, $R^5$ or $R^6$ in above formula, there can be employed phenyl group, a non-fused hydrocarbon group, or a fused polycyclic hydrocarbon group.

Examples of the non-fused hydrocarbon group include biphenylyl group, and terphenylyl group.

As the fused polycyclic hydrocarbon group, a group having 18 or less carbon atoms for forming a ring is preferable. For example, there can be employed pentalenyl group, indenyl group, naphthyl group, azulenyl group, heptalenyl group, biphenylenyl group, as-indacenyl group, fluorenyl group, 9,9-dimethyl-2-fluorenyl group, s-indacenyl group, acenaphthylenyl group, pleiadenyl group, acenaphthenyl group, phenalenyl group, phenanthryl group, anthryl group, fluoranthenyl group, acephenanthrylenyl group, aceanthrylenyl group, triphenylenyl group, pyrenyl group, chrysenyl group and naphthacenyl group.

Specific examples of the substituent of the aromatic hydrocarbon group represented by $Ar^1$ or $Ar^2$ are a halogen atom such as fluorine, chlorine, bromine or iodine; and a straight-chain or branched alkyl group having 1 to 5 carbon atoms which may have a substituent such as a fluorine atom, cyano group, or a phenyl group which may have a substituent selected from the group consisting of a halogen atom and an alkyl group having 1 to 5 carbon atoms.

Specific examples of the bisphenol-arylamine moieties are shown below:

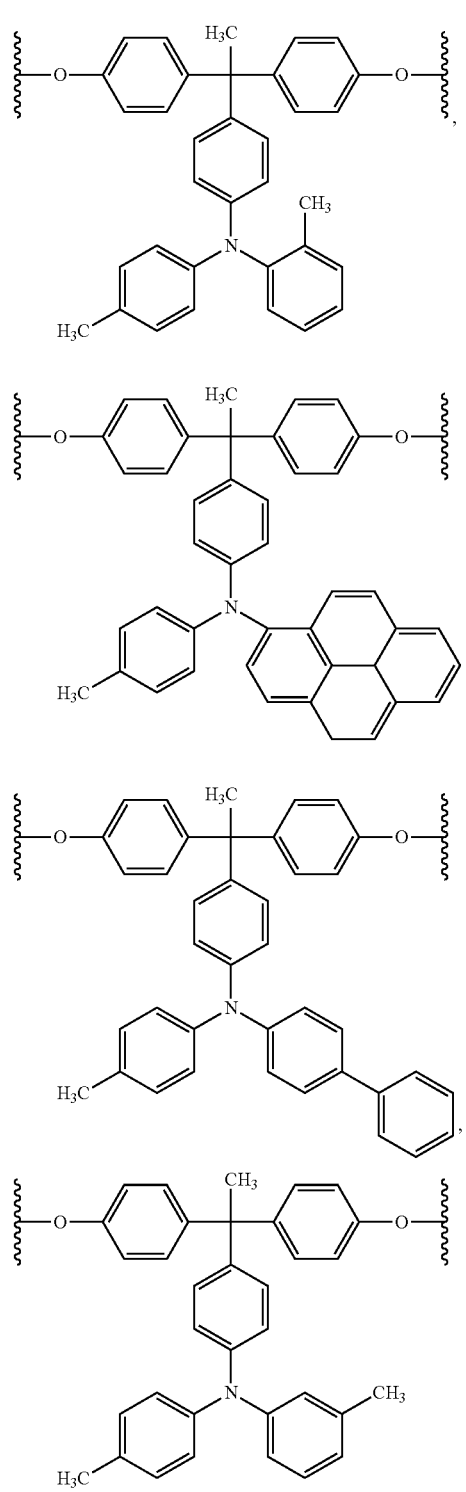

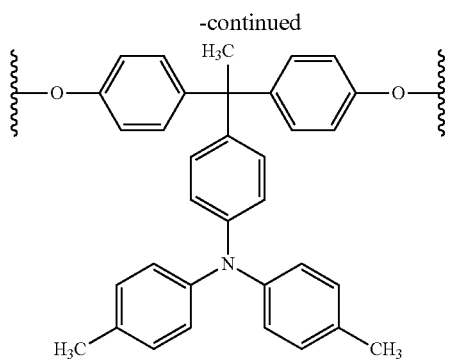

E. The dicarboxylic acids containing pendant arylamine of Noonan et al, U.S. Pat. No. 4,609,606 which is hereby incorporated in its entirety. Specific examples include:

2-{4-[bis(4-diethylamino-o-tolyl)methyl]-benzyl}malonic acid; 2-(4-anilinobenzyl)malonic acid; 2-{4-[bis(4-dibenzylamino-o-tolyl)methyl]-benzyl}malonic acid; 2-{4-[bis(4-dicyclohexylamino-o-tolyl)methyl]benzyl}malonic acid; 2-{{4-{bis[4-(N-ethyl-N-benzyl)amino-o-tolyl]-methyl}benzyl}malonic acid; 2-{4-[(4-diethylaminophenyldiphenyl)methyl]benzyl}malonic acid; 2-{4-[1-(4-dimethylaminophenyl)-1-phenylethyl]-benzyl}malonic acid; 2-[4-(2-naphthylamino)-benzyl]malonic acid; 2-{4-[3,3-bis(4-diethylamino-o-tolyl)-1-(2-thienyl)-1-propen-1-yl]-benzyl} malonic acid; 2-{4-[di(p-tolyl)amino]-benzyl]malonic acid and 2-(p-dimethylaminobenzyl)malonic acid.

The above dicarboxylic acids containing pendant arylamine can be chemically reduced to yield the corresponding diol containing pendant arylamines.

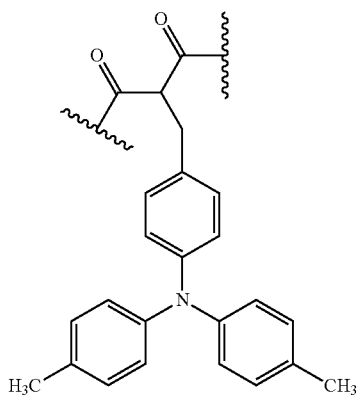

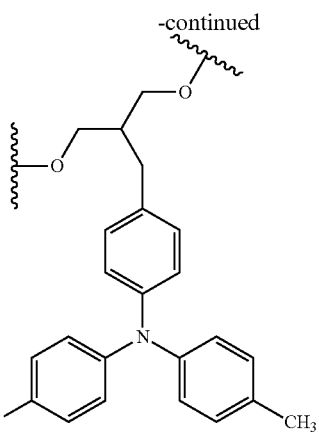

Representative starting materials having multivalatent electron-transporting moiety and at least two functional groups are selected from the following materials.

A) The di-imide structure containing tetravalent aromatic nucleus diols or dicarboxylic acids of Sorerrio et al, U.S. Pat. No. 5,266,429 hereby incorporated by reference in its entirety. The formula below is representative:

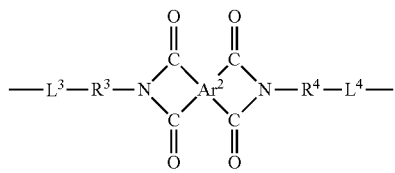

wherein $Ar^2$ represents a tetravalent aromatic group having 6 to about 20 carbon atoms, $R^1$ and $R^2$ each independently represents an alkylene group having 2 to about 12 carbon atoms, $L^3$ and $L^4$ represent O or C=O; preferred imides include 1,2,4,5-benzenetetracarbonyl-diimides

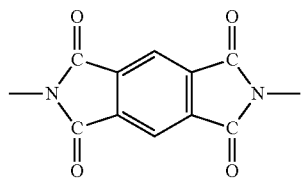

1,4,5,8-naphthalenetetracarbonyl-diimides

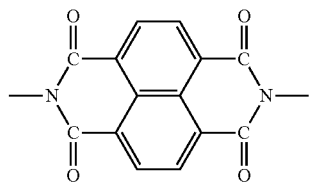

and 3,4,9,10-. perylenetetracarbonyl=diimides

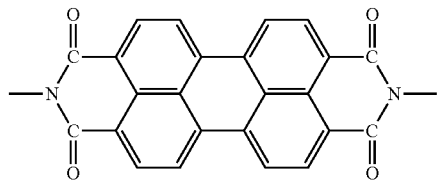

B) Multivalent oxadiazoles:

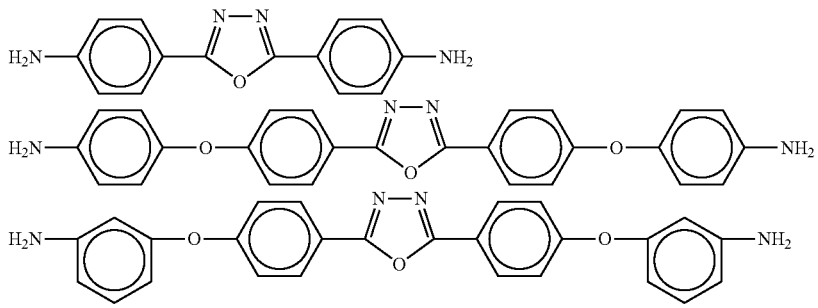

as reported in 'Polymers Containing 1,3,4-Oxadiazole Rings for Advanced Materials', Mariana—Dna Damaceanu et al, Memoirs of the Scientific Sections of the Romanian Academy, Tome XXXIV, 2011; additionally the bivalent charge-transporting examples containing an amino and at least one hydroxyl group listed in the first embodiment are useful multivalent charge transporting moieties for this embodiment.

In a fifth embodiment of the invention each $R^1$ and $R^3$ is independently a monovalent aliphatic or cycloaliphatic hydrocarbon group having 1 to 20 carbon atoms, an aromatic group or a multicyclic aromatic nucleus, where each of $R^1$ and $R^3$ is independently a monovalent moiety containing at least one polymerizable, crosslinkable, or a combination thereof group chosen from vinyl, allyl, acrylic or methacrylic or other polymerizable groups;

$R^2$, $Z^1$ and $Z^2$ each independently represent multivalent aliphatic or cycloaliphatic hydrocarbon groups having 1 to 20 carbon atoms or an aromatic group; and $Y^1$, $Y^2$, $Y^3$ and $Y^4$ each independently represents a triple bond, a double bond, or a single bond link; provided, that $T_g$ of the mixture is above 20° C.

These molecular glass mixtures are made via coupling reactions as described in copending application U.S. 61/919,252 filed Mar. 25, 2014 by Molaire incorporated by reference in its entirety. Preferred coupling reactions include the Heck and Suzuki reactions.

Example of mono-substituted materials incorporating vinyl or other polymerizable groups suitable for coupling reactions include:

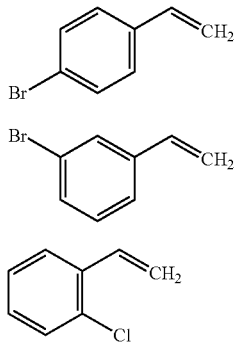

In a sixth embodiment of the invention each $R^1$ and $R^3$ is independently a monovalent aliphatic or cycloaliphatic hydrocarbon group having 1 to 20 carbon atoms, an aromatic group or a multicyclic aromatic nucleus, where at least one of $R^1$ and $R^3$ is independently a monovalent moiety containing at least one polymerizable group, crosslinkable group or combination thereof chosen from vinyl, allyl, acrylic or methacrylic or other polymerizable groups;

$R^2$, $Z^1$ and $Z^2$ each independently represent multivalent aliphatic or cycloaliphatic hydrocarbon groups having 1 to 20 carbon atoms or an aromatic group, where at least one of $R^2$, $Z^1$ and $Z^2$ contains at least one polymerizable/crosslinkable groups chosen from vinyl, allyl, acrylic or methacrylic or other polymerizable groups; and $Y^1$, $Y^2$, $Y^3$ and $Y^4$ each independently represents a triple bond, a double bond, or a single bond link; provided, that Tg of the mixture is above 20° C.

These molecular glass mixtures are made via coupling reactions as described in copending application U.S. 61/919,252 filed Mar. 25, 2014 by Molaire incorporated by reference in its entirety. Preferred coupling reactions include the Heck and Suzuki reactions.

Example of multi-substituted materials incorporating vinyl or other polymerizable groups suitable for coupling reactions include:

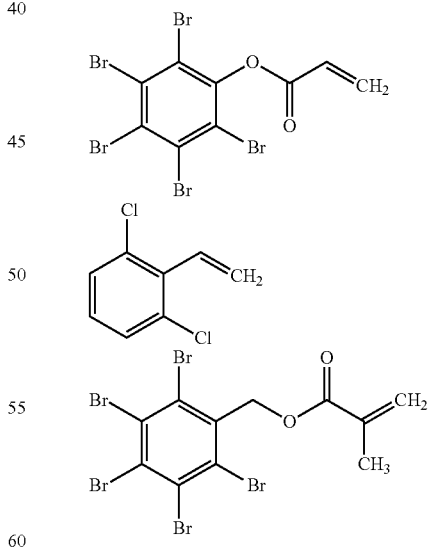

In the structural formula $(R^1Y^1)_p[(Z^1Y^2)_m R^2Y^3]Z^2Y^4R^3$, the expression "$[(Z^1Y^2)_{m_g} 2Y3]_n$" describes nonpolymeric compounds which are oligomers. Oligomers are usually formed when either $Z^1$ or $R^2$ are at least bivalent. The $(Z^1Y^2)_m$ moiety describes oligomers in which $Z^1$ repeats itself such as when $Z^1$ is derived from p-hydroxybenzoic acid. When n is one or more, p in the structural formula is preferably one to avoid significant crosslinking of the compound due to the multivalent nature of $Z^1$. However, some crosslinking can be tolerated in charge transport-mixtures of the invention.

The crosslinkable molecular glass mixtures, polymerizable molecular glass mixtures, and combinations thereof of the invention can be coated from solvent, dried before being subjected to radiation to initiate the crosslinking, polymerization or combination thereof. E-beam or ultraviolet (UV) radiation can be used. For UV radiation a photoinitatior is required. Any free-radical generating photoinitiator system can be used which initiates polymerization of the polymerizable, crosslinkable, or combination thereof molecular glassmixture and does not subsequently terminate the polymerization. The free-radical generating photoinitiator system can comprise one or more compounds which directly furnish free radicals when activated by radiation. It can also comprise a plurality of compounds, one of which yields free radicals after having been caused to do so by a sensitizer which is activated by the radiation.

Representative useful examples of such photoinitiators include, for example, those described in British Pat. No. 1,507,704, hereby incorporated by reference in its entirety including benzophenone, acetophenone, ethyl methyl ketone, cyclopentanone, benzil, caprone, benzoyl cyclobutanone, and dioctyl acetone, particularly when used in admixture with substituted benzophenones such as Michler's ketone.

Other photoinitiator is a mixture of a 3-ketocoumarin and an amine such as is described in U.S. Pat. No. 4,289,844 by Farid et al entitled "Photopolymerizable Compositions Featuring Novel Co-initiators" which is hereby incorporated by reference in its entirety. Representative amines include ethyl-p-dimethylaminobenzoate; other esters of p-dimethylaminobenzoic acid, e.g., n-butyl-p-dimethylaminobenzoate, phenethyl-p-dimethylaminobenzoate, 2-phthalimidoethyl-p-dimethylaminobenzoate, 2-methacryloylethyl-p-dimethylaminobenzoate, 1,5-pentyl di-(p-dimethylamino)benzoate; 4,4'-bis(dimethylamino)benzophenone; phenethyl and 1,5-pentyl esters of m-dimethylaminobenzoic acid; p-dimethylaminobenzaldehyde; 2-chloro-4-dimethylaminobenzaldehyde; p-dimethylaminoacetophenone; p-dimethylaminobenzyl alcohol; ethyl-(p-dimethylamino) benzoyl acetate; p-N-piperidinoacetophenone; 4-dimethylamino benzoin; N,N-dimethyl-p-toluidine; N,N-diethyl-m-phenetidine; tribenzyl amine; dibenzylphenyl amine; N-methyl-N-phenylbenzylamine; p-bromo-N,N-dimethylaniline; tridodecylamine; 4,4',4''-methylidyne(N,N-dimethylaniline) (crystal violet, leuco base); 3-indoleacetic acid; and N-phenylglycine.

The coumarin associated with the amine can be one or more of, e.g., the following: 3-(2-benzofuroyl)-7-diethylaminocoumarin; 3-(2-benzofuroyl)-7-(1-pyrrolidinyl)coumarin; 7-dimethylamino-3-thenoylcoumarin; 3-benzoyl-7-diethylaminocoumarin; 3-(o-methoxybenzoyl)-diethylaminocoumarin; 3-(m-fluorosulfonyl)benzoyl-diethylaminocoumarin; 3-(p-dimethylaminobenzoyl)-diethylaminocoumarin; 3,3'-carbonylbis(5,7-di-n-propoxy coumarin); 3,3'-carbonylbis(7-diethylamino coumarin); 3-benzoyl-7-methoxycoumarin; 3-(2-furoyl)-7-diethylaminocoumarin; 3-(p-dimethylaminobenzoyl)-7-diethylaminocoumarin; 3-(p-diethylaminostyrylcarbonyl)-diethylaminocoumarin; 3-(p-morpholinostyrylcarbonyl)-diethylaminocoumarin; 9-(7-diethylamino-3-coumarinoyl)-1,2,4,5-tetrahydro-3H, 6H,10H[1]benzopyrano[9,9a,1-gh]quinolazine-10-one which has the structure ##STR5##-9-(7-n-propylamino-3-coumarinoyl)-2,4,5-tetrahydro 3H,6H,10H[1]benzopyrano[9,9a,1-gh]quinolazine-10-one.

The photoinitiator composition can be present in an amount from 0.05 to about 10 weight percent, and preferably from 0.10 to 5 weight percent.

Alternately thermal free radical initiators can be used. Examples of thermal initiators include 2,2'-Azobis(2-methylpropionitrile, 1,1'-Azobis(cyclohexanecarbonitrile, N-Bromosuccinimide, 2,2'-Azobis(2-methylpropionitrile), 1,1'-Azobis(cyclohexanecarbonitrile), 4,4'-Azobis(4-cyanovaleric acid), organic peroxides.

The free radical generator should not interfere with the function of the coating. For example any material that can constitute a trap for charge transport should be avoided. Any material that can interfere with photoluminescence of the coating should be avoided. Any material than can interfere with the longevity of a device should be avoided In a seventh embodiment of the invention a method of making a full-color organic light-emitting display having an array of light-emitting pixels arranged in intersecting columns and rows with each column having a set of three subpixel columns designated for emitting one of red, green, and blue light respectively, the method comprising the steps of:

a) providing a substrate;
b) providing a first set of addressing electrodes over the substrate;
c) forming an organic hole-transporting layer over the first set of addressing electrodes and over the substrate;
d) forming a crosslinkable organic light-emitting layer, a polymerizable organic light-emitting layer or a combination thereof, having a glass transition temperature $T_g$ below 80° C. over the hole-transporting layer;
e) forming a dopant layer over the light-emitting layer and patterning such dopant layer to form color subpixels which comprise a pixel wherein the colored subpixels are formed by diffusing the patterned dopant layer into the light-emitting layer by thermal annealing at a temperature below 80° C.;
f) after all the subpixels are formed, subjecting the light-emitting layer to actinic energy to crosslink the layer, polymerize the layer or a combination thereof and increase the thermal properties of the light-emitting layer;
g) forming an organic electron-transporting layer over the doped light-emitting layer; and
h) forming a second set of addressing electrodes over the electron-transporting layer so that the color subpixels can be individually addressed.

Figure 2:
FIG. 2 shows an undoped low-$T_g$ crystallizable/polymerizable organic layer coated over the charge transport layer.
Figure 3:
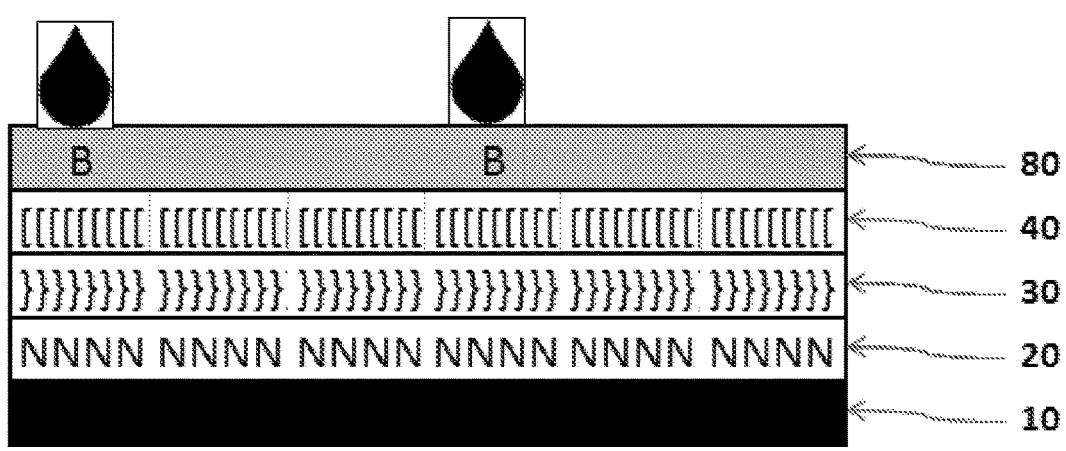
FIG. 3 shows a printed blue dopant on the surface of an undoped low-$T_g$ crystallizable/polymerizable organic layer.
Figure 4:
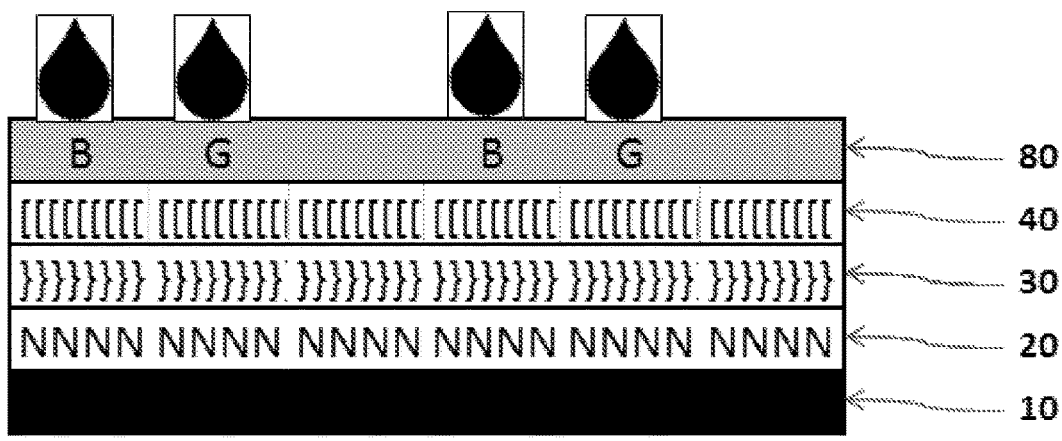
FIG. 4 shows printed blue and green dopants on the surface of an undoped low-$T_g$ crystallizable/polymerizable organic layer.
Figure 5:
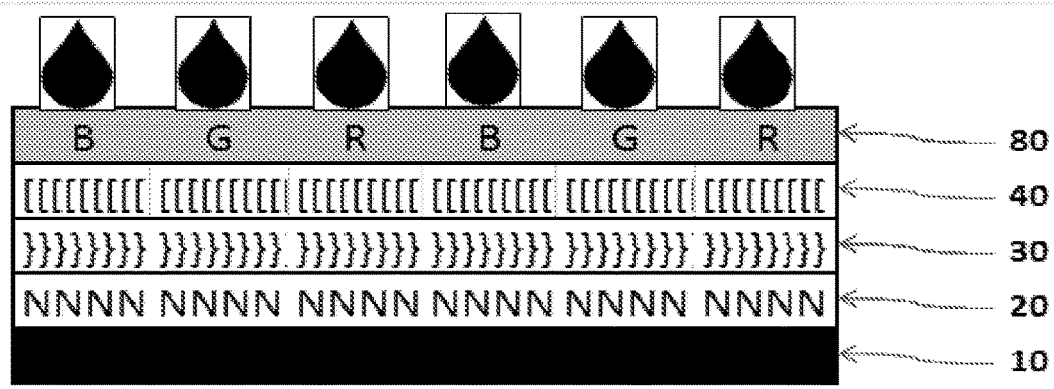
FIG. 5 shows printed blue, green and red dopants on the surface of an undoped low-$T_g$ crystallizable/polymerizable organic layer.
Figure 6:
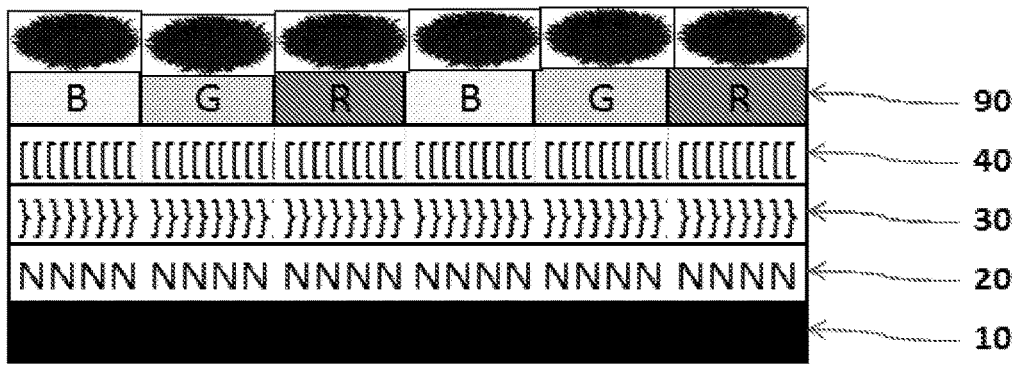
FIG. 6 shows dried blue, green, and red dopants on the surface of an undoped low-$T_g$ crystallizable/polymerizable organic layer.
Figure 7:
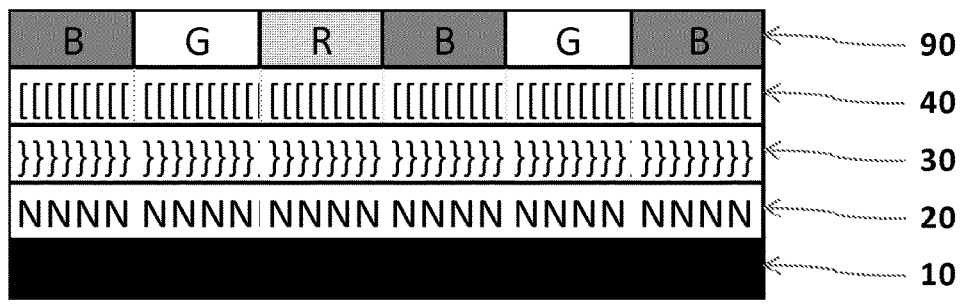
FIG. 7 shows thermally diffused blue, green, and red dopants in blue, green and red subpixels respectively into an undoped low-$T_g$ crystallizable/polymerizable organic layer.
Figure 8:
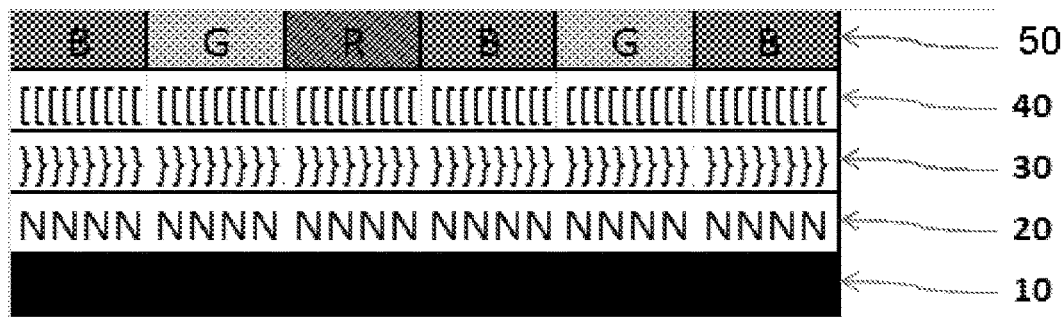
FIG. 8 shows a crosslinked doped organic layer with blue, green, and red subpixels.
Figure 9:
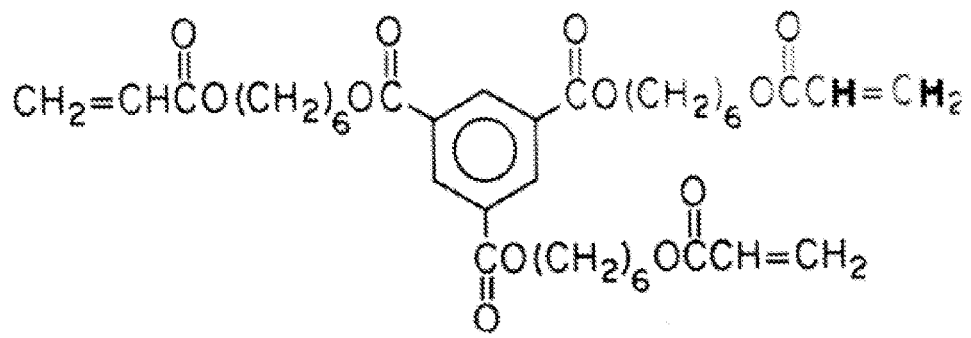
FIG. 9 shows a low-$T_g$ crosslinkable plasticizer Tri(6-Acryloyloxyhexyl)1,3,5-Benzenetricarboxylate (TMAC6)

The sectional structure of a finished example of the light emitting display described above is represented in FIG. 1. The coated undoped low-$T_g$ organic layer over the charge transport layer of step d is shown in FIG. 2. The printed blue dopant on the surface of the undoped low-$T_g$ organic layer of step e is presented in FIG. 3. The printed blue and green dopants on the surface of the undoped low-$T_g$ organic layer of step e is shown in FIG. 4, The printed blue, green, and red dopants on the surface of the undoped low-$T_g$ organic layer of step e is shown in FIG. 5, The dried blue, green, and red dopants on the surface of the undoped low-$T_g$ organic layer of step e is represented in FIG. 6. The thermally diffused blue, green, and red dopants in the blue, green, and red subpixels respectively into the undoped low-Tg organic layer of step f is shown in FIG. 7. The blue, green, and red doped organic layer of step f is shown in FIG. 8. An example of a crosslinkable plasticiser is shown in FIG. 9.

The diffusion of small molecule in an amorphous film depends on the existence of free spaces in the film that are comparable in size to the molecule (T. Graves-Abe et al, mat. Res. Soc. Symp. Proc. Vol. 725, 2002, Materials Research Society). Diffusion rapidly increases as the temperature climbs above $T_g$. Above the glass transition temperature, the dye diffusion coefficient D can be described by a modified form of the William, Landel and Ferry equation (WLF equation):

$$\text{Log}D = \frac{C1(T-Tg)}{C2+(T-Tg)} + \log Dg \qquad (1)$$

where $C_1$ is a constant, $C_2$ a constant generally set equal to 51.6K, T is the diffusion temperature, $T_g$ is the glass transition temperature, and $D_g$ the diffusion coefficient at $T_g$ Equation (1) clearly suggest diffusion can be raised by either increasing the temperature T or decreasing $T_g$. Increased temperature is detrimental to the device. Decreasing the $T_g$ of the emitting layer for example below 80° C. affects the temperature stability of the device.

The present invention provides crosslinkable, polymerizable or combination thereof emitting layer with $T_g$ below 80° C. The $T_g$ of the crosslinkable, polymerizable, or combination thereof emitter layers of this invention is preferably below 40° c. The diffusion of the dopants into the emitter layer can be effected in reasonable time at annealing temperature below 80° c., preferably below 60° c. Once all the dopants are fully diffused, the emitter layer is subjected to actinic radiation to crosslink, polymerize, or a combination thereof the layer and improve its thermal properties.

The $T_g$ of the emitter layer can be controlled by providing a preformed low-$T_g$ crosslinkable, polymerizable, or combination thereof charge transporting molecular glass mixture of the current invention. Preferably a high-$T_g$ crosslinkable, polymerizable, or combination thereof glass mixture of the present invention is plasticized with a compatible low-$T_g$ crosslinkable additive. The lower the $T_g$ of the compatible crosslinkable, polymerizable, or some combination thereof additive, the lower its required concentration, the higher the thermal properties of the final emitter.

The Kwei equation (Anshyang A. Lin, T. K. Kwei, Arnost Reiser *Macromolecules,* 1989, 22 (10), pp 4112-4119) can be used to design low-$T_g$ crosslinkable, polymerizable, or combination thereof mixture of the invention (assuming compatibility):

$$\frac{1}{T_g} = \frac{wt_1}{T_{g1}} + \frac{wt_2}{T_{g2}} + \frac{wt_3}{T_{g3}} \qquad (2)$$

wherein $T_g$ is the glass transition temperature of the mixture, $T_{g1}$ is the Tg of component 1, $T_g2$ is the $T_g$ of component 2, $T_{g3}$ is the $T_g$ of component 3, $T_{gn}$ is the $T_g$ of component n, $wt_1$ is the wt fraction of component 1 $wt_2$ is the wt fraction of component 2, $wt_3$ is the wt fraction of component 3, $wt_1$ is the wt fraction of component 1, $wt_n$ is the wt fraction of component n.

Examples of low-$T_g$ crosslinkable plasticizers include 1,6-Hexanediol diacrylate, Ethylene glycol diacrylate, 1,4-Butanediol diacrylate, Tetra(ethylene glycol) diacrylate, Tri (ethyleneglycol) diacrylate, 1,6-Hexanediol ethoxylate diacrylate, Divinylbenzene, the cyclohexyleneoxyalkyl acrylates of U.S. Pat. Nos. 4,902,605, 4,767,883 of Molaire et al.

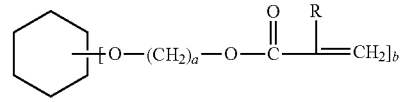

wherein
R is H or $CH_3$,
A is an integer of from 1 to 10 and
B is 1 or 2.
including:
cyclohexyleneoxymethyl acrylate, cyclohexyleneoxymethyl methacrylate, cyclohexyleneoxyethyl acrylate, cyclohexyleneoxyethyl methacrylate, cyclohexyleneoxypropyl acrylate, cyclohexyleneoxypropyl methacrylate, cyclohexyleneoxybutyl acrylate, cyclohexyleneoxybutyl methacrylate, cyclohexyleneoxypentyl acrylate, cyclohexyleneoxypentyl methacrylate, cyclohexyleneoxyhexyl acrylate, cyclohexyleneoxyhexyl methacrylate, 1,4-cyclohexylenebis (oxymethyl) diacrylate, 1,4-cyclohexylenebis(oxymethyl) dimethacrylate, 1,4-cyclohexylenebis(oxyethyl) diacrylate,* 1,4-cyclohexylenebis(oxyethyl) dimethacrylate, 1,4-cyclohexylenebis(oxypropyl) diacrylate, 1,4-cyclohexylenebis (oxypropyl) dimethacrylate, 1,4-cyclohexylenebis(oxybutyl) diacrylate, 1,4-cyclohexylenebis(oxybutyl) dimethacrylate, 1,4-cyclohexylenebis(oxypentyl) diacrylate, 1,4-cyclohexylenebis(oxypentyl) dimethacrylate, 1,4-cyclohexylenebis(oxyhexyl) diacrylate; the monomers of U.S. Pat. No. 4,619,890 of Scozzafava & Molaire

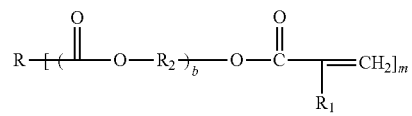

wherein
R represents a cycloaliphatic or an aromatic group;
$R_1$ represents hydrogen or alkyl;
$R_2$ represents alkylene of 1 to 20 carbon atoms, or $-CH_2CH_2(OCH_2CH_2)_n$;
P is 0 or 1; and
N is 1 to 20;
M is 1 to 6.
Representative examples of such monomers are presented below.
Including

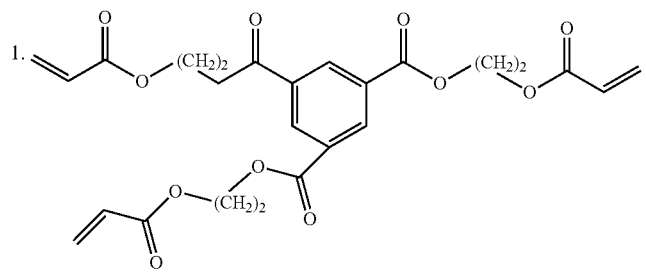

-continued
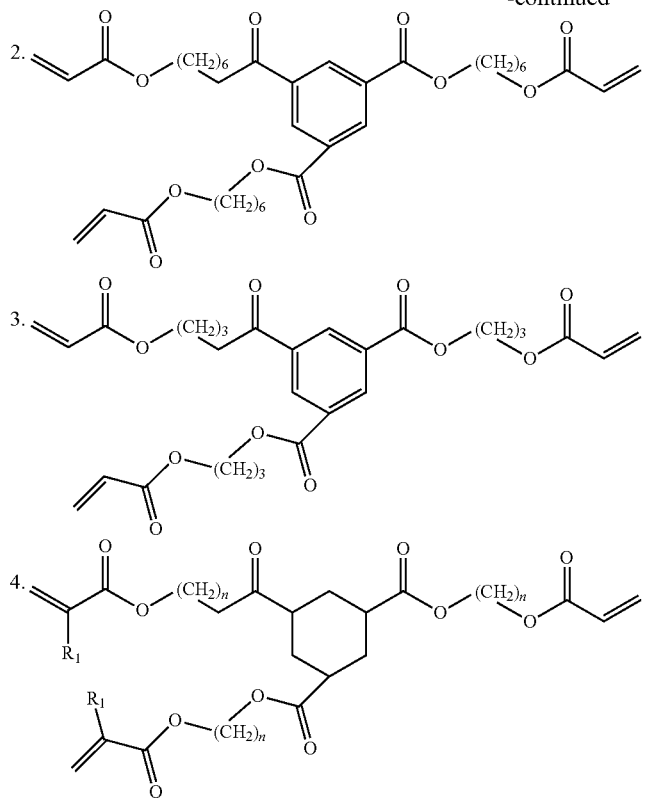
R¹ = H, CH₃;
n = 1 to 6
R¹ = H, CH₃;
n = 1 to 6
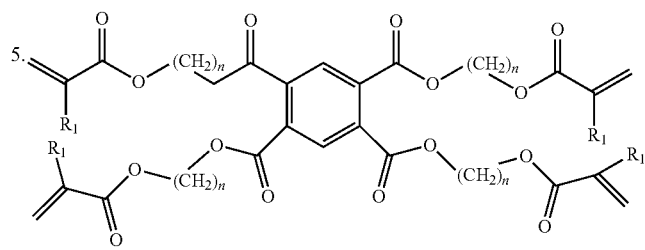
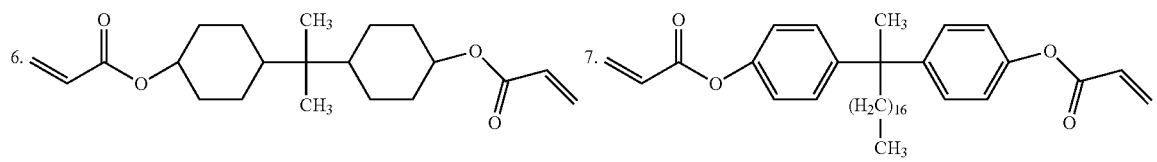
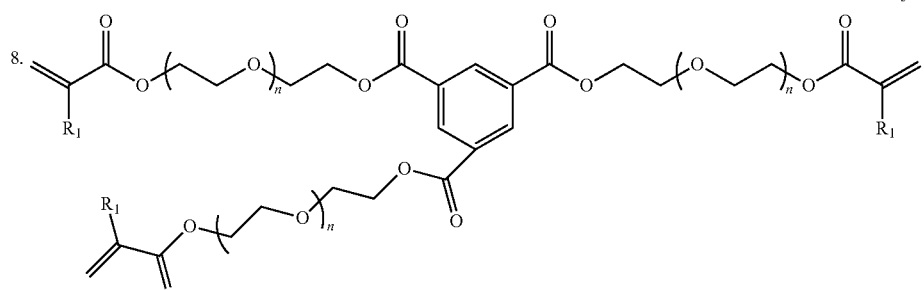
R¹ = H, CH₃;
n = 1 to 10

In another embodiment, the low-$T_g$ crosslinkable, polymerizable, or combination thereof emitter layer is composed of non-crosslinkable small molecule host materials mixed with a crosslinkable, polymerizable, or combination of both crosslinkable and polymerizable molecular glass mixture of this invention, with or without low-$T_g$ additives. Examples for small molecules host materials include: Tris-(8-hydroxyquinoline)aluminum (Alq3), 4,4'-Bis(N-carbazolyl)-1,1'-biphenyl, Tris(4-carbazoyl-9-ylphenyl)amine, 1,3-Bis(N-carbazolyl)benzene, 1,3-Bis(triphenylsilyl)benzene, 1,3,5-Tris(N-carbazolyl)benzene, 2,2',7,7'-Tetrakis(N,N-diphenylamino)-9,9-spirobifluorene, 3,3",6,6"-Tetrakis(1,1-dimethylethyl)-9-ethyl-9,3':6,9"-ter-9H-carbazole, 3,6-Bis(3-ethyl-N-carbazolyl)-N-phenylcarbazole, 3,6-Bis(N-carbazolyl)-N-ethylcarbazole, 3,6-Bis(N-carbazolyl)-N-phenylcarbazole, 4,4'-Bis(3-ethyl-N-carbazolyl)-1,1'-biphenyl, 9,10-Bis(2-naphthyl)anthraces, 9,9'-[1,1'-Biphenyl]-4,4'-diylbis[3,6-bis(1,1-dimethyl ethyl)]-9H-carbazole, 9,9-(9,9-Dihexyl-9H-fluorene-2,7-diyl)bis(3,6-di-tert-butylcarbazole), 2-tert-Butyl-9,10-di(naphth-2-yl)anthracene, 2,7-Bis(carbazol-9-yl)-9,9-spirobifluorene, 2,7-Bis(N-carbazolyl)-9,9-spirofluorene, 9,9'-(9,9'-Spirobi[9H-fluorene]-2,7-diyl)bis-9H-carbazole, Spiro-2CBP, 2,8-Bis(diphenylphosphoryl)dibenzo[b,d]thiophene.

In yet another embodiment, the low-$T_g$ crosslinkable, polymerizable, or combination thereof emitter is a mixture of a polymeric host material and a crosslinkable molecular glass mixture of this invention, a polymerizable molecular glass mixture of this invention, or a combination thereof, with or without a low-$T_g$ crosslinkable additive, a low-$T_g$ polymerizable additive or a combination thereof. Examples of polymeric hosts include: Poly(N-ethyl-2-vinylcarbazole), Poly(1-vinylnaphthalene), Poly(2-vinylnaphthalene), Poly(2-vinylcarbazole), Poly(9-vinylcarbazole), Poly[(9,9-di-n-octylfluorenyl-2,7-diyl)-alt-(benzo[2,1,3]thiadiazol-4,8-diyl), and Poly[2-methoxy-5-(2-ethylhexyloxy)-1,4-phenylenevinylene].

A sensitizer is added to the low-$T_g$ emitter. The sensitizer is a free radical or cationic sensitizer well known in the art and already described above.

The dopant is a fluorescent dopant, a phosphorescent dopant or a thermally activated delayed fluorescent (TADF) dopant. Examples of fluorescent dopants include but are not limited to: coumarin 6, coumarin 47, Benzo[k]fluoranthene for fluorescence, 1,2-Bis(2-Aminophenoxy)ethane-N,N,N',N'-tetraacetic acid, 2-tert-Butylanthraquinone, 3,8-Diamino-6-phenylphenanthridine, 2,6-Diethylnaphthalene, 9,10-Diphenylanthracene, 6,13-Diphenylpentacene, Pyrene, Rubrene, p-Terphenyl, Alq8.4-(Dicyanomethylene)-2-tert-butyl-6-(1,1,7,7-tetramethyljulolidin-4-yl-vinyl)-4H-pyran, Di-pt-chlorotetrakis[2-(1-isoquinolinyl-N)phenyl-C]diiridium(III), and other fluorescent emitter materials.

Examples of phosphorescent dopants include but are not limited to: (2,4-Pentanedionato)bis[2-(2-quinolinyl)phenyl]iridium(III), Bis[5-methyl-2-(2-pyridinyl-N)phenyl-C](2,4-pentanedionato-O2,O4)iridium(III), Bis[2-(2-benzothiazolyl-N3)phenolato-O]zinc, Bis[2-(4,6-difluorophenyl)pyridinato-C2,N](picolinato)iridium(III), Bis[2-(1-isoquinolinyl-N)phenyl-C](2,4-pentanedionato-O2,O4)iridium(III), Tris[2-(benzo[b]thiophen-2-yl)pyridinato-C3,N]iridium(III), Bis[2-(1-isoquinolinyl-N)phenyl-C](2,4-pentanedionato-O2,O4)iridium(III), Bis[2-(2-pyridinyl-N)phenyl-C](2,4-pentanedionato-O2,O4)iridium(III), Dichlorotris(1,10-phenanthroline)ruthenium(II) hydrate, Bis(2-benzo[b]thiophen-2-ylpyridine)(acetylacetonate)iridium (III), Lithium tetra(2-methyl-8-hydroxyquinolinato)boron, ris(2,2'-bipyridyl)dichlororuthenium(II) hexahydrate, and other emitting materials capable of phosphorescence.

Examples of TADF dopants include but are not limited to: 2,5-bis(carbazol-9-yl)-1,4-dicyanobenzene (CzTPN described in *Mater. Horiz.*, 2014, 1,264-269; the Organic Luminescent Compound With Delayed Fluorescence of US application 20140145149 to Lin; Chun et al; the delayed fluorescence material of US application 20140138669 to Nakagawa, and Tetsuya (Fukuoka, JP) Adachi, Chihaya (Fukuoka, JP) the benzothiophene or benzofuran fused to a carbazoles delayed fluorescent material of US application 20140145151 to Xia; Chuanjun; (Lawrenceville, N.J.); Lin; Chun and other emitting materials capable of delayed fluorescence.

In some cases the emitter layer is bipolar. In such a case the electron-conductive layer may be omitted. For lighting application where the emitter is bipolar, both the electron and the hole-conductive layers may be eliminated.

The dopants deposited on the surface of the low-$T_g$ crosslinkable, polymerizable, or combination thereof emitter layer by several techniques, including inkjet, silk screen printing. Ink solvents are chosen to avoid compromising the integrity of the emitter layer. Examples of solvents include water, alcohols and hydrocarbons.

EXAMPLES

The following examples illustrate the preparation of the mixtures of the invention. Glass transition temperatures are determined by differential scanning calorimetric analysis at a heating rate of 10° C. per minute or 20° C. per minute as specified. Characterization of the components composition is determined by high performance liquid chromatography (HPLC) analysis. Photophysical and electrophysical properties are measured using various techniques, including but not limited to photoluminescence, fluorescence and phosphorescence spectra, cyclic voltammetry, and time of flight mobility measurements.

General Procedure

An important object of this invention is to provide a method of providing amorphous, truly non-crystallizable crosslinkable, polymerizable or combination thereof molecular glass mixtures that can be easily purified by simple and economic processes. Truly amorphous materials by definition cannot be recrystallized. Thus because of that it is very difficult, or perhaps potentially costly to purify amorphous molecular glass mixtures containing high level of impurities and other compositions.

Accordingly, this invention only uses reactions that
 i. are quantitative, i.e above 99% completion;
 ii. with either no byproducts;
 iii. or with byproducts that can be easily solubilized in water and extracted efficiently.

Furthermore the procedure of this invention calls for pre purification of all starting materials by either recrystallization or distillation to purity level required for poly-condensation reactions. This procedure eliminates the transport of unwanted impurities from any of the starting materials to the produced amorphous molecular glass mixtures. The reactions used by the present invention include:

Reactions of purified acid chloride with purified alcohol to produce ester glass mixtures or with purified amines to produce amide glass mixtures, where the by product is hydrochloric acid that can be either volatilized from the reaction mixture, neutralized by base to water soluble salts extractable by water and other aqueous solvents, or a combination thereof;

1. Reactions of purified isocyanates with purified alcohol to produce urethane glass mixtures, or with purified amines to produce urea glass mixtures; these reactions are quantitative and have no appreciable byproducts; and 2. Reactions of purified anhydrides and amines to produce imide glass mixtures; these reactions are quantitative with water as the byproduct.
3. Reactions of purified anhydrides and amines to produce imide glass mixtures; these reactions are quantitative with water as the byproduct.

The following are examples of reaction procedures

1. Intermediate Molecular Glass Mixtures: Reaction of pyromellitic dianhydride with a mixture of bivalent amino charge-transporting moieties containing at least one free hydroxyl group.

One equivalent of recrystallized dianhydride is mixed with a mixture of three recrystallized mono-amino charge-transporting molecules containing each two free hydroxyl groups in equal proportion (two equivalents in total):

The mixture is refluxed for four hours in picoline (bp 145 C). After cooling to room temperature and diluting with methanol, the precipitate was collected by suction filtration with methanol washing. The air-dried filter cake was dissolved in an aprotic solvent such as dichloromethane, heated to boiling, treated with 5 g of decolorizing carbon, filtered hot, and concentrated on a rotary. The solid residue was dissolved in a small amount of dichloromethane and added dropwise to a large amount of rapidly stirring methanol. The precipitate was collected by suction filtration, with methanol washing, and dried under vacuum at 50 C to yield the intermediate molecular glass with free hydroxyl groups.

The isolated material is characterized, using differential scanning calorimetry (DSC) for glass transition temperature, and liquid chromatography for composition. The "Component Equations" of Molaire are used to calculate the expecting composition based on the functionality of the multifunctional hole-transport material and the number of monovalent moiety. (*Organic Monomeric Glasses: A Novel Class of Materials*, M. F. Molaire et al, J of Polymer Science, Part A, Polymer Chemistry, Vol. 27, 2569-2592 (1989)).

The following is a listing of specific examples of cross-linkable, polymerizable, or combinations thereof molecular glass mixtures that can be prepared by the procedure above:

Intermediate Glass Mixture 1: which is molecular glass mixture intermediate containing free hydroxyl and comprising the following six components:

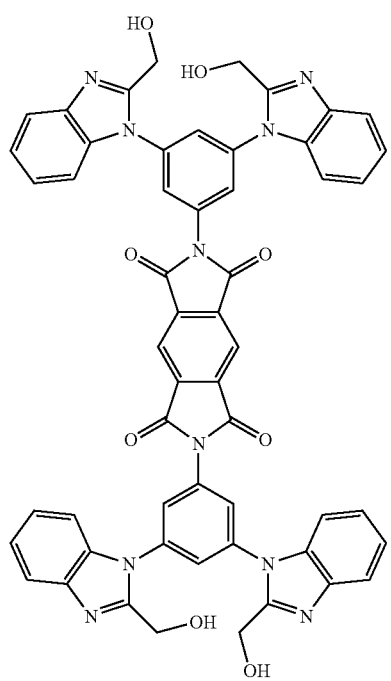

-continued

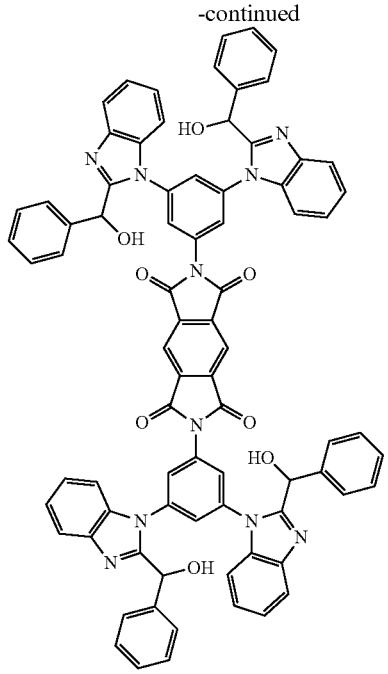

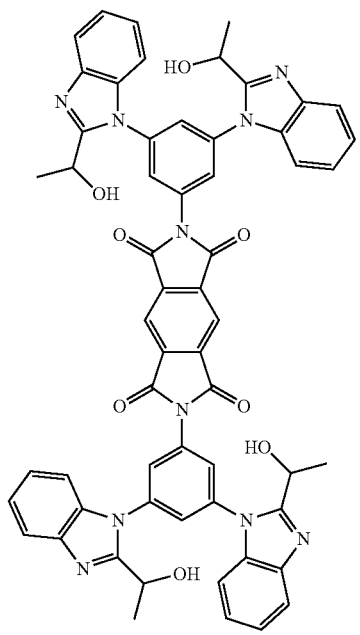

59
-continued
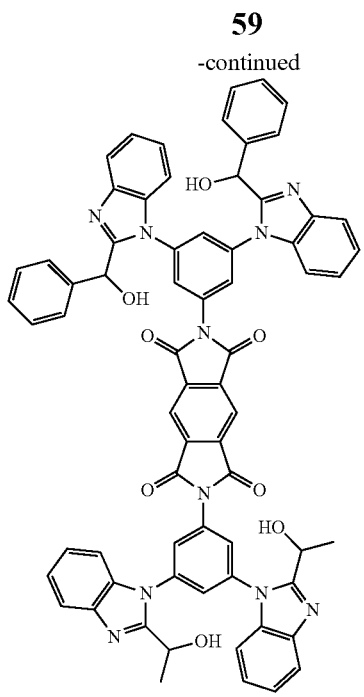
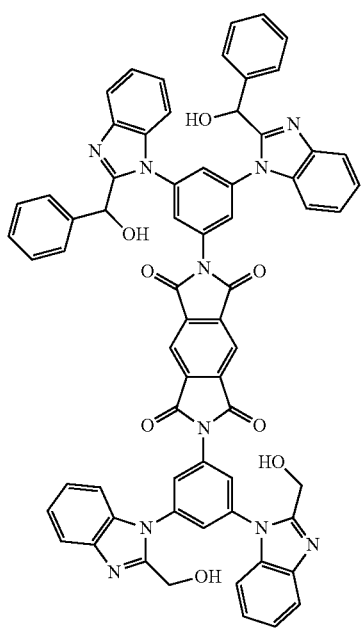
60
-continued
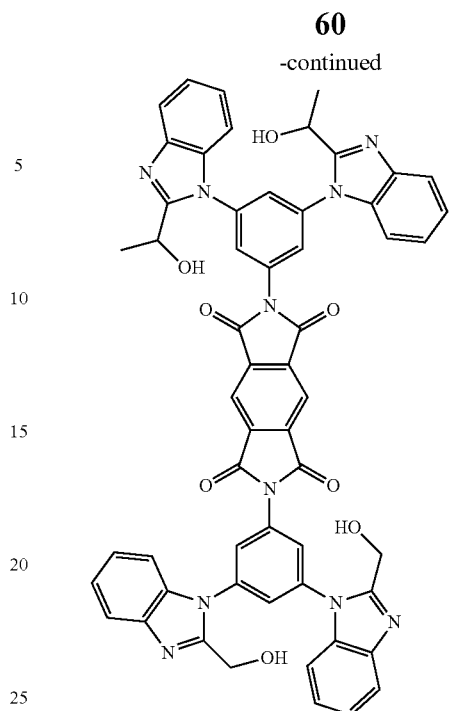
Crosslinkable, Polymerizable, or Combination Thereof Molecular Glass Mixture 1: which is a crosslinkable, polymerizable, or combination thereof molecular glass mixture comprising the following six components:
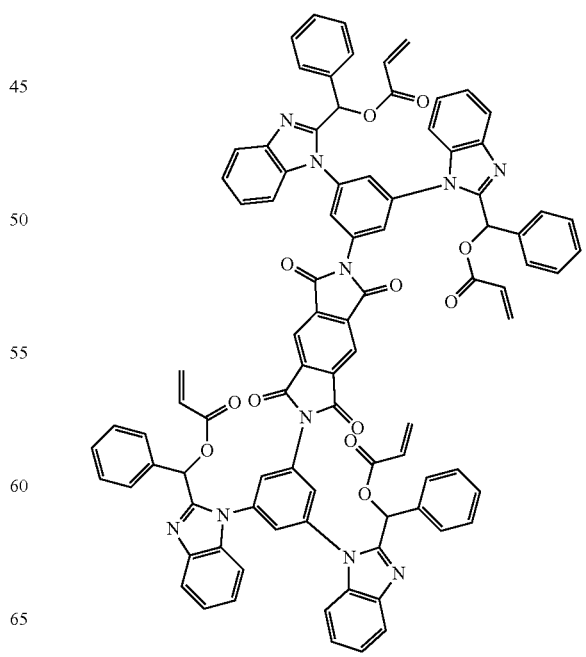

61
-continued
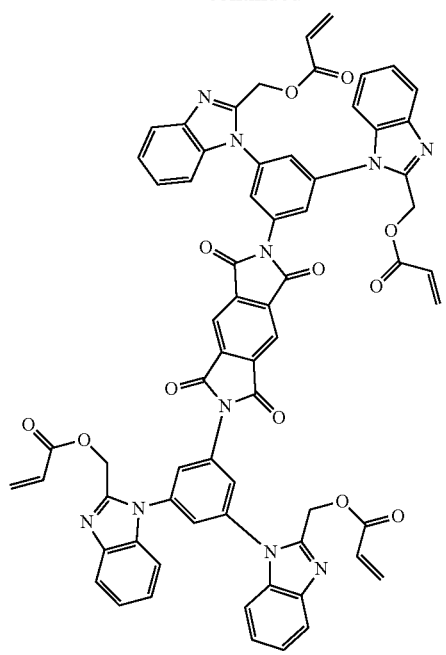
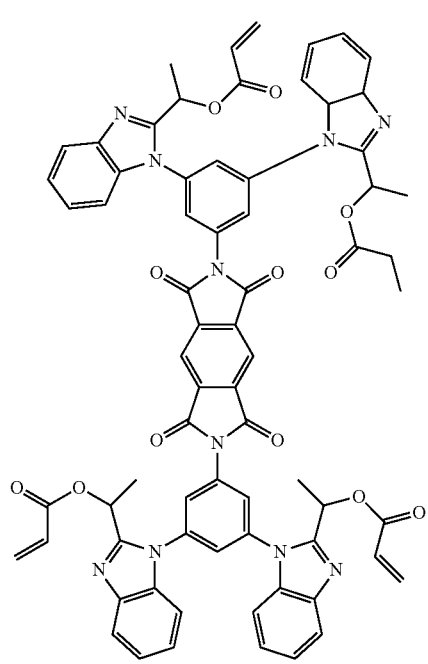
62
-continued
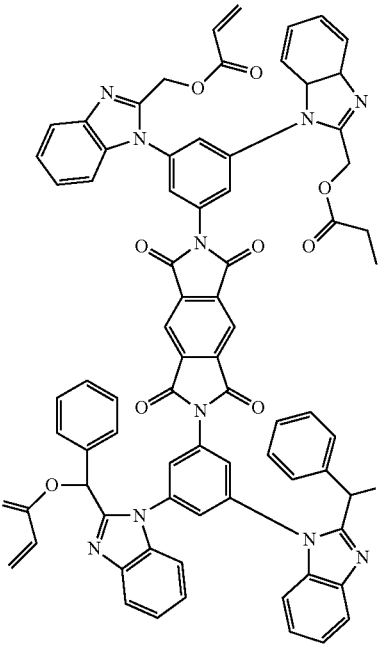
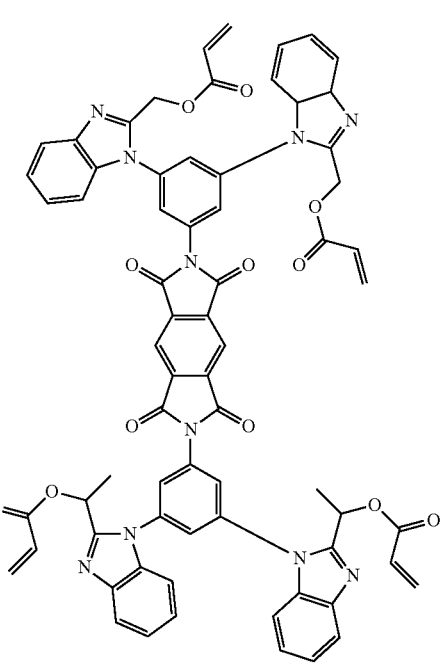

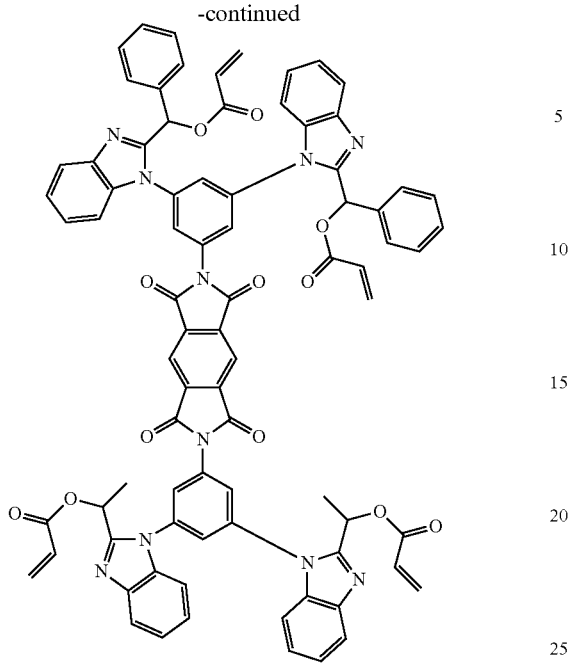

Intermediate Glass Mixture 2:

which is molecular glass mixture intermediate containing free hydroxyl and comprising the following six components:

Crosslinkable, Polymerizable or Combination Thereof Molecular Glass Mixture 2: which is a crosslinkable, polymerizable or combination thereof molecular glass mixture comprising the following six components:

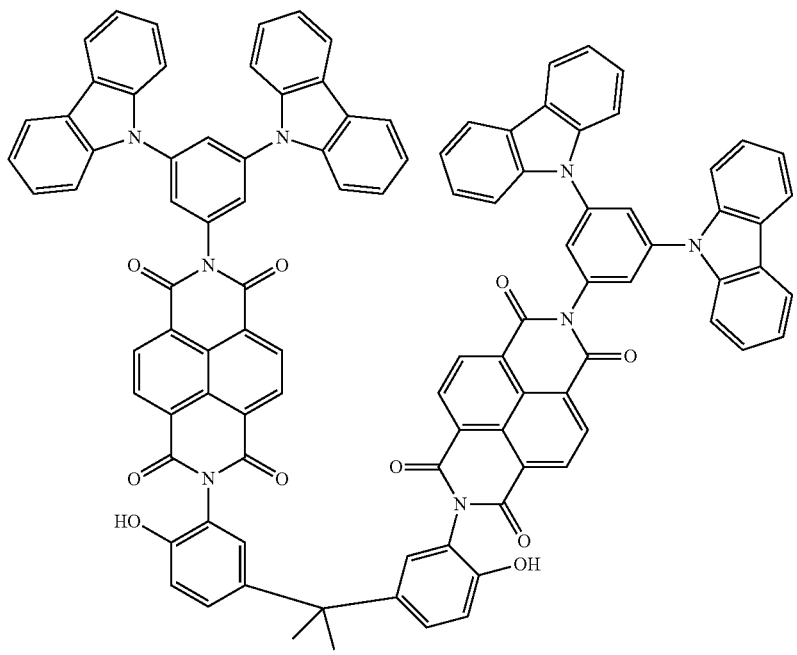

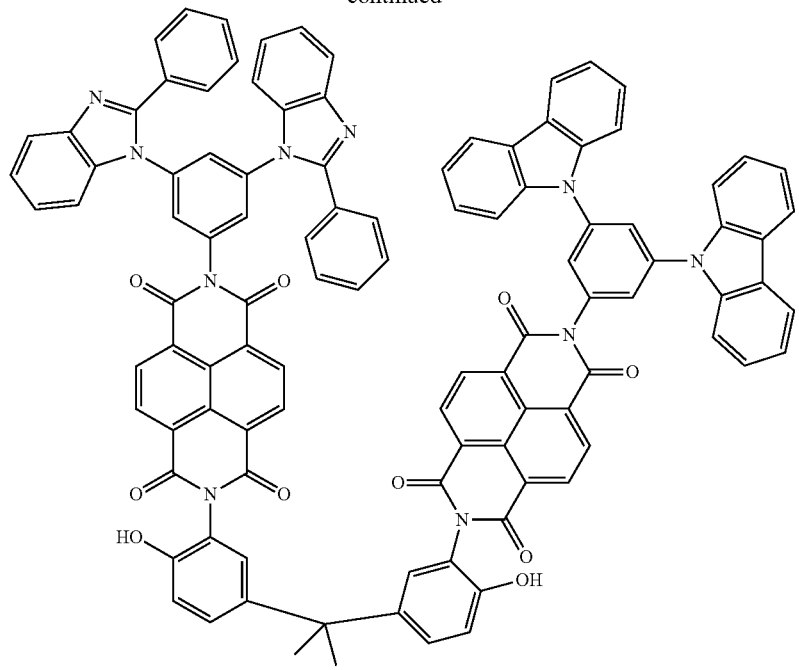
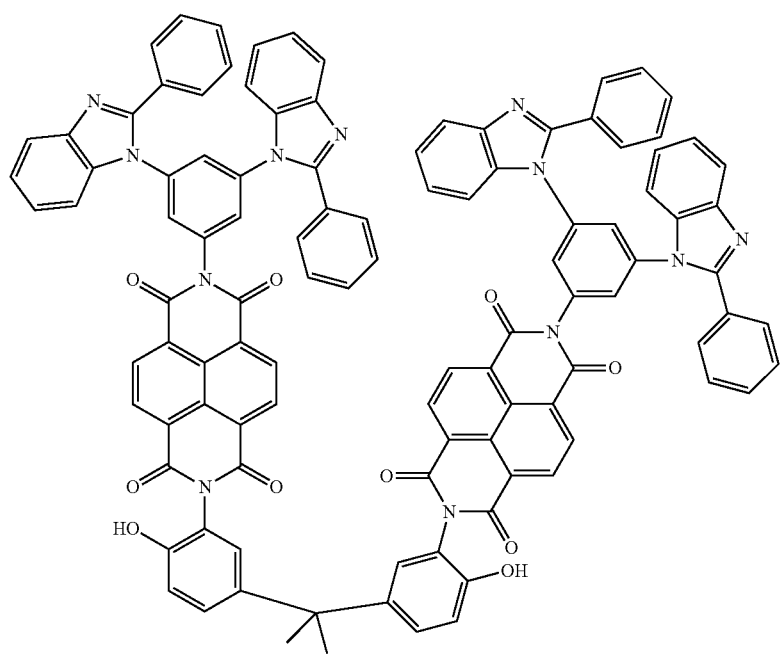

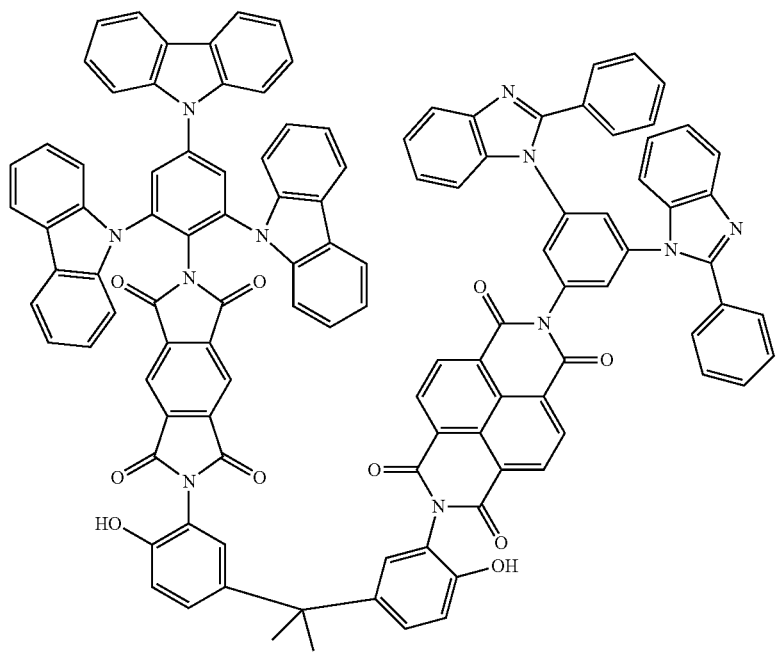
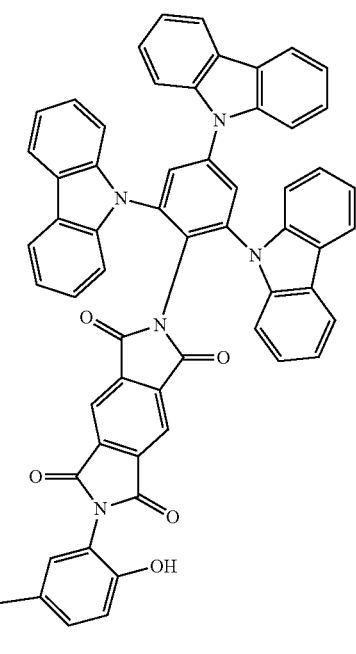

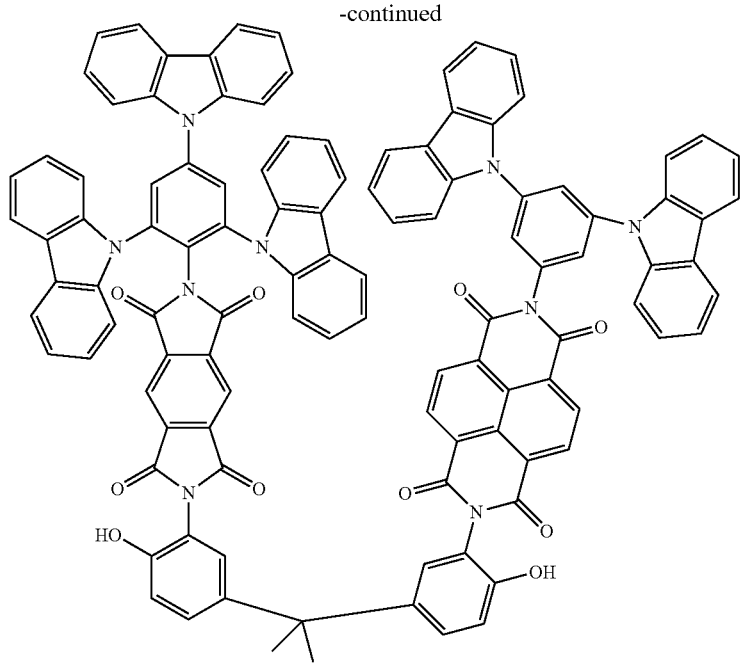
Crosslinkable, Polymerizable or Combination Thereof Molecular Glass Mixture 2: which is a crosslinkable, polymerizable or combination thereof molecular glass mixture comprising the following six components:
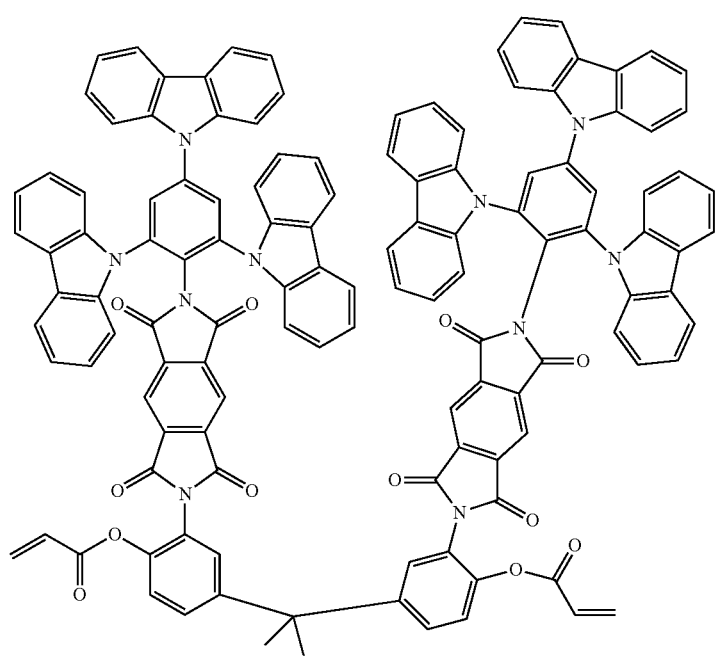

71
-continued
72
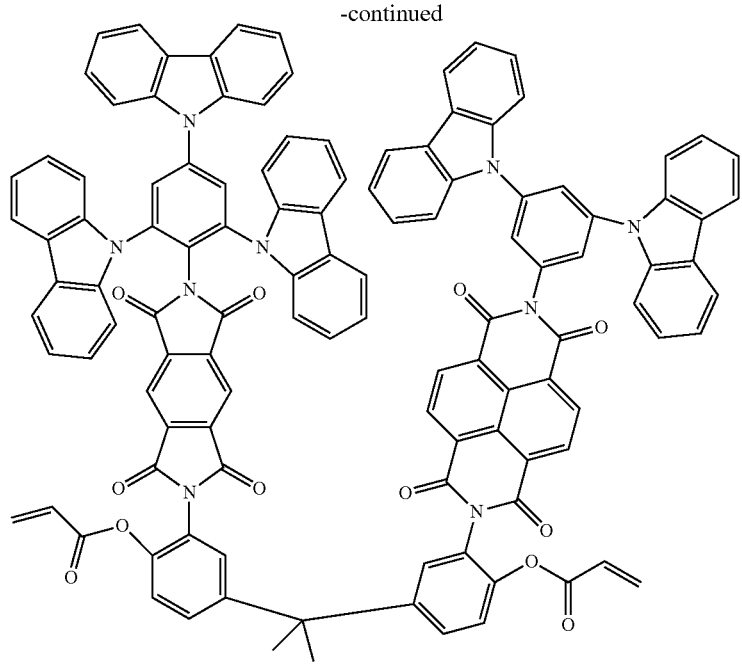
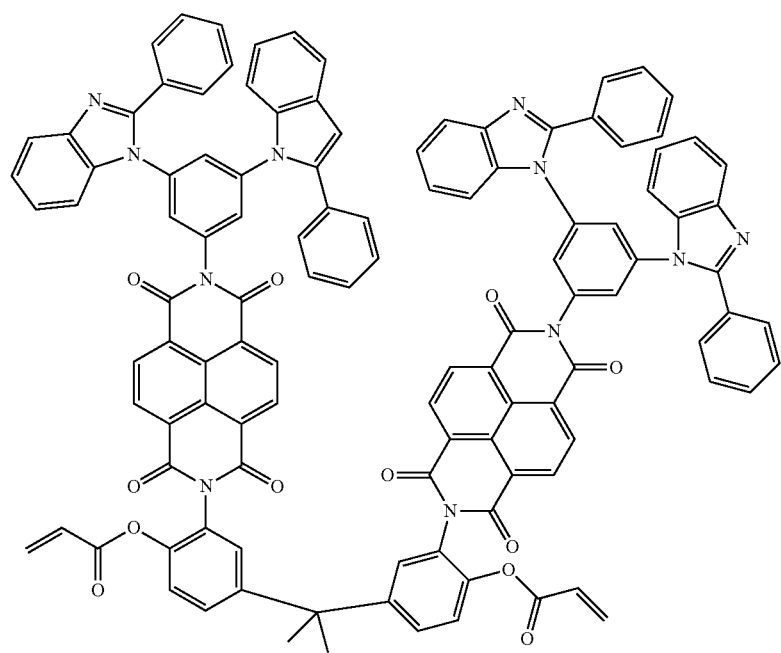

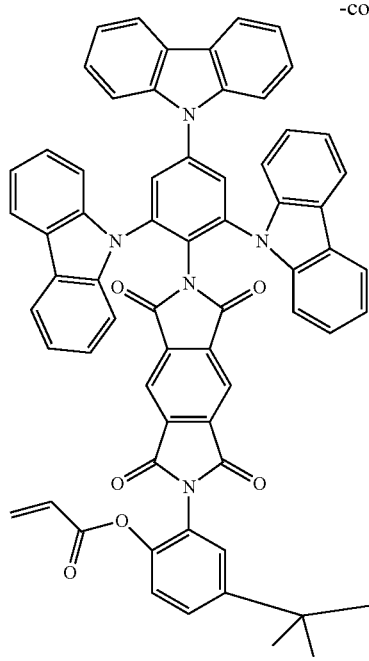
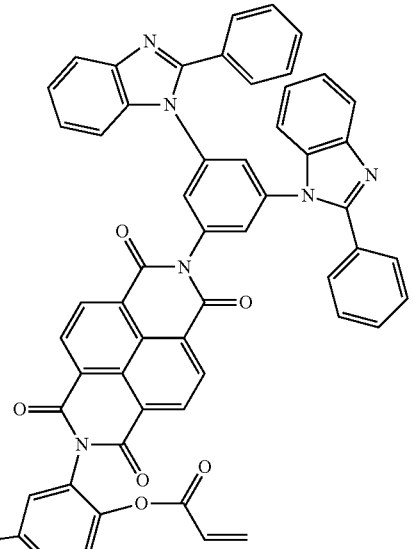
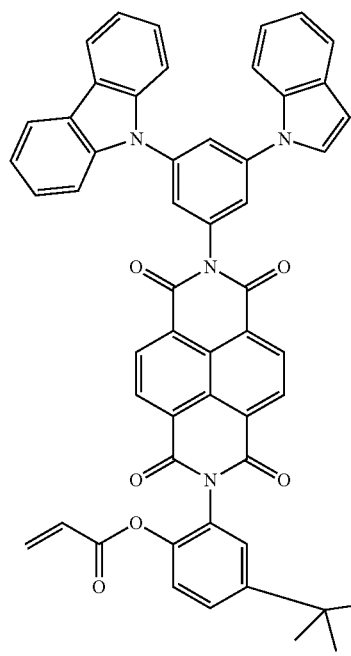
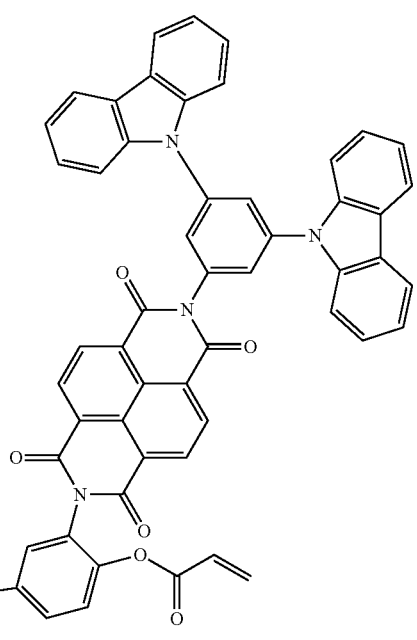

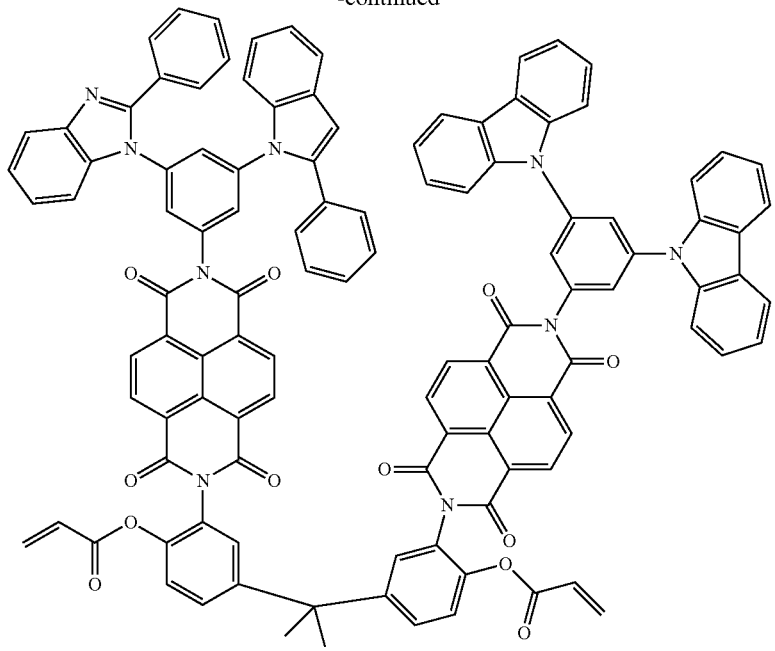
Intermediate Glass Mixture 3:
which is molecular glass mixture intermediate containing free hydroxyl and comprising the following six components
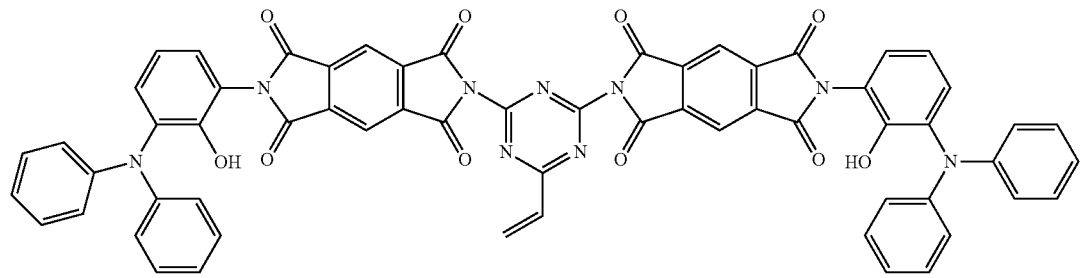
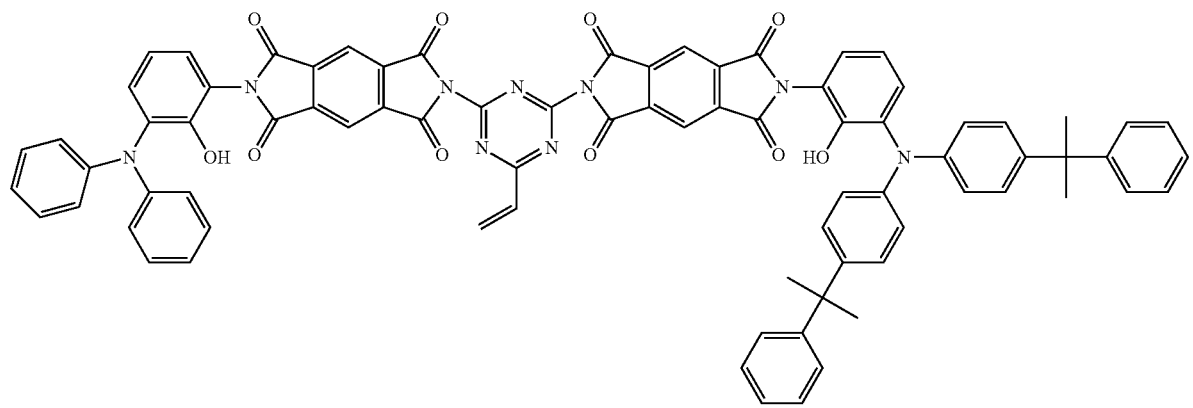

-continued
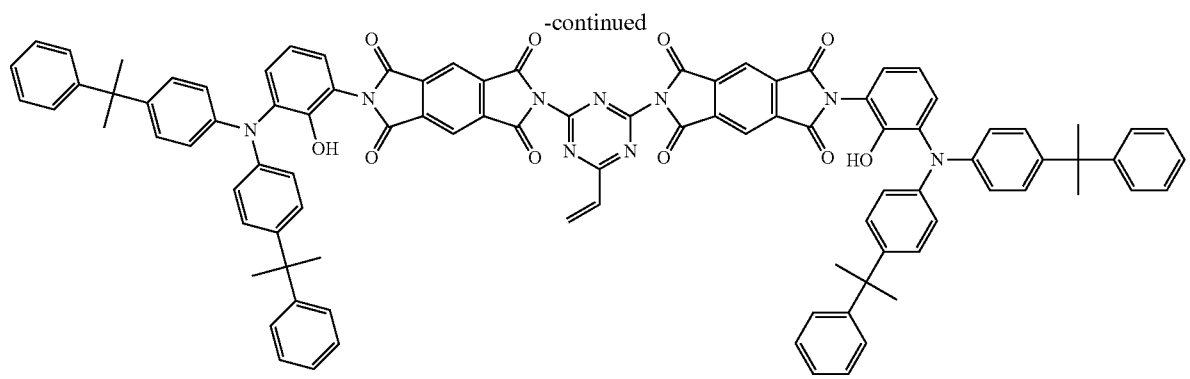
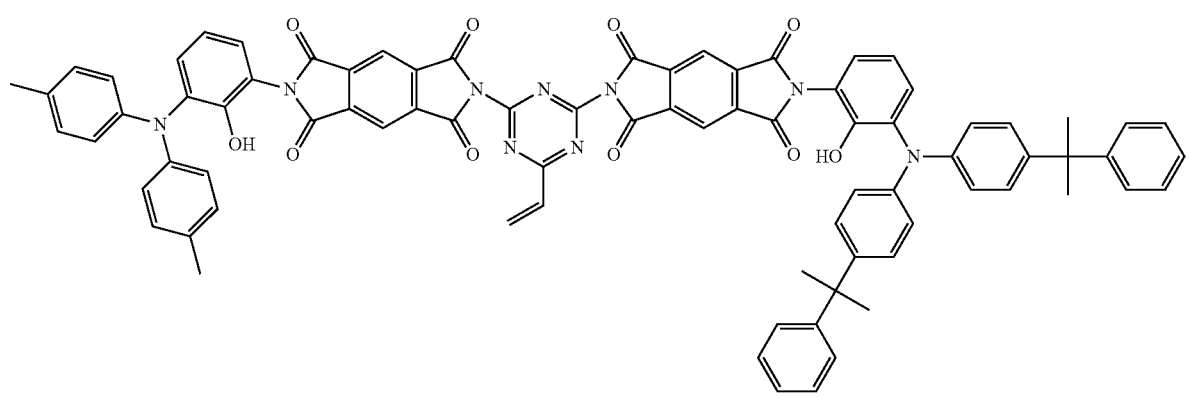
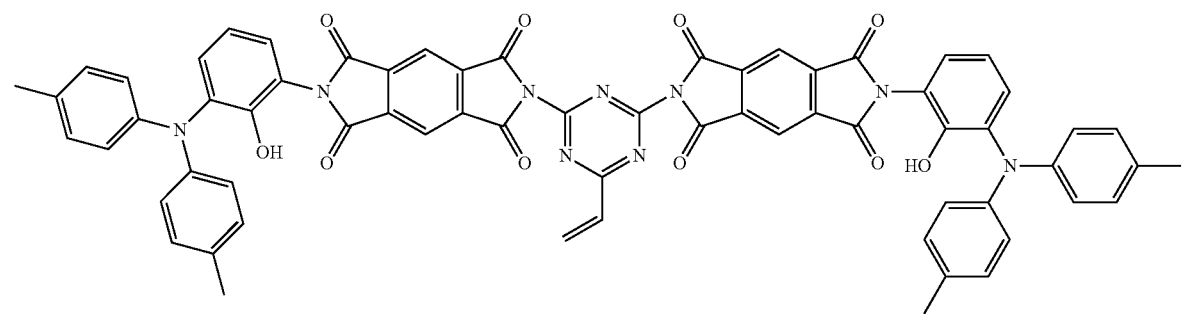
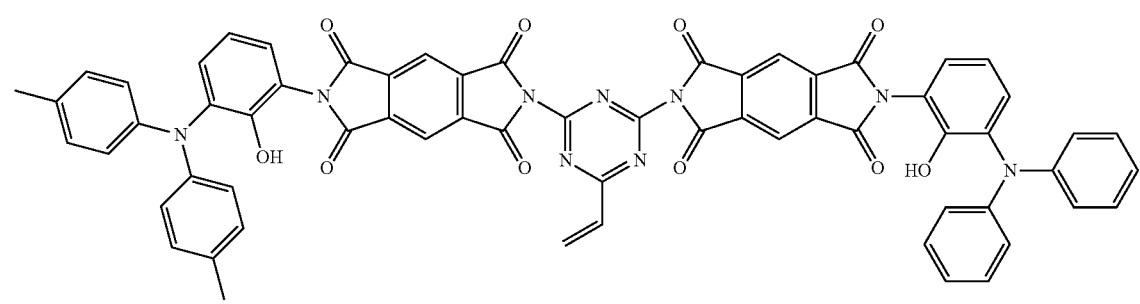
Crosslinkable, Polymerizable or Combination Thereof Molecular Glass Mixture 3: which is a crosslinkable, polymerizable or combination thereof molecular glass mixture comprising the following six components:

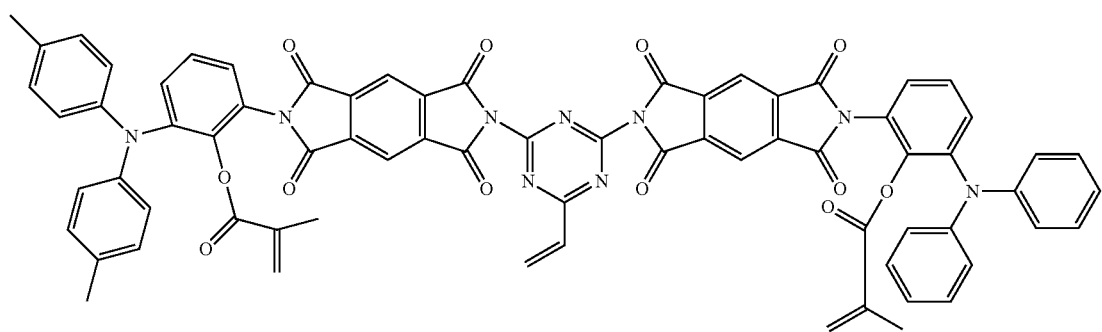
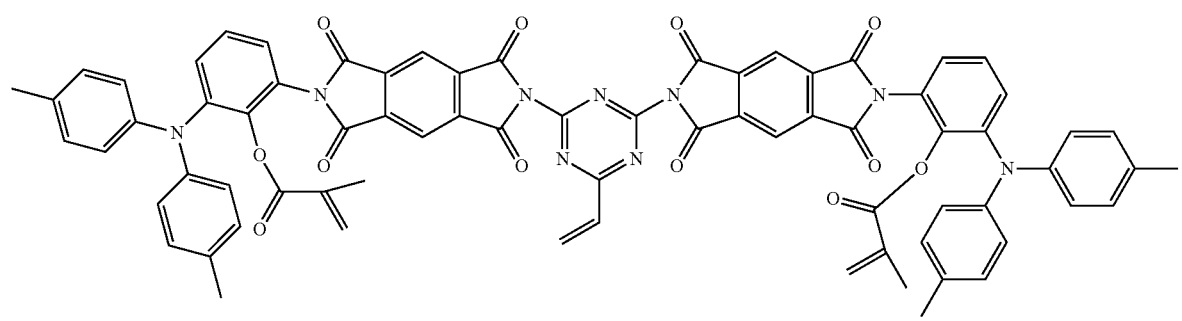
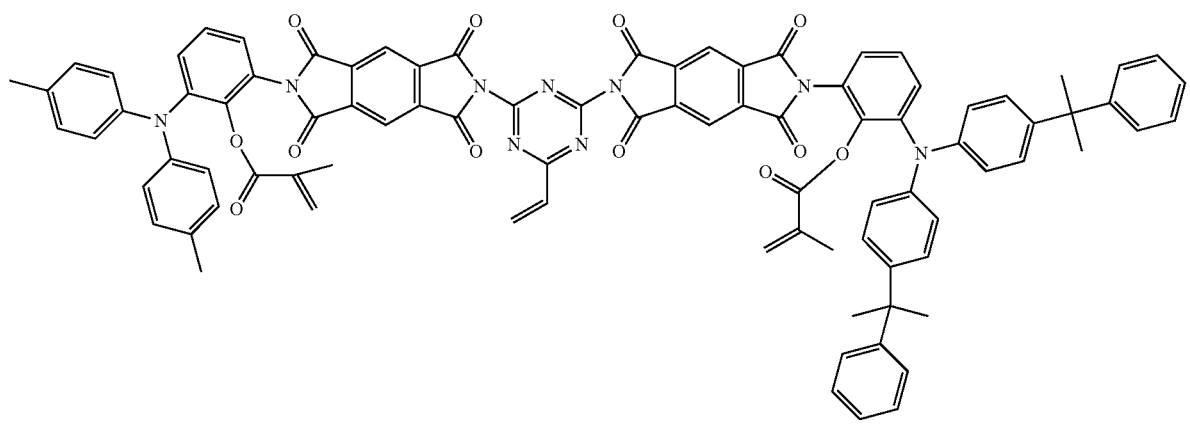
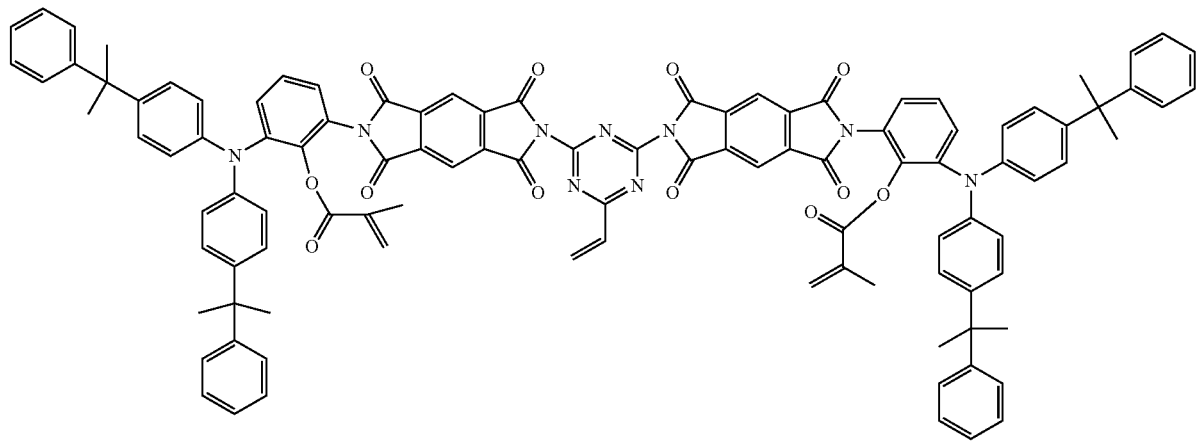

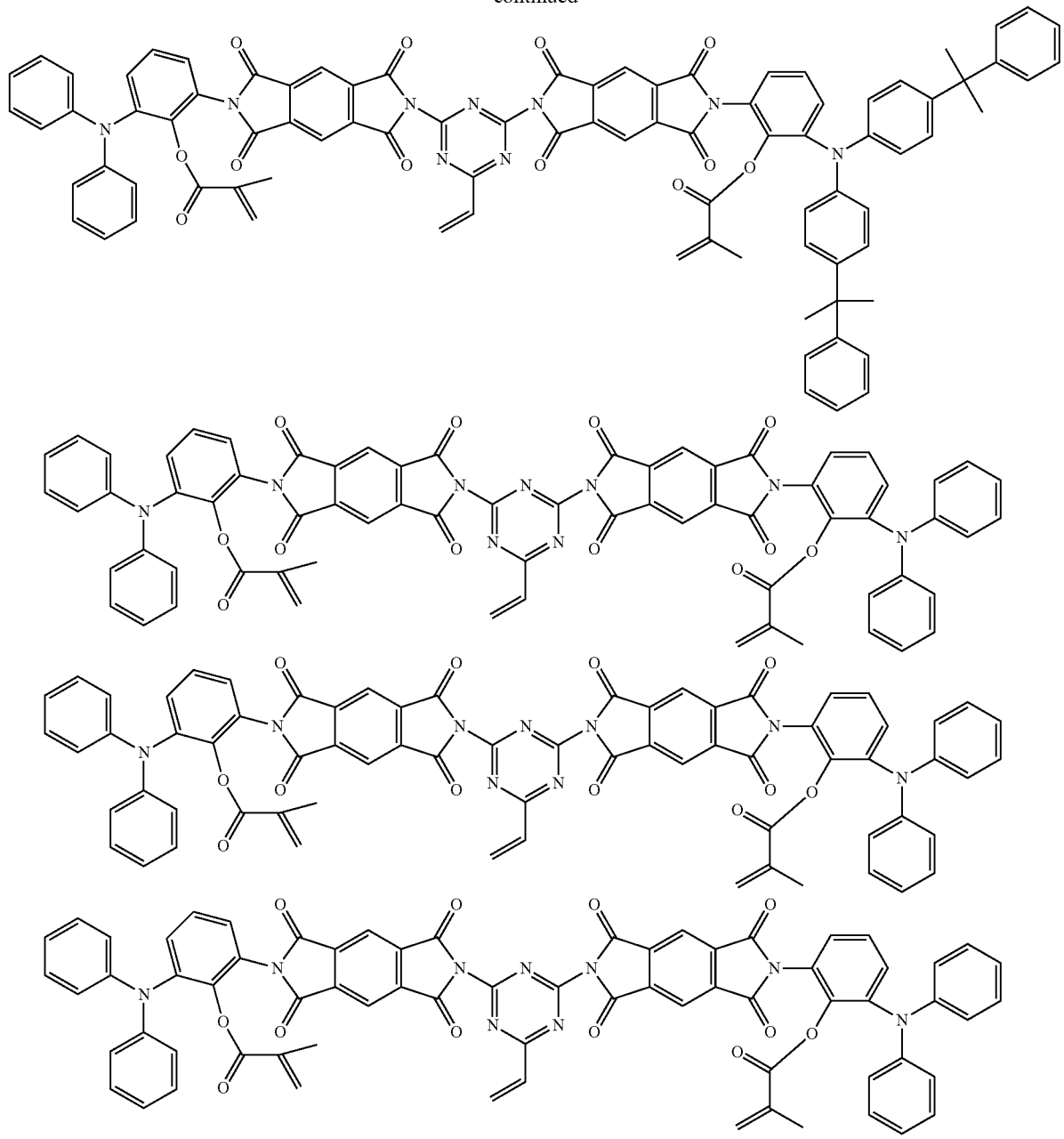

Reaction Procedure for Crosslinkable Amide-Ester Molecular Glass Mixture

A multi-amino or multi-hydroxy charge transporting and/or luminescent material was reacted with a mixture comprising acryloyl Chloride (35 mole %), methacryloyl chloride (35 mole %) and 2-choroacryloyl chloride (30 mole %):

One equivalent of a multi-amino or multi-hydroxy charge transporting and/or luminescent material is mixed in an aprotic solvent with 2.1 equivalent of triethylamine, HCl acceptor. Two total equivalents of a mixture purified acryloyl chloride (35 mole % of the mixture), methacryloyl chloride (35 mole % of the mixture) and 2-choroacryloyl chloride (30 mole % of the mixture) were added dropwise to the mixture. After complete addition of the triethylamine, the reaction is allowed to continue for three additional hours at which time the precipitated salt is filtered off. The solution is subjected to the following extraction sequence:

a. two dilute sodium hydroxide solution washes (2% cold);
b. two dilute hydrochloric acid solution washes (4%); and
c. two distilled water washes.

The dichloroethane solution is then dried over magnesium sulfate and the solvent removed by evaporation at 90° C. under vacuum. To the dried amorphous glass 100 milliliters of tetrahydrofuran (THF) is added. The solution obtained is stirred into 4 liters of distilled water in a Waring blender to precipitate the product. The product is collected by filtration as very fine particles and dried.

Crosslinkable, Polymerizable or Combination Thereof Molecular Glass Mixture 4: which is a crosslinkable, polymerizable or combination thereof electron-transporting molecular glass mixture comprising the following six components:

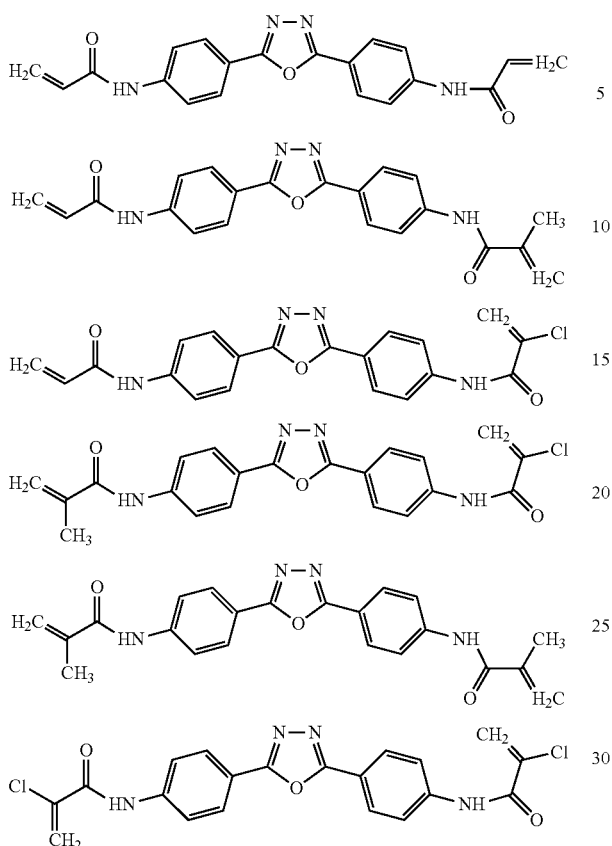

Crosslinkable, Polymerizable or Combination Thereof Molecular Glass Mixture 5: which is a crosslinkable, polymerizable or combination thereof hole-transporting molecular glass mixture comprising the following six components:

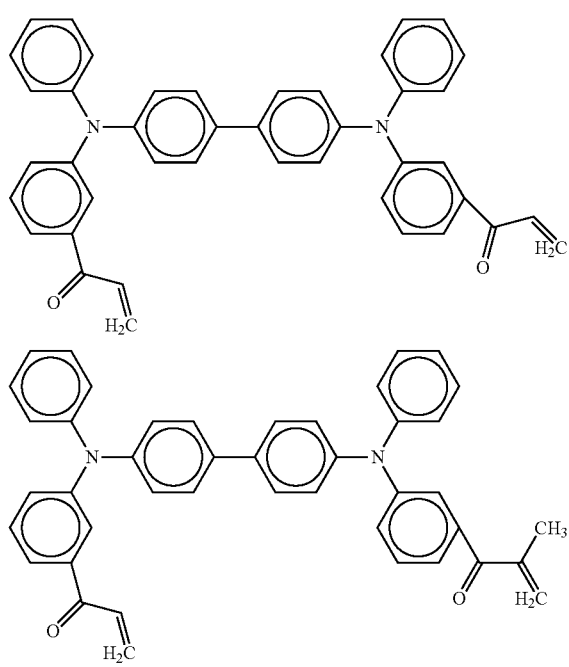

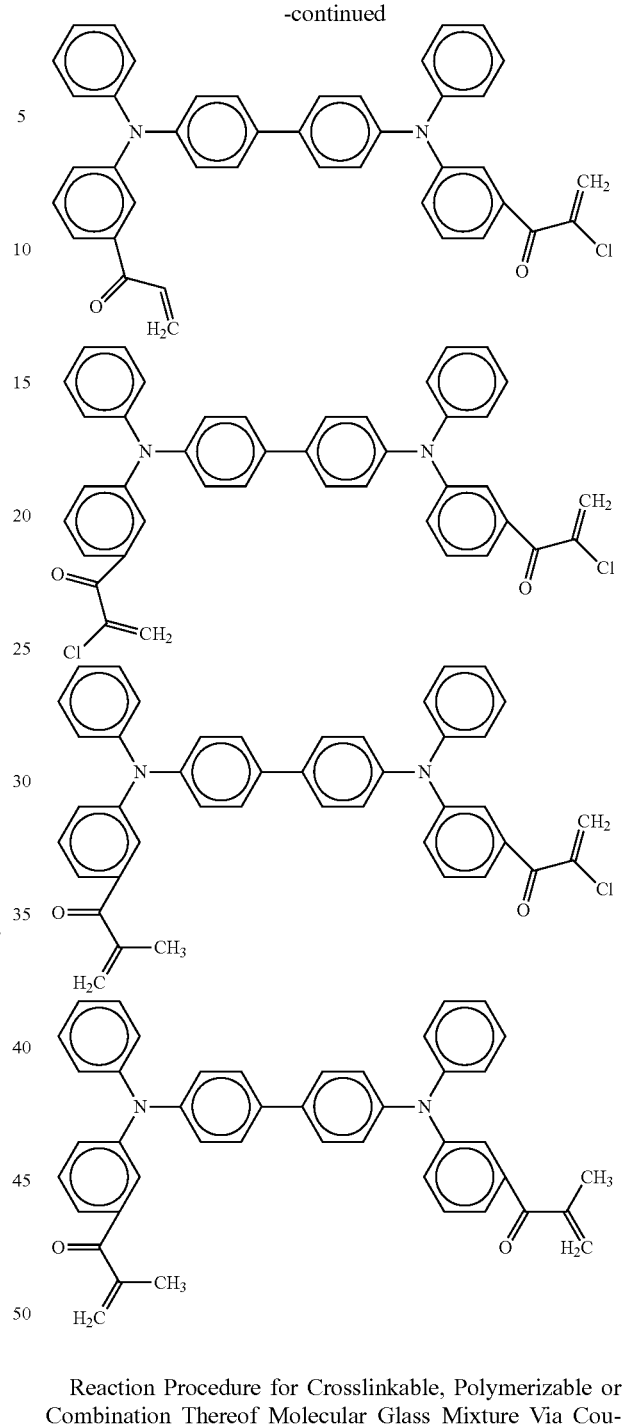

Reaction Procedure for Crosslinkable, Polymerizable or Combination Thereof Molecular Glass Mixture Via Coupling Reactions:

One equivalent of a halogen multi-substituted aromatic compound is mixed with one equivalent of a mixture of at least two boronate ester mono-substituted compounds which are charge transporting, luminescent or a combination thereof, and 3 mole percent of Chloro(2-dicyclohexylphosphino-2',4',6'-triisopropyl-1,1-'biphenyl)[2-(2'-amino-1,1'-biphenyl)]palladium(II), XPhos Pd G2 catalyst (available at sigma-aldrich chemicals) are added to a Schlenk flask, which is then purged under nitrogen. Dry THF and degassed 0.5M tripotassium phosphate (K3PO4) are added to the reaction flask under nitrogen. The flask is sealed, heated to 40° C. and stirred overnight. The multifunctional aromatic compounds and or one of all of the monofunctional compounds contain at least one polymerizable group, crosslinkable group or combination thereof.

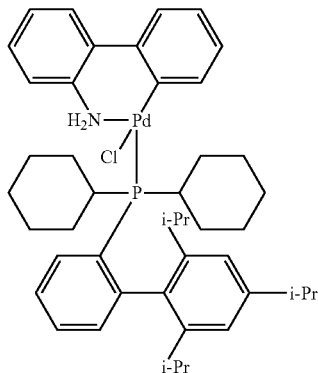

Chloro(2-dicyclohexylphosphino-2',4',6'-triisopropyl-1,1'-biphenyl)[2-(2'-amino-1,1-biphenyl)]palladium(II), Three extracts of diethyl ether are collected and filtered twice through silica gel. The solution is evaporated with the rotovap and the resulting oil is dissolved in a small amount of dichloromethane and crashed out of an appropriate volume of heptane.

This reaction can also be carried out where the multifunctional compound is a multi boronates (or boronic acids) and the monofunctional compounds are mono-halogenated Representative examples of crosslinkable, polymerizable or combinations thereof molecular glass mixtures made using this procedure are shown below.

Crosslinkable, Polymerizable or Combinations Thereof Molecular Glass Mixture 6: which is a crosslinkable, polymerizable or combination thereof hole-transporting molecular glass mixture comprising the following six components:

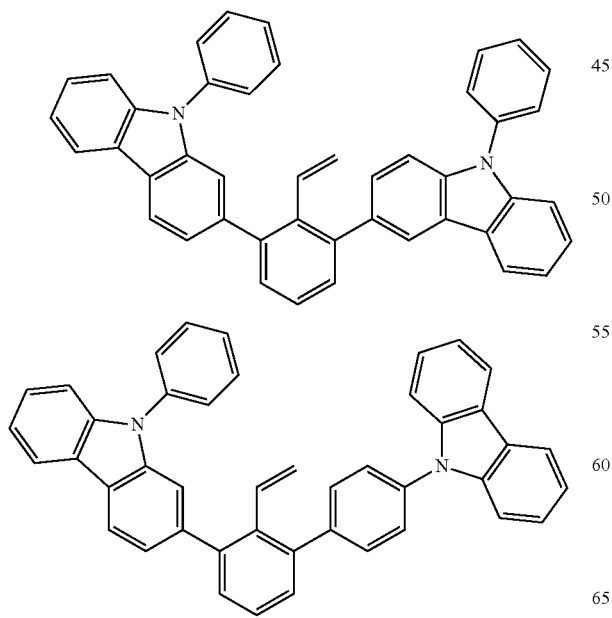

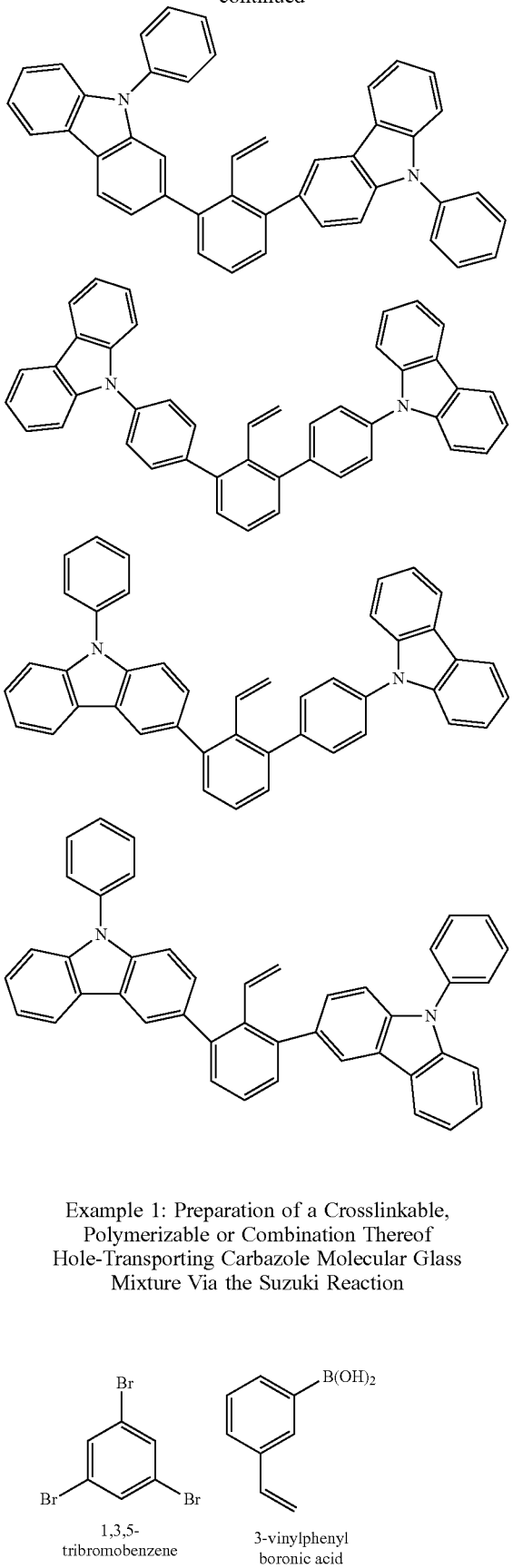

Example 1: Preparation of a Crosslinkable, Polymerizable or Combination Thereof Hole-Transporting Carbazole Molecular Glass Mixture Via the Suzuki Reaction

87

-continued

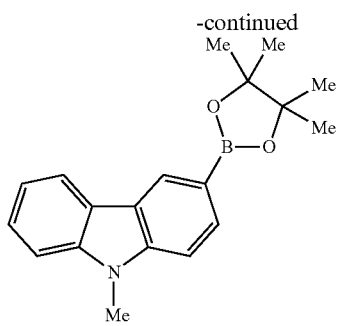

9-methylcarbazole-3-
boronic acid pinacol
ester

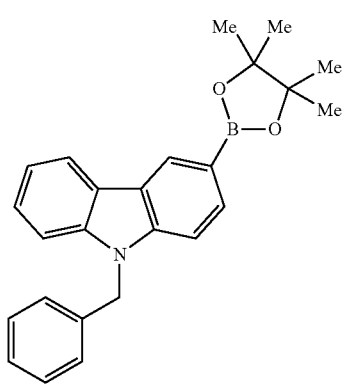

9-benzylcarbazole-3-
boronic acid pinacol
ester

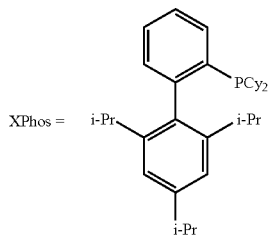

XPhos =

XPhos Pd G2

157 milligrams (0.5 millimole (mmol))1,3,5-tribromobenzene, 84 milligrams (0.55 mmol) 3-vinylphenyl boronic acid, 169 milligrams (0.55 mmol) 9-methylcarbazole-3-boronic acid pinacol ester, 211 milligrams (0.55 mmol) 9-benzylcarbazole-3-boronic acid pinacol ester, and 35 milligrams XPhos Pd G2 (3 mole percent) are added to a Schlenk flask, and then purged under nitrogen. 3 milliliters dry THF and 6 milliliters degassed 0.5 mole K3PO4 are added to the reaction flask under nitrogen. The flask is sealed, heated to 40° C. and stirred overnight.

Three extracts of 10 milliliters diethyl ether are collected and filtered twice through silica gel. The solution is evaporated with the rotovap and the resulting oil is dissolved in a small amount of dichloromethane and crashed out of 150 milliliters heptanes. The white precipitate is filtered and dried on vacuum. The 10 components of the mixtures are shown below:

88

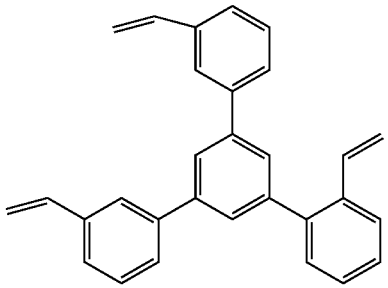

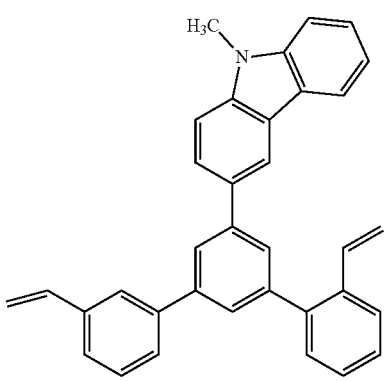

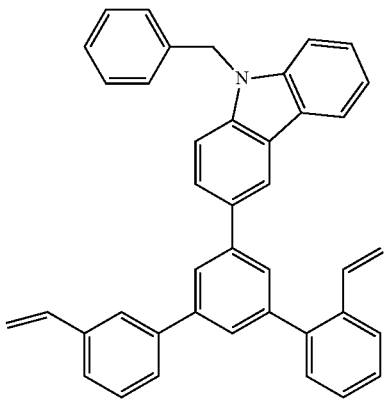

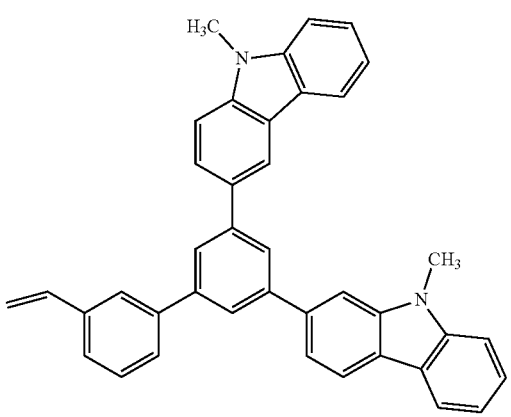

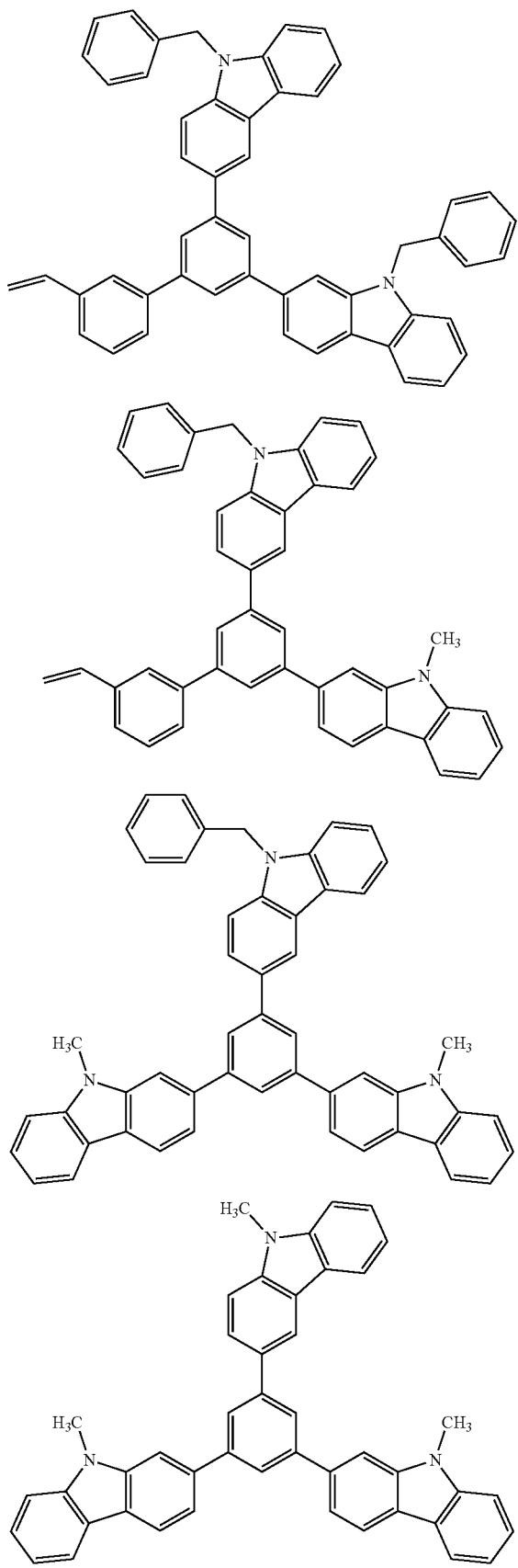 [SMILES: C=Cc1cccc(-c2cc(-c3ccc4c(c3)c3ccccc3n4Cc3ccccc3)cc(-c3ccc4c5ccccc5n(Cc5ccccc5)c4c3)c2)c1 ; C=Cc1cccc(-c2cc(-c3ccc4c(c3)c3ccccc3n4Cc3ccccc3)cc(-c3ccc4c5ccccc5n(C)c4c3)c2)c1 ; Cn1c2ccccc2c2ccc(-c3cc(-c4ccc5c(c4)c4ccccc4n5Cc4ccccc4)cc(-c4ccc5c6ccccc6n(C)c5c4)c3)cc21 ; Cn1c2ccccc2c2cc(-c3cc(-c4ccc5c6ccccc6n(C)c5c4)cc(-c4ccc5c6ccccc6n(C)c5c4)c3)ccc21]
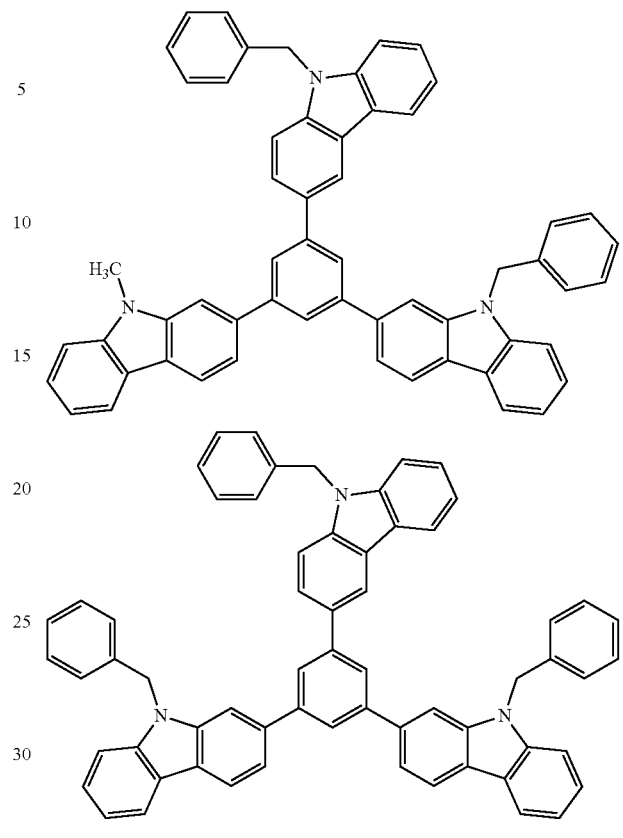

The sample was characterized by proton nuclear magnetic resonance (NMR), liquid chromatography, mass spectrometry, ultraviolet-visible spectroscopy (UV-vis), DSC, and thermogravimetric analysis (TGA). Summary of the crosslinkable, polymerizable or combination thereof molecular glass mixture is shown in Table 2 below:

TABLE 2

Physical Properties of the Crosslinkable/Polymerizable Molecular Glass Mixture of Example 1

| | $T_g$ | $T_m$ | $T_c$ | $T_d$ | λmax, nm | $E_g$ |
|---|---|---|---|---|---|---|
| Example 1 | 129.3° C. | None | None | 450° C. | 243, 291 | 3.3 eV |

$T_g$ = glass transition temperature;
$T_m$ = melting point;
$T_c$ = crystallization temperature;
$T_d$ = decomposition temperature;
λmax in dichloromethane;
$E_g$ = band gap Example 2: Preparation of the Crosslinkable/Polymerizable Plasticizer Tri(6-Acryloyloxyhexyl)1,3,5-Benzenetricarboxylate (TMAC6)

TMAC6 was made according to the procedure described in Journal of Polymer Science: Polymer Chemistry Edition, Vol 20, 847-861 (1982), M. F. Molaire. The glass transition temperature was measured by DSC (10°/min) at 72° C.

Figure 10:
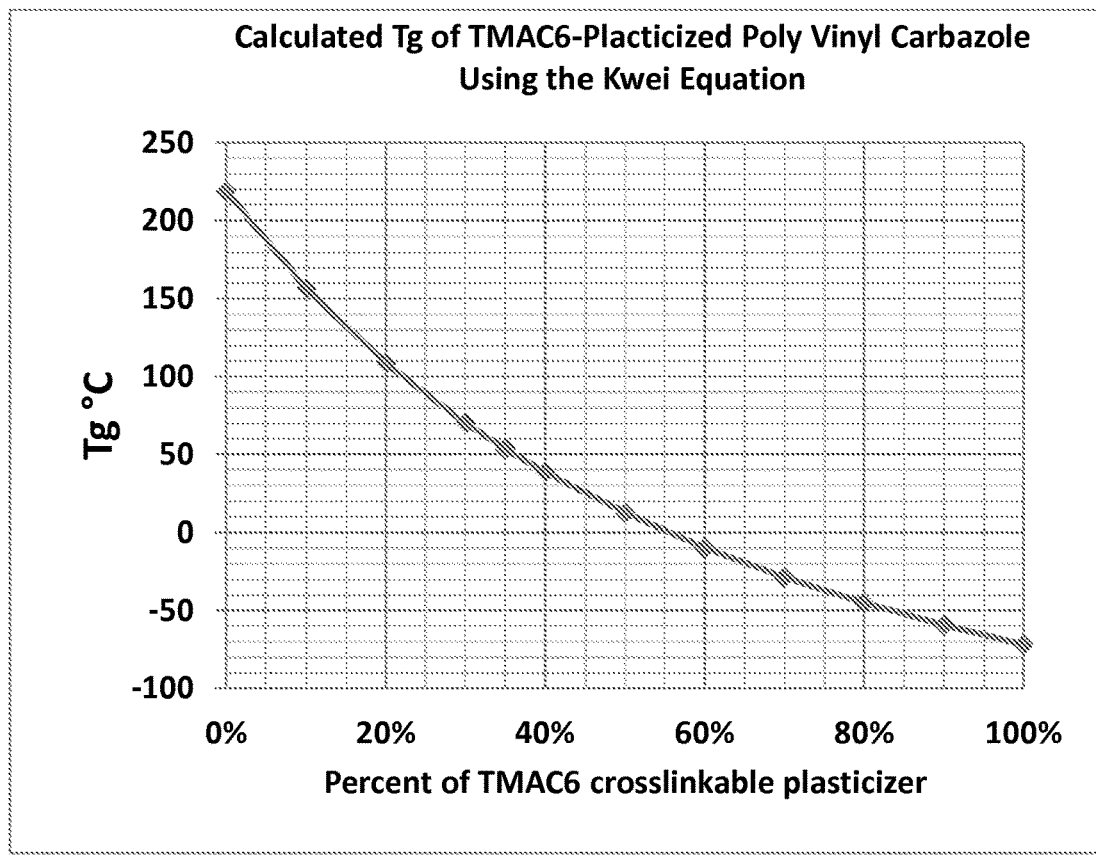
FIG. 10 shows calculated $T_g$ curve for mixtures of Molecular HT 1000 plasticized by TMAC6.

Example 3: Calculation of the Glass Transition Temperatures of Mixtures of the Polymerizable, Crosslinkable Molecular Glass Mixture of Example 1 and the Polymerizable, Crosslinkable Plasticizer TMAC6 Using the Kwei Equation The results of the calculation are shown in FIG. 10. and Table 3 below:

TABLE 3

Calulated Tg of Mixtures of TMAC6 and the Crosslinkable/Polymerizable Molecular Glass Mixture of Example 1, Using the Kwei Equation

| Example 1 | TMAC6 | Calculated $T_g$ ° C. |
|---|---|---|
| 0 | 1 | −72.00 |
| 0.1 | 0.9 | −61.41 |
| 0.2 | 0.8 | −49.65 |
| 0.3 | 0.7 | −36.50 |
| 0.4 | 0.6 | −21.70 |
| 0.5 | 0.5 | −4.93 |
| 0.6 | 0.4 | 14.23 |
| 0.65 | 0.35 | 24.88 |
| 0.7 | 0.3 | 36.35 |
| 0.8 | 0.2 | 62.17 |
| 0.9 | 0.1 | 92.68 |
| 1 | 0 | 129.30 |

Figure 11:
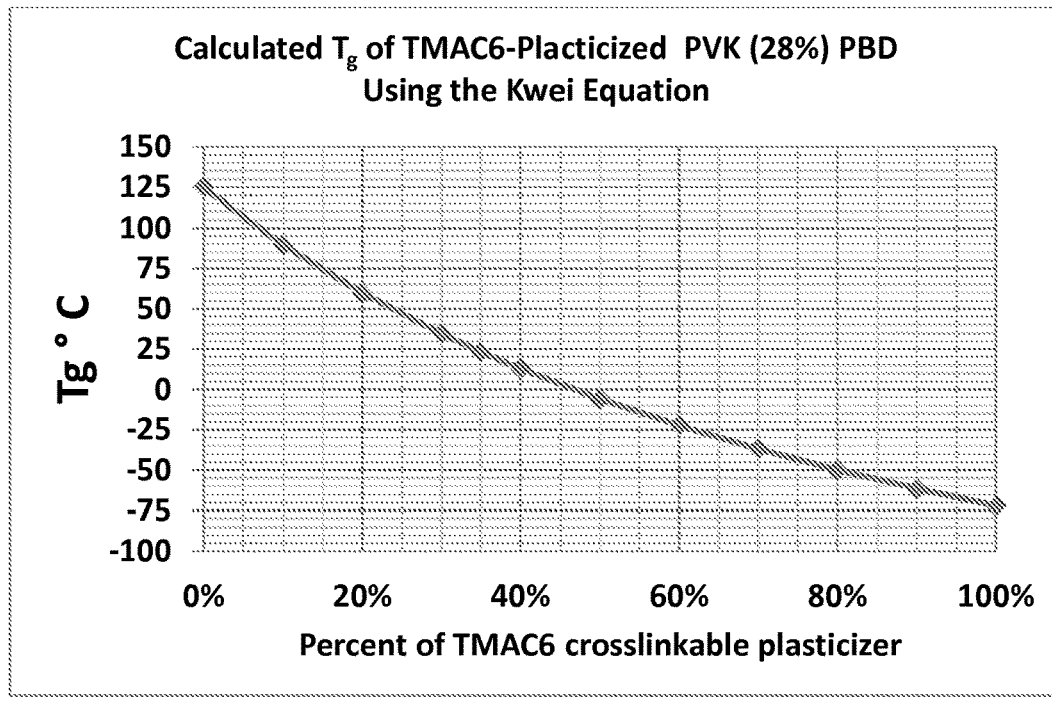
FIG. 11 shows calculated $T_g$ curve for mixtures of poly vinyl carbazole (PVK) plasticized by TMAC6.

Example 4: Calculation of the Glass Transition Temperatures of Mixtures of Poly Vinyl Carbazole and the Polymerizable, Crosslinkable Plasticizer TMAC6 Using the Kwei Equation The results of the calculation are shown in FIG. 11. and Table 4 below

TABLE 4

Calulated Tg of Mixtures of TMAC6 and Polyvinyl Carbazole (PVK), Using the Kwei Equation

| PVK | TMAC6 | Calculated $T_g$ ° C. |
|---|---|---|
| 0 | 1 | −72.00 |
| 0.1 | 0.9 | −59.36 |
| 0.2 | 0.8 | −45.03 |
| 0.3 | 0.7 | −28.64 |
| 0.4 | 0.6 | −9.71 |
| 0.5 | 0.5 | 12.40 |
| 0.6 | 0.4 | 38.57 |
| 0.65 | 0.35 | 53.54 |
| 0.7 | 0.3 | 70.02 |
| 0.8 | 0.2 | 108.53 |
| 0.9 | 0.1 | 156.78 |
| 1 | 0 | 219.00 |

Figure 12:
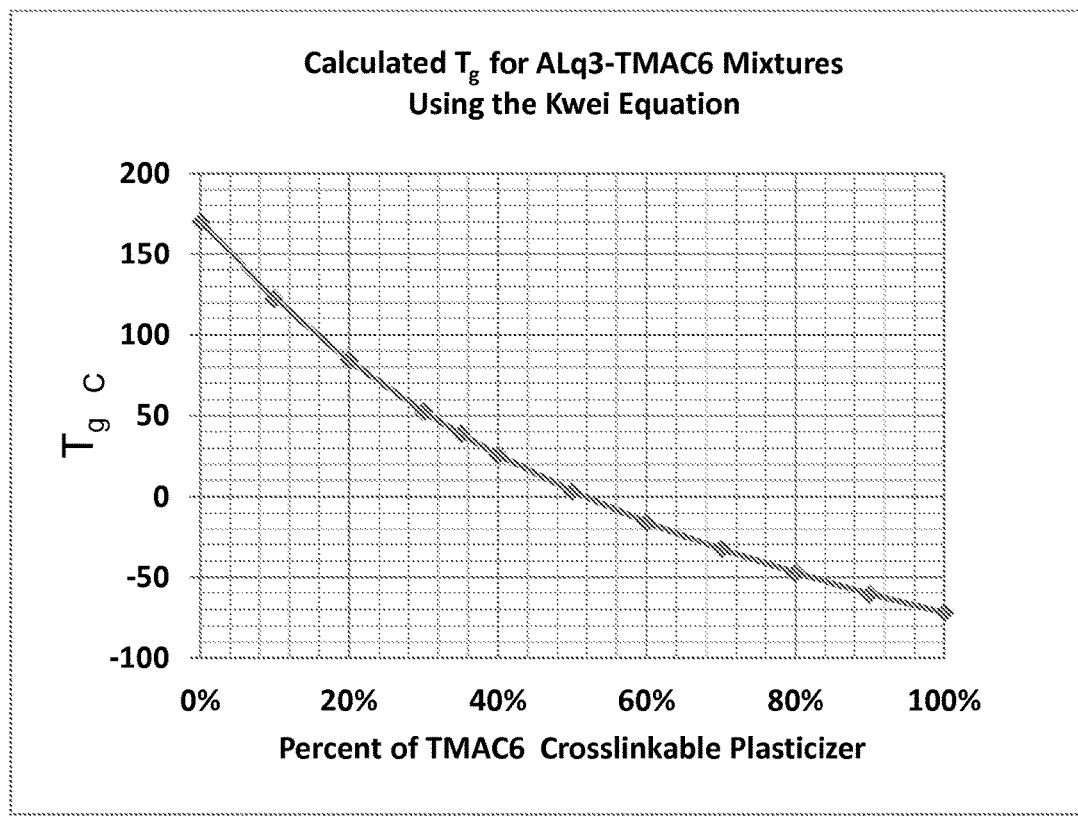
FIG. 12 shows calculated $T_g$ curve for mixtures of PVK (28%) (2-(4-biphenylyl)-5-(4-tert-butyl-phenyl)-1,3,4oxadiazole), PBD plasticized by TMAC6.

Example 4: Calculation of the Glass Transition Temperatures of Mixtures of Tris(8-Hydroxyquinolinato)Aluminium, Alq3 and the Polymerizable, Crosslinkable Plasticizer TMAC6 Using the Kwei Equation The results of the calculation are shown in FIG. 12. and Table 5 below

TABLE 5

Calulated Tg of Mixtures of TMAC6 and Alq3, Using the Kwei Equation

| Alq3 | TMAC6 | Calculated $T_g$ |
|---|---|---|
| 0 | 1 | −72.00 |
| 0.1 | 0.9 | −60.39 |
| 0.2 | 0.8 | −47.35 |
| 0.3 | 0.7 | −32.60 |
| 0.4 | 0.6 | −15.80 |
| 0.5 | 0.5 | 3.53 |
| 0.6 | 0.4 | 26.00 |
| 0.65 | 0.35 | 38.67 |
| 0.7 | 0.3 | 52.45 |
| 0.8 | 0.2 | 84.03 |
| 0.9 | 0.1 | 122.40 |
| 1 | 0 | 170.00 |

Figure 13:
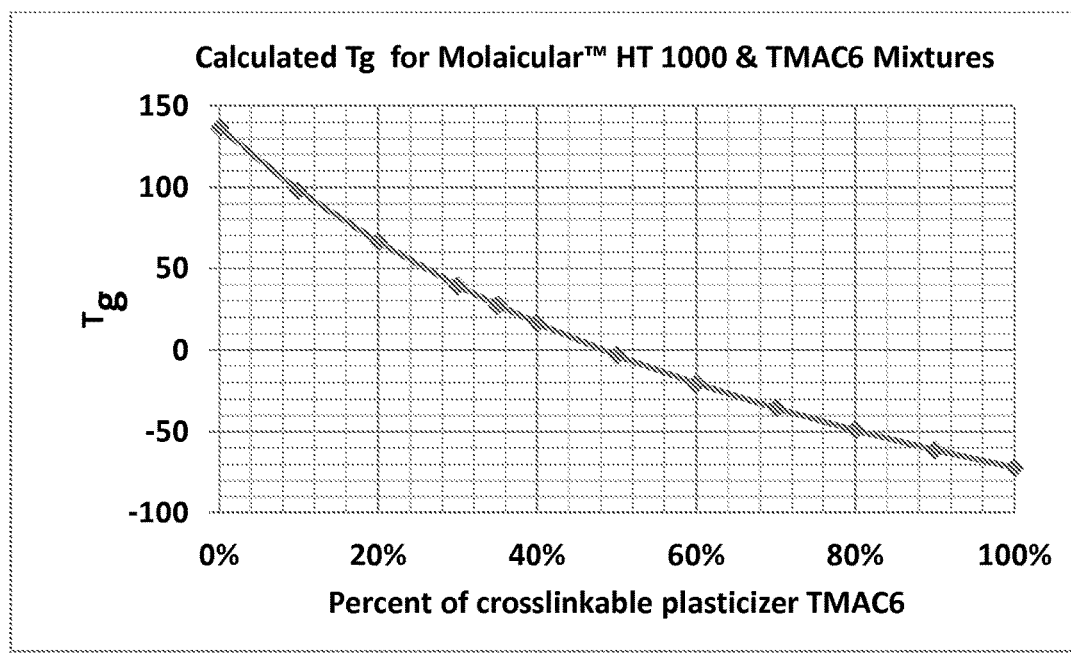
FIG. 13 shows calculated $T_g$ curve for mixtures of Tris-(8-hydroxyquinoline)aluminum (Alq3) plasticized by TMAC6.

Example 5: Calculation of the Glass Transition Temperatures of Mixtures of Poly Vinyl Carbazole Combinations Thereof Plasticizer TMAC6 Using the Kwei Equation The results of the calculation are shown in FIG. 13. and Table 6 below

TABLE 6

Calulated Tg of Mixtures of TMAC6 and PVK(28%) PBD, Using the Kwei Equation

| PVK(28%) PBD | TMAC6 | Calculated |
|---|---|---|
| 0 | 1 | −72.00 |
| 0.1 | 0.9 | −61.53 |
| 0.2 | 0.8 | −49.92 |
| 0.3 | 0.7 | −36.95 |
| 0.4 | 0.6 | −22.38 |
| 0.5 | 0.5 | −5.89 |
| 0.6 | 0.4 | 12.91 |
| 0.65 | 0.35 | 23.34 |
| 0.7 | 0.3 | 34.57 |
| 0.8 | 0.2 | 59.77 |
| 0.9 | 0.1 | 89.47 |
| 1 | 0 | 125.00 |

N.B. The Tg of 28.2% mixture of PBD (2-(4-biphenylyl)-5-(4-tert-butyl-phenyl)-1,3, 4oxadiazole) and PVK is reported at 125±20 +0 C. in *Mat. Res. Soc. Symp. Proc. Vol. 725*

Example of Applications

The crosslinkable, polymerizable and combinations thereof molecular glass mixtures of the invention can be used in organic photoactive electronic devices, such as organic light emitting diodes ("OLED") that make up OLED displays. The organic active layer is sandwiched between two electrical contact layers in an OLED display. In an OLED, the organic photoactive layer emits light through the light-transmitting electrical contact layer upon application of a voltage across the electrical contact layers.

It is well known to use organic electroluminescent compounds as the active component in light-emitting diodes. Simple organic molecules, conjugated polymers, and organometallic complexes have been used. Devices that use photoactive materials frequently include one or more charge transport layers, which are positioned between a photoactive (e.g., light-emitting) layer and a contact layer (hole-injecting contact layer). A device can contain two or more contact layers. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode. Charge transport materials can also be used as hosts in combination with the photoactive materials.

Figure 14:
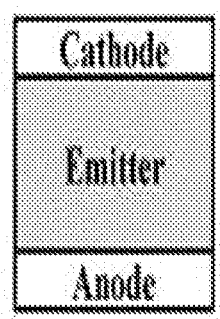
FIG. 14 (14a, 14b, 14c, 14d) depict common OLED architectures with a crosslinkable glass mixture a polymerizable glass mixture or a combination thereof of the invention. In the figures, the following reference numbers are used to identify specific features:
- 10: Substrate;
- 20: Anode;
- 30: Hole injection Layer;
- 40: Hole transporting layer;
- 50: Luminescent Layer;
- 60: Electron transporting layer;
- 70: Cathode;
- 80: Low-Tg crosslinkable organic layer, polymerizable organic layer or combination thereof; and
- 90: Doped low-Tg crosslinkable organic layer, polymerizable organic layer or combination thereof.
Figure 14:
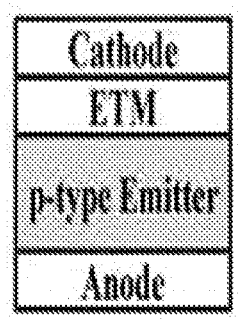
Figure 14:
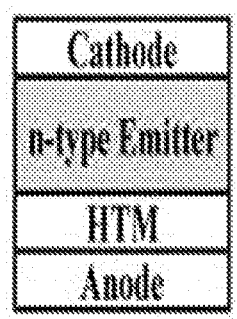
Figure 14:
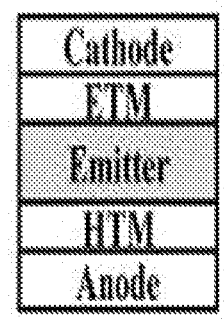

FIG. 14 shows common OLED architectures, not in scale, with a hole-transport material (HTM) and an electron-transport material (ETM), ("Electron Transport Materials for Organic Light-Emitting Diodes' A. Kulkami et al, Chem. Mater. 2004, 16, 4556-4573).

The crosslinkable molecular glass mixtures, polymerizable molecular glass mixtures and combinations thereof of the invention can be used either as host, dopant or non-doped emitter layers in those structures, depending on the composition, the structure and properties of the crosslinkable moieties, polymerizable moieties or combinations thereof. The charge transport molecular glass mixtures of the invention can also be used in fluorescent as well phosphorescent emitter systems.

It is well understood that these materials have to be optimized for particular device configuration. The hole transport layer materials (HTL) need to have the highest occupied molecular orbital (HOMO) level aligned with the corresponding HOMO level of the host to assure the hole flow into the emissive layer zone with minimal barrier for injection, whereas the HTL lowest occupied molecular orbital (LUMO) has to be sufficiently high to prevent electron leakage from the host into the HTL.

A similar set of rules, but with the opposite sign, exists for the interface of the host with the electron transport layer (ETL): The LUMO levels need to be aligned, and the ETL HOMO sufficiently deep to provide charge confinement. Triplet exciton energies of the materials in both charge transport layers should be significantly higher than the highest triplet level of all the emitters to prevent emissive exciton quenching. The triplet energy constraints also apply to the host materials, but with the requirements less stringent compared to those of hole and electron transport molecules. In addition, the positions of the HOMO of the HTL and LUMO of the ETL will have to match the work functions of both electrodes to minimize charge injection barriers. (E. Polikarpov, A B. Padmaperuna, "Materials Design Concepts for Efficient Blue OLEDs: A Joint Theoretical and Experimental Study", Material Matters, Vol 7, No 1, Aldrich Materials Science).

The materials of this invention provide a facile method to satisfy the set of energy alignment requirements in a given material by combining different molecular moieties that carry the desired electronic properties in one molecular glass mixture. The crosslinkable molecular glass mixtures, polymerizable molecular glass mixtures, and combinations thereof of this invention provide many design freedoms to simplify the design of these devices. The true non-crystalline nature of these mixtures, their large entropy of mixing values are expected to contribute significantly to device stability and performance. These examples of materials and applications are not meant to be exhaustive. Although the invention has been described with reference to specific embodiments, it is not intended to be limited thereto, rather those having ordinary skill in the art will recognize that variations and modifications may be made within the scope of the claims.

What is claimed is:

1. A method of manufacturing an organic device comprising:
   a) providing a substrate;
   b) providing a first set of addressing electrodes over the substrate;
   c) forming an organic hole-transporting layer over the first set of addressing electrodes and over the substrate;
   d) forming an organic light-emitting layer over the organic hole-transporting layer, the light-emitting layer comprising a crosslinkable non-polymeric organic light-emitting layer, wherein the light-emitting layer is plasticized with a compatible low-$T_g$ crosslinkable additive and has a glass transition temperature ($T_g$) below 80 degrees Celsius;
   e) forming a dopant layer over the organic light-emitting layer and patterning such dopant layer to form color pixels, said color pixels comprising color subpixels wherein the colored subpixels are formed by diffusing the patterned dopant layer into the organic light-emitting layer by thermal annealing at a temperature below 80 degrees Celsius without a solvent;
   f) after all the color subpixels are formed, subjecting the organic light-emitting layer to actinic energy to cross-link the low-$T_g$ crosslinkable additive organic light-emitting layer, and increase the thermal properties of the organic light-emitting layer;
   g) forming an organic electron-transporting layer over the doped organic light-emitting layer; and
   h) forming a second set of addressing electrodes over the organic electron-transporting layer so that the color subpixels can be individually addressed.

2. The method of claim 1 wherein the Tg of the organic light-emitting layer is below 40° C.

3. The method of claim 1 wherein the $T_g$ of the organic light-emitting layer is below 25° C.

4. The method of claim 1 wherein the thermal annealing temperature is below 60° C. and without solvent.

5. The method of claim 1 wherein the organic light-emitting layer is ambipolar.

6. The method of claim 1 wherein the organic light-emitting layer contains a light-emitting material selected to produce blue light.

7. The method of claim 1 wherein the organic light-emitting layer contains a charge-transporting material having a triplet energy above 2.60 electron volts.

8. The method of claim 1 wherein the organic light-emitting layer contains a charge-transporting material having a band gap above 3.0 electron volts.

9. The method of claim 1 wherein the dopants are fluorescent.

10. The method of claim 1 wherein the dopants are phosphorescent.

11. The method of claim 1, wherein the dopants are thermally assisted delayed fluorescent.

12. The method of claim 1 wherein the low-$T_g$ crosslinkable additive is chosen from the group consisting of;

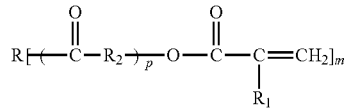

R represents a cycloaliphatic or an aromatic group;
$R_1$ represents hydrogen or alkyl;
$R_2$ represents alkylene of 1 to 20 carbon atoms, or —$CH_2CH_2(OCH_2CH_2)_n$;
p is 0 or 1; and
n is 1 to 20;
m is 1 to 6.

13. The method of claim 1 wherein the low-$T_g$ crosslinkable additive is chosen the group consisting of

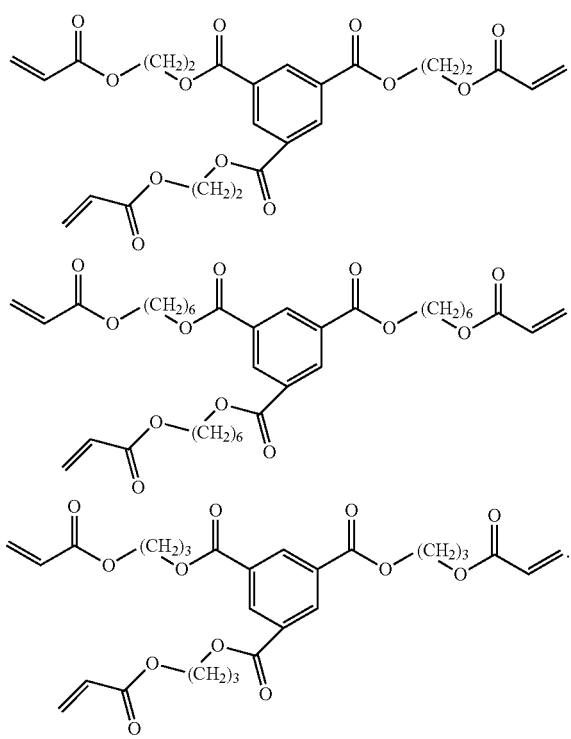

14. The method of claim 1 wherein the dopants are independently fluorescent, phosphorescent, or thermally assisted delayed fluorescent.

15. The method of claim 1 wherein the organic light-emitting layer is coated from solution.

16. The method of claim 1 wherein the hole transport layer is coated from solution.

17. The method of claim 1 wherein the hole transport layer is a crosslinkable non-crystallizable molecular glass mixture.

18. The method of claim 1 wherein the device is an organic light emitting diode display.

19. The method of claim 1 wherein the device is an organic light emitting diode luminaire.

20. The method of claim 1 wherein the organic light-emitting layer contains a non-crosslinkable small molecule host material.

21. The method of claim 1 wherein the organic light-emitting layer contains a non-crosslinkable polymeric host material.

22. The method of claim 1 wherein the organic light-emitting layer contains a non-crosslinkable charge transporting material chosen from the group consisting of poly vinyl carbazole, tris(8-hydroxyquinolinato)aluminium, 2-(4-biphenylyl)-5-(4-tert-butyl-phenyl)-1,3,4-oxadiazole.

23. The method of claim 1 wherein the dopants are a combination of fluorescent and thermally assisted delayed fluorescent emitters.

* * * * *